US006307349B1

(12) United States Patent
Koenck et al.

(10) Patent No.: US 6,307,349 B1
(45) Date of Patent: Oct. 23, 2001

(54) BATTERY PACK HAVING MEMORY

(75) Inventors: Steven E. Koenck, Cedar Rapids; Ronald D. Becker, Des Moines; Phillip Miller, Cedar Rapids, all of IA (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/513,047

(22) Filed: Feb. 24, 2000

(51) Int. Cl.$^7$ ........................................ H02J 7/00
(52) U.S. Cl. .......................... 320/112; 320/122
(58) Field of Search .......................... 320/112, 134, 320/135, 136, 106; 340/636

(56) References Cited

U.S. PATENT DOCUMENTS

| 3,599,071 | 8/1971 | Lapuyade et al. | 320/150 |
| 3,683,258 | 8/1972 | Harbonn | 320/103 |
| 3,740,636 | 6/1973 | Hogrefe et al. | 320/101 |
| 3,754,182 | 8/1973 | Morris et al. | 323/299 |
| 3,763,416 | 10/1973 | Jache | 320/147 |

(List continued on next page.)

FOREIGN PATENT DOCUMENTS

| 2520599 | 11/1976 | (DE) . |
| 2589292 | 4/1987 | (FR) . |
| 1354491 | 5/1974 | (GB) . |
| 56-28476 | 3/1981 | (JP) . |
| WO-A-8802565 | 4/1988 | (WO) . |
| WO-A-8902182 | 3/1989 | (WO) . |

OTHER PUBLICATIONS

Cell–Level Battery Charge/Discharge Protection System, Donovan, R. L., Imamura, M. S., Martin Marietta Corporation, Denver, Colorado, 12$^{th}$ IECEC, vol. 1, 1977, pp. 302–310.

(List continued on next page.)

*Primary Examiner*—Peter S. Wong
*Assistant Examiner*—Pia Tibbits
(74) *Attorney, Agent, or Firm*—McAndrews, Held & Malloy, Ltd.

(57) ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor and battery conditioning system memory are permanently secured to the battery so as to receive operating power therefrom during storage and handling, the performance of a given battery in actual use can be accurately judged since the battery system can itself maintain a count of accumulated hours of use and other relevant parameters. In the case of a nonportable conditioning system, two-way communication may be established with a memory associated with the portable unit so that the portable unit can transmit to the conditioning system information concerning battery parameters (e.g. rated battery capacity) and/or battery usage (e.g. numbers of shallow discharge and recharge cycles), and after a conditioning operation, the conditioning system can transmit to the portable unit a measured value of battery capacity, for example. A battery pack having memory stores battery history and identifying data to be retrieved by a portable battery powered device. Battery status information may be utilized in conjunction with characteristic battery history data in order to optimize charging and discharging functions and to maximize the useful life of a battery pack.

42 Claims, 41 Drawing Sheets

U.S. PATENT DOCUMENTS

| | | | |
|---|---|---|---|
| 3,771,132 | 11/1973 | Biewer | 710/161 |
| 3,775,659 | 11/1973 | Carlsen, II | 320/140 |
| 3,823,388 | 7/1974 | Chadima, Jr. et al. | 710/131 |
| 3,843,967 | 10/1974 | Mulvany | 360/98.07 |
| 3,911,350 | 10/1975 | Swope | 320/154 |
| 3,917,990 | 11/1975 | Sherman, Jr. | 320/150 |
| 3,921,050 | 11/1975 | Rowas | 320/119 |
| 3,928,792 | 12/1975 | Mullersman et al. | 320/154 |
| 3,941,989 | 3/1976 | McLaughlin et al. | 713/321 |
| 3,956,740 | 5/1976 | Jones et al. | 360/4 |
| 3,971,980 | 7/1976 | Jungfer et al. | 324/428 |
| 3,979,656 | 9/1976 | Takeda et al. | 320/101 |
| 4,001,550 | 1/1977 | Schatz | 235/370 |
| 4,017,725 | 4/1977 | Roen | 361/680 |
| 4,030,086 | 6/1977 | Salem | 340/636 |
| 4,045,720 | 8/1977 | Alexandres | 320/150 |
| 4,061,956 | 12/1977 | Brown et al. | 320/153 |
| 4,072,859 | 2/1978 | McWaters | 250/214 R |
| 4,095,217 | 6/1978 | Tani et al. | 345/87 |
| 4,118,661 | 10/1978 | Siekierski et al. | 320/148 |
| 4,121,115 | 10/1978 | de Mere | 307/150 |
| 4,125,802 | 11/1978 | Godard | 320/150 |
| 4,127,803 | 11/1978 | Etienne | 320/104 |
| 4,140,957 | 2/1979 | Rapp | 320/106 |
| 4,151,454 | 4/1979 | Iida | 320/134 |
| 4,158,194 | 6/1979 | McWaters et al. | 382/313 |
| 4,163,193 | 7/1979 | Kamiya | 324/436 |
| 4,173,733 | 11/1979 | Sugalski et al. | 320/110 |
| 4,193,026 | 3/1980 | Finger et al. | 324/428 |
| 4,203,103 | 5/1980 | Osada et al. | 345/38 |
| 4,217,645 | 8/1980 | Barry et al. | 320/116 |
| 4,232,308 | 11/1980 | Lee et al. | 340/539 |
| 4,237,411 | 12/1980 | Kothe et al. | 320/139 |
| 4,251,883 | 2/1981 | Grants et al. | 714/57 |
| 4,275,274 | 6/1981 | English | 369/22 |
| 4,277,837 | 7/1981 | Stuckert | 235/380 |
| 4,279,020 | 7/1981 | Christian et al. | 713/323 |
| 4,289,836 | 9/1981 | Lemelson | 429/61 |
| 4,290,109 | 9/1981 | Taniguchi et al. | 320/127 |
| 4,295,097 | 10/1981 | Thompson et al. | 324/429 |
| 4,302,714 | 11/1981 | Yefsky . | |
| 4,308,492 | 12/1981 | Mori et al. | 322/28 |
| 4,308,493 | 12/1981 | Kothe et al. | 320/152 |
| 4,333,149 | 6/1982 | Taylor et al. | 320/149 |
| 4,346,336 | 8/1982 | Crawford | 320/147 |
| 4,370,606 | 1/1983 | Kakumoto et al. | 320/141 |
| 4,377,787 | 3/1983 | Kikuoka et al. | 324/431 |
| 4,387,334 | 6/1983 | Loper . | |
| 4,388,618 | 6/1983 | Finger | 320/DIG. 21 |
| 4,390,841 | 6/1983 | Martin et al. | 324/427 |
| 4,392,101 | 7/1983 | Saar et al. | 320/156 |
| 4,419,616 | 12/1983 | Baskins et al. | 320/115 |
| 4,424,476 | 1/1984 | Mullersman | 320/150 |
| 4,455,523 | 6/1984 | Koenck | 320/131 |
| 4,472,672 | 9/1984 | Pacholok | 320/145 |
| 4,494,064 | 1/1985 | Harkness | 323/277 |
| 4,525,055 | 6/1985 | Yokoo | 320/136 |
| 4,542,462 | 9/1985 | Morishita et al. | 320/DIG. 18 |
| 4,553,081 | 11/1985 | Koenck | 320/131 |
| 4,593,272 | 6/1986 | Berkowitz | 340/500 |
| 4,607,208 | 8/1986 | Vreeland | 320/145 |
| 4,621,189 | 11/1986 | Kumar et al. | 235/462.45 |
| 4,649,333 | 3/1987 | Moore | 320/152 |
| 4,667,143 | 5/1987 | Cooper et al. | 320/153 |
| 4,670,703 | 6/1987 | Williams | 320/125 |
| 4,692,682 | 9/1987 | Lane et al. | 320/152 |
| 4,709,202 | 11/1987 | Koenck et al. | 320/112 |
| 4,716,354 | 12/1987 | Hacker | 320/114 |
| 4,737,702 | 4/1988 | Koenck | 320/114 |
| 4,758,945 | 7/1988 | Remedi | 713/322 |
| 4,773,032 | 9/1988 | Uehara et al. | 708/134 |
| 4,829,226 | 5/1989 | Nakamura et al. | 320/112 |
| 4,829,259 | 5/1989 | Konopka | 320/112 |
| 4,833,390 | 5/1989 | Kumada et al. | 320/150 |
| 4,842,966 | 6/1989 | Omori et al. | 429/96 |
| 4,845,419 | 7/1989 | Hacker | 320/136 |
| 4,849,682 | 7/1989 | Bauer et al. | 320/106 |
| 4,850,009 | 7/1989 | Zook et al. | 379/93.17 |
| 4,862,013 | 8/1989 | Konopka | 320/145 |
| 4,885,522 | 12/1989 | Konopka | 320/145 |
| 4,885,523 | 12/1989 | Koenck | 320/131 |
| 4,916,441 | 4/1990 | Gombrich | 345/169 |
| 4,961,043 | 10/1990 | Koenck | 320/132 |
| 4,965,738 | 10/1990 | Bauer et al. | 320/136 |
| 5,013,993 | 5/1991 | Bhagwat et al. | 320/150 |
| 5,110,226 | 5/1992 | Sherman et al. | 400/88 |
| 5,150,031 | 9/1992 | James et al. | 320/164 |
| 5,204,611 | 4/1993 | Nor et al. | 320/145 |
| 5,278,487 | 1/1994 | Koenck | 320/132 |
| 5,363,031 | 11/1994 | Miller et al. | 320/115 |
| 5,365,160 | 11/1994 | Leppo et al. | 320/160 |
| 5,463,305 | 10/1995 | Koenck | 320/145 |
| 5,493,199 | 2/1996 | Koenck et al. | 320/106 |
| 5,508,599 | 4/1996 | Koenck | 320/138 |
| 5,619,117 | 4/1997 | Koenck | 320/106 |
| 5,856,737 | 1/1999 | Miller et al. | 320/152 |
| 5,883,492 | 3/1999 | Koenck | 320/107 |
| 5,883,493 | 3/1999 | Koenck | 320/114 |
| 5,986,435 | 11/1999 | Koenck | 320/136 |

OTHER PUBLICATIONS

Microprocessor–Controlled Battery Protection System, Imamura, M. S., Donovan, R. L., Oberg, J. L., Skelly, L. A., Julseth, D. H., Martin Marietta Corporation, Denver, Colorado, IECEC '75 Record, 1975, pp. 1307–1317.

Norand Corporation Specification Sheet for Norand 101–XL Portable Data System, 1978.

Norand Corporation Brochure regarding Norand "Sprint 100" Portable Order Entry Terminal, 1979.

Norand Corporation Specification Sheet for Norand 101XL "Alpha–1" Portable Data System, 1980.

Japanese language version of The Institute of Television Engineers TechnologyReport, vol. 4, No. 44, Mar. 1981.

Certified English language translation of The Institute of Television Engineers TechnologyReport, vol. 4, No. 44, Mar. 1981.

NHK Laboratories Note Serial No. 302, Jul. 1984.

Automated Power Systems Management (APSM), NASA, Jet Propulsion Laboratory, California Institute of Technology, Pasadena, California, JPL Publication 81–106 dated Nov. 15, 1981.

"Conceptual Definition of Automated Power Systems Management", M.S. Imamura and L. Skelly, Martin Marietta Corporation, Denver, CO, and Howard Weiner, Jet propulsion Laboratory, Pasadena, California, $12^{th}$ IECEC, pp. 1343–1348.

"Advanced Linear Charge Current Control ($LC^3$) Electrical Power System", W.B. Collins, D. Nichols, F. Lukens and J. Masson, Martin Marietta Corporation, Denver, CO, Copyright 1979 American Chemical Society, pp. 1356–1360.

"Spacecraft Automated Power Systems and Recommended Advanced Technology", F.E. Lukens, Martin Marietta Denver Aerospace, 1982 IEEE, $17^{th}$ IECEC, pp. 135–142.

"Results of the Automated Power Systems Management (APSM) Program and Future Technology Implementation", Arthur O. Bridgeforth, Jet Propulsion Laboratory, Pasadena, California, 1982 IEEE, $17^{th}$ IECEC, pp. 153–158

"Algorithms For The Automated Power Systems Management", R. L. Moser and M. S. Imamura, Martin Marietta Corp., Denver, CO, Copyright 1979 American Chemical Society, pp. 1367–1373.

Development of Automated Power System Management Techniques, M.S. Imamura, R.L. Moser, L.A. Skelley, Martin Marietta Aerospace, Denver, CO, and Howard Weiner, Jet Propulsion Laboratory, Pasadena, California, Copyright 1978 SAE, pp. 20–27.

Lead–Acid Battery Modeling with Specific Application To Electric Vehicle State–Of–Charge Indication, A Thesis by Harry L. Martin, Purdue University, Dec. 1979.

"The NSC800 Microprocessor Cookbook", Roger C. Alford, Tab Books Inc., No. 1502, Copyright 1983.

BATTERY PACK HAVING MEMORY

CROSS-REFERENCE TO RELATED APPLICATIONS

This application is a continuation of Ser. No. 09/270,302 filed Mar. 15, 1999, now U.S. Pat. No. 6,075,340 issued Jun. 13, 2000, which is a continuation of Ser. No. 08/841,974 filed Apr. 8, 1997, now U.S. Pat. No. 5,883,493 issued Mar. 16, 1999, which is a continuation of Ser. No. 08/415,075 filed Mar. 30, 1995, now U.S. Pat. No. 5,619,117 issued Apr. 8, 1997, which is a continuation of application Ser. No. 08/134,881 filed Oct. 12, 1993, now U.S. Pat. No. 5,508,599 issued Apr. 16, 1996, which is a continuation of application Ser. No. 07/769,337 filed Oct. 1, 1991, now U.S. Pat. No. 5,278,487 issued Jan. 11, 1994, which is a continuation of application Ser. No. 07/544,230 filed Jun. 26, 1990, now abandoned, which is a divisional of application Ser. No. 07/422,226 filed Oct. 16, 1989, now U.S. Pat. No. 4,961,043 issued Oct. 2, 1990, which is a divisional of application Ser. No. 07/168,352 filed Mar. 15, 1988, now U.S. Pat. No. 4,885,523 issued Dec. 5, 1989.

This application is also a continuation of Ser. No. 09/223,983 filed Jan. 4, 1999, now U.S. Pat. No. 6,043,630 issued Mar. 28, 2000, which is a continuation of Ser. No. 08/315,825 filed Sep. 30, 1994, now U.S. Pat. No. 5,856,737 issued Jan. 5, 1999, which is a continuation of Ser. No. 07/859,591 filed Mar. 23, 1992, now U.S. Pat. No. 5,363,031 issued Nov. 8, 1994, which is a continuation-in-part of Ser. No. 07/446,231 filed Dec. 8, 1989, now abandoned, which is a continuation-in-part of Ser. No. 07/266,537 filed Nov. 2, 1988, now abandoned, which is a continuation-in-part of Ser. No. 07/168,352 filed Mar. 15, 1988, now U.S. Pat. No. 4,885,523 issued Dec. 5, 1989.

This application is also a continuation of Ser. No. 08/985,853 filed Dec. 5, 1997, now U.S. Pat. No. 6,075,342 issued Jun. 13, 2000, which is a continuation of Ser. No. 08/399,742 filed Mar. 7, 1995, now U.S. Pat. No. 5,696,435 issued Dec. 9, 1997, which is a continuation of Ser. No. 07/837,650 filed Feb. 18, 1992, now U.S. Pat. No. 5,463,305 issued Oct. 31, 1995, which is a continuation-in-part of Ser. No. 07/446,231 filed Dec. 5, 1989, now abandoned, which is a continuation-in-part of Ser. No. 07/266,537 filed Nov. 2, 1988, now abandoned, which is a continuation-in-part of Ser. No. 07/168,352 filed Mar. 15, 1988, now U.S. Pat. No. 4,885,523 issued Dec. 5, 1989.

Said application Ser. No. 07/168,352 filed Mar. 15, 1988, now U.S. Pat. No. 4,885,523 issued Dec. 5, 1989, is a continuation-in-part of application Ser. No. 06/944,503, filed Dec. 18, 1986, now U.S. Pat. No. 4,737,702 issued Apr. 12, 1988, which is a continuation-in-part of application Ser. No. 06/876,194 filed Jun. 19, 1986, now U.S. Pat. No. 4,709,202 issued Nov. 24, 1987, which is a divisional of application Ser. No. 06/797,235 filed Nov. 12, 1985, now U.S. Pat. No. 4,716,354 issued Dec. 29, 1987.

INCORPORATION BY REFERENCE

The above-mentioned U.S. Pat. Nos. 4,709,202, 4,737,702, 4,885,523, 4,961,043, 5,363,031, 5,463,305, 5,619,117, 5,696,435 and 5,856,737 are hereby incorporated herein by reference in their entirety. U.S. Pat. Nos. 4,455,523, 4,553,081, and 5,493,199 are hereby incorporated herein by reference in their entirety.

The present invention may be utilized as or in conjunction with the battery pack including electronic power saver as described in PCT publication PCT/US90/06383 published May 16, 1991. Said publication PCT/US90/06383 is incorporated herein by reference in its entirety.

The present invention may be utilized as the rechargeable battery of a portable system as described in U.S. Pat. No. 5,363,031 issued Nov. 8, 1994.

The present invention may be utilized as the rechargeable battery of a portable system as described in U.S. Pat. No. 5,463,305 issued Oct. 31, 1995.

The present invention may be protected from electrostatic discharge by utilizing the apparatus and method for electrostatic discharge protection as described in U.S. application Ser. No. 08/353,778 filed Dec. 12, 1994. Said application 08/353,778 is incorporated herein by reference in its entirety.

STATEMENT REGARDING FEDERALLY SPONSORED RESEARCH OR DEVELOPMENT

N/A

BACKGROUND OF THE INVENTION

The present invention relates to a battery conditioning system for battery means of portable computerized devices, and particularly to a hand-held device including data storage means for storing data pertinent to the battery means of the device, and to a battery conditioning control system including an external charging circuit equipped for communication with data storage means of the hand-held device and/or of the battery means operatively associated with such device. Preferably the control system is capable of optimizing the performance of a rechargeable electrochemical storage medium while at the same time maximizing its useful life. The invention also relates to control systems generally, and to control systems forming part of hand-held units.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances, a loss of adequate battery power can be just as detrimental as any other malfunction.

Particularly where the battery conditioning control system is to be incorporated in hand-held devices, such control system should be lightweight and compact, and should consume minimum power. For the sake of economy, a microprocessor of a standard design and of minimum complexity, is highly desirable.

It is conceived that a particularly advantageous battery conditioning system is achieved where significant portions of the conditioning circuitry are external to the battery operated portable device, and where the portable device contains data storage means which is capable of reliably and flexibly providing information, e.g., to the external circuitry for optimizing battery conditioning operations. Data storage means may be implemented within a battery pack in order to preserve battery characteristics of that particular battery so that unique battery data may be associated with the battery pack. The saved battery pack data may be accessed by a portable battery powered device in which the battery pack is utilized so that charging and discharging routines may be optimized for the particular battery pack.

SUMMARY OF THE INVENTION

It is a basic objective of the present invention to achieve a conditioning system for hand-held battery powered devices providing increased reliability and useful life, and particularly to provide a charging system for hand-held devices wherein charging operation can be based on the use history and/or other relevant information concerning the specific battery means.

A further object of the present invention is to provide a control system particularly adapted to control battery conditioning of a variety of rechargeable battery means, automatically adaptable to hand-held devices having battery means of different types such as to require different conditioning parameters.

Another object of the invention is to provide a charging current control system for battery powered portable devices which is not only lightweight and compact but which consumes minimum power, and which preferably is adapted to be implemented as an integrated circuit of an economical and simple construction.

An exemplary feature of the invention resides in the provision of a battery conditioning system receptive of different hand-held devices and capable of communication therewith, e.g., to determine the type of conditioning required for respective different internal battery means thereof.

A further feature of the invention relates to a battery conditioning system wherein the system can obtain a relatively accurate indication of the battery energy remaining available for use for one type or a plurality of different types of batteries, and supply the results to a memory means accompanying the battery means during portable operation.

For the sake of recharging of a battery system as rapidly as possible without detriment to an optimum useful life span, battery parameters including battery temperature can be monitored and transmitted to a conditioning system during a charging cycle, and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system in successful use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a back-up battery are present, the operating time of each may be individually accumulated, and used to control the time duration of the respective recharging operations.

Additional features of a commercial system in successful use include individual charging and discharging circuits for a main battery and a back-up battery for reliable conditioning of the back-up battery independently of the state of the main battery. Desired parameters such as main battery voltage, ambient temperature (e.g., in the main battery case or in the battery compartment), and charging voltage may be obtained by means of an integrated circuit analog to digital converter, which thus replaces several comparators and many precision costly components of a prior implementation.

While in an early embodiment, battery charging current was set using a digital to analog converter to establish a set point for an analog current control loop, it is a feature of a further embodiment herein to provide a digital computer for both computing a desired current set point and for modulating current pulses in the battery charging circuit for maintaining a desired average current. Preferably, a computer circuit with a moderate clock rate may determine current pulse modulation steps and control sampling of actual current pulses for purposes of generating a feedback signal. An aliasing type of sampling systematically taken at different phases of the actual current pulse waveform enables use of a particularly low sampling rate.

In a further significant development of the invention, important portions of the conditioning circuitry are external to the battery operated portable device, and yet information specific to a given battery means is retained with the portable device. In an exemplary implementation, a computer operating means of the portable device is programmed and provided with battery information sufficient to select an optimum battery charging rate, for example, e.g., a fast charge or a maintenance charge, and preferably to adjust the charge rate, e.g., based on a measure of battery temperature. In a presently preferred system, an external standardized charging circuit has a default condition wherein a charging current is supplied suitable to older types of terminals. Such a charging circuit, however, can be controlled by the computer operating means of preferred types of portable devices so as to override the default charging rate. In this way charging rate may be a function not only of a respective rated battery capacity, but also of other parameters such as battery terminal voltage prior to coupling of the portable device with the charging circuit and/or extent of use of the portable device after a previous charge. In certain applications with high peaks of battery drain, e.g., R. F. terminals, it is advantageous to avoid a resistance in series with the battery for measuring battery drain during use; an alternate approach measuring operating time in various modes can then be particularly attractive. An advantageous data communication coupling between a portable device computer operating means and a charging circuit is via a data storage register and digital to analog converter. The register can be operated from a battery means while the computer operating means may be in a sleep mode, for example, once the register has received a suitable computer generated command. The digital to analog converter need only be active during a battery charging cycle and can be decoupled from the battery means during portable operation. Such a digital to analog converter is particularly suitable for generating an analog control signal for overriding a default setting of a standardized charging circuit such as described herein above.

In a new RF terminal unit, it is conceived that it may be advantageous to make the output of a battery temperature measuring transducer available at an external contact of the terminal so that a low cost charger could supply a charging current taking account of a relatively accurate measure of battery temperature. Further by making temperature transducer (nonzero) output dependent on the presence of charging potential at the terminal, the same temperature sensing line provides an indication as to whether charging potential is present.

In a further embodiment of the present invention, a battery pack having memory may be implemented within the battery pack itself. The duty history of the battery along with present battery data may be stored to be later retrieved by a utilization device. The utilization device may determine present battery conditions in order to relay such information to the operator and may apply appropriate charging algorithms taking into account present battery conditions along with past characteristic charge/discharge behavior in order to optimize future battery charging and discharging. The characteristic behavior exhibited by the battery pack may be stored in an electronic memory system along with other battery pack identifying or tagging information. The battery pack having memory may be assembled using standard battery pack assembly techniques in order to maintain reliability and minimize the costs of the battery pack having memory.

The invention will now be described, by way of example and not by way of limitation, with references to the accompanying sheets of drawings; and other objects, features and advantages of the invention will be apparent from this detailed disclosure and from the appended claims.

BRIEF DESCRIPTION OF THE SEVERAL VIEWS OF THE DRAWINGS

FIG. 28 is a block diagram illustration of a preferred fast charging system in accordance with the present disclosure;

FIG. 36 also shows successive approximate slope values by means of straight lines covering successive equal time intervals of 600 seconds;

DETAILED DESCRIPTION OF THE INVENTION

The detailed description of FIGS. 1 through 17 is incorporated herein by reference to the specification at col. 4, line 25, through col. 66, line 4, of the incorporated U.S. Pat. No. 4,709,202.

Description of FIGS. 18, 19, 20A, 20B, 21 and 22

Figure 18:
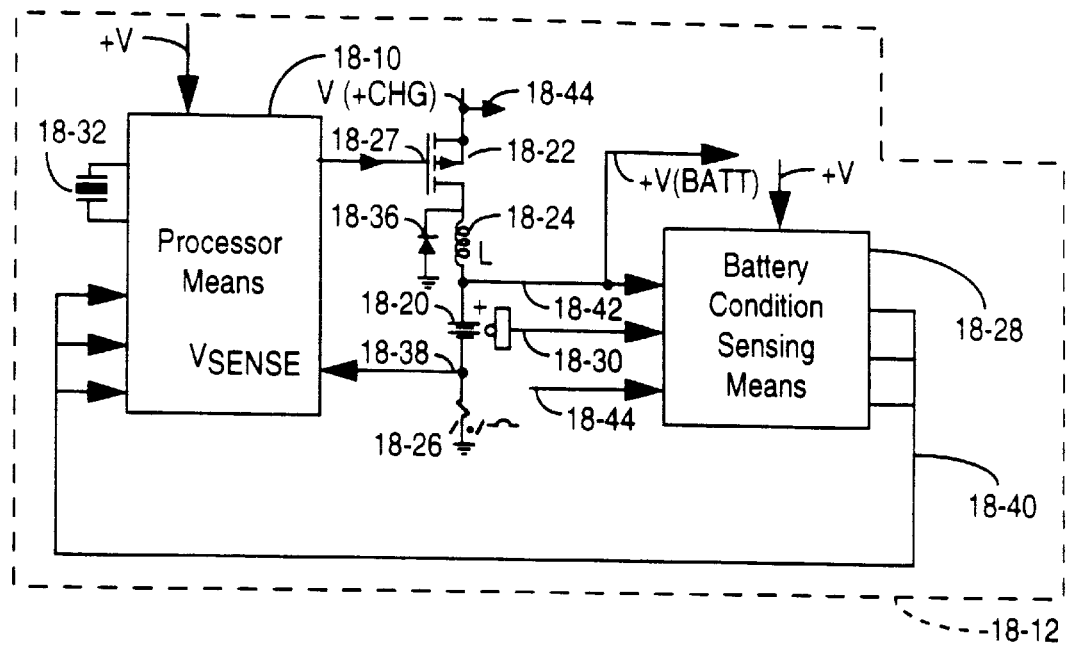
FIG. 18 is an electric circuit diagram for illustrating a preferred embodiment of battery charging current control system in accordance with the present invention.
Figure 20A:
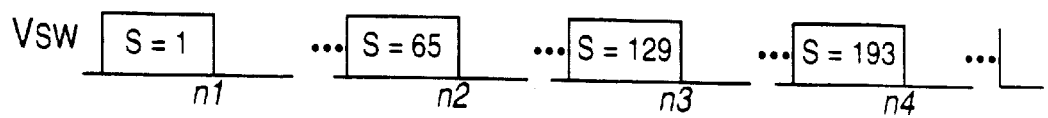
FIG. 20A shows selected control pulses which may be generated during control of battery charging current in the control system of FIG. 18.

FIG. 18 shows processor means such as an integrated circuit microprocessor 18-10 which may form part of a circuit package of a battery pack 18-12. The circuit package may be secured with a rechargeable battery means 18-20, an association of such parts being shown in detail in FIGS. 2, 3 and 4. During a battery charging operation, a battery charging means such as 12-24, FIG. 12, may provide a charging potential to a hand-held computer unit such as 71, FIG. 5, and the unit 71 may supply an operating voltage +V to microprocessor 18-10 and may supply a charging potential +CHG to a series circuit including a current switch or current regulator means 18-22, an energy storage inductor means 18-24, battery means 18-20, and a current sense resistor 18-26. The processor means 18-10 may supply to line 18-27 rectangular pulses of a voltage waveform Vsw as shown in FIG. 20A. The duration or active duty cycle of the voltage pulses of waveform Vsw is modulated in discrete modulation steps to vary the turn-on time of switch means 18-22, and thus to vary battery charging current.

As in the embodiment of FIGS. 1 through 8, battery means 18-20 may have battery charging parameter sensing means associated therewith as indicated at 18-28. Such parameter sensing means may have a battery temperature sensing transducer 18-30 corresponding to transducer 134, FIG. 9-A, and transducer 18-30 may be physically disposed in heat transfer relation to battery pack 18-12 as indicated in FIG. 18.

In the embodiment of FIG. 18, processor means 18-10 may be controlled by a constant frequency means such as crystal 18-32. The clock rate of crystal 18-32 may be used to synchronize turn on of switch means 18-22 so that active duty cycles are initiated at a uniform time interval of less than one microsecond and may provide a desired number of modulation steps for the active duty cycle of the turn-on waveform Vsw. By way of example, the operating frequency of crystal 18-32 may be six megahertz (i.e., thirty-two times a duty cycle frequency of 187.5 kilohertz) and may provide a time interval between activations of switch means 18-22 of 5.3333 microseconds with each such time interval being subdivided into thirty-two modulation steps. A moderate operating frequency of crystal 18-32 is favorable for a control system with low energy consumption, and an economical processor means.

Figure 19:
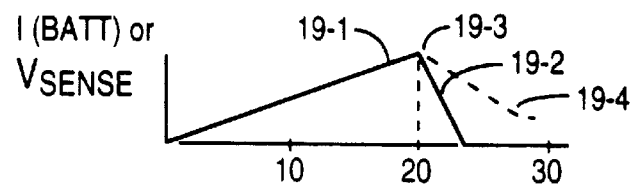
FIG. 19 shows an exemplary current pulse waveform which may correspond with a maximum battery charging rate in a substantially linear operating range for an exemplary control system in accordance with FIG. 18.

In the above example, the turn-on time of switch means 18-22 may have different possible time durations per cycle corresponding to respective different numbers of the thirty-two modulation steps. The modulation steps may represent increments of 166.7 nanoseconds in the time duration of the active duty cycle of the waveform Vsw at line 18-27. Essentially, maximum current flow in inductor 18–24 may correspond with a turn-on time corresponding to at least sixty percent of the maximum available on-time of switch means 18-22. For example, current flow may increase relatively linearly as represented in FIG. 19 by sloping line 19-1 for numbers of time increments between zero and twenty or more. The circuit of FIG. 18 includes means such as diode 18-36 for maintaining current flow when switch means 18-22 is turned off, the circuit preferably providing a current decay characteristic generally as indicated at 19-2 in FIG. 19. Generally the current may decay to zero in less than one-half of the turn-on time of switch means 18-22, for the case of active duty cycles which provide a linear characteristic such as 19-1. For example, if the peak value 19-3 in FIG. 19 corresponds to twenty time increments or 3.33 microseconds (20 times 166.7 nanoseconds equals 3.33 microseconds), then the decay interval may be less than ten increments, i.e. less than 1.67 microseconds.

FIG. 20A shows turn-on pulses Vsw of relatively constant duration, corresponding to numbers of turn-on increments, e.g., n1=16, n2=17, n3=17, n4=18.

Figure 20B:
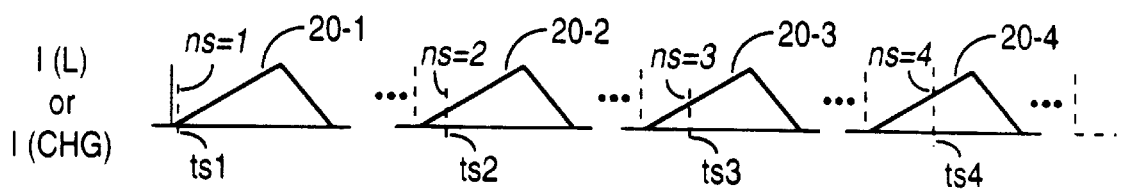
FIG. 20B shows respective corresponding battery charging current pulses on the same time scale with vertically aligned portions of the waveforms of FIGS. 20A and 20B occurring at the same time.

FIG. 20B shows the corresponding current flow in inductance 18-24, designated I(L) and the corresponding battery charging current I(CHG).

In each case, the rising current characteristics 20-1 to 20-4 are linear where the number of increments is less than the number corresponding to peak 19-3 in FIG. 19.

In FIG. 18, current sense resistance 18-26 is of a value much less than the resistance of battery means 18-20; for example, resistance means 18-26 may have a resistance value of 0.1 ohm. FIG. 20B thus also represents the waveform Vsense supplied at line 18-38 of FIG. 18, for the respective durations of Vsw of FIG. 20A. The processor means 18-10 includes analog to digital converter channels such as that associated with resistor 135, FIG. 9A, so that the battery temperature analog signal at 18-40 and the battery current analog signal at 18-38 may be converted into corresponding digital values.

While waveforms such as those represented in FIG. 20B would normally be sampled at a relatively high rate in comparison with the operating frequency of component 18-32, in a preferred embodiment the sampling rate of the pulsating analog waveform at line 18-38 is made lower than the rate of component 18-32 and preferably less than the active duty cycle frequency of waveform Vsw. Thus, the analog to digital converter means of processor 18-10 preferably deliberately under samples the current sense line 18-38 to alias the charging current waveform I(CHG) to a very low frequency.

For the example of a repetition rate Fsw for the active duty cycles of waveform Vsw of 187.5 kilohertz, sampling may take place roughly at a frame sampling rate of $\frac{1}{64}$ Fsw or roughly 2929 hertz. The actual aliasing sampling rate, however, is not precisely synchronized with the switch activation rate Fsw, but differs slightly therefrom, for example, by one time increment or duty cycle modulation step of waveform Vsw, e.g., by a time increment of 166.7 nanoseconds per frame interval. This example of sampling can be visualized if the successive pulses of Vsw as supplied to line 18-27, FIG. 18, are identified as S=1, S=2, S=3, etc., and if the pulses of FIG. 20B are then considered to correspond to Vsw pulse numbers S=1, S=65, S=129 and S=193, as indicated in FIG. 20A, and if the successive sampling points are identified as ns1, ns2, ns3, ns4, etc.

If there are thirty-two different possible sampling points for each Vsw pulse, then FIG. 20B illustrates successive sampling points ns=1, ns=2, ns=3 and ns=4. In this example, one complete scan of the pulse configuration of the Vsense waveform at line 18-38 would take place for each 2049 Vsw pulses.

Figure 21:
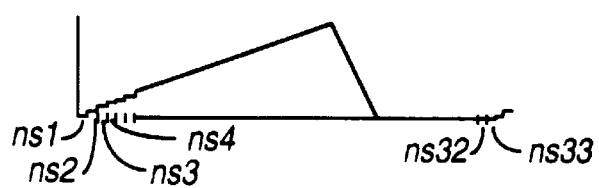
FIG. 21 is a diagrammatic view of use in explaining the aliased sampling of actual current pulses in the battery charging circuit, and illustrating the case where thirty-two samples form a complete sampling cycle.

The resultant sampled waveform for a complete sampling cycle is diagrammatically indicated in FIG. 21 for the example of sampling as represented in FIGS. 20A and 20B.

If the frame sampling rate for the Vsense waveform on line 18-38 is roughly $\frac{1}{256}$ Fsw, or about 732.42 hertz, then with one time increment of 167 nanoseconds added for each sampling frame, an actual sampling frequency of about 732.33 hertz results corresponding to 1.3655 milliseconds per sample. If thirty-two sample points of the Vsense waveform are scanned per complete sampling cycle, then one complete sampling cycle corresponds to 0.043696 second, or a frequency of 22.88 hertz.

After each sample of the Vsense waveform, a corresponding average current value can be computed, by adding the most recent sample value (e.g. at ns33, FIG. 21) and subtracting the oldest sample value (e.g. sample ns1, FIG. 21), so that a new average current would be calculated at each 1.3655 milliseconds for the case of a sampling frequency of about 732.33 hertz. A sample and hold circuit may retain the sampled value of Vsense during the analog to digital conversion process.

The preferred embodiment with an aliased sampling rate is considered applicable to current measurements where changes in the current waveform pulses are relatively slow, e.g., slower than the rate of change shown in FIG. 20B, where the alternating polarity component of the Vsense voltage averages out over a complete sampling cycle, and where the need for dynamic regulation of the current I(L) is minimal, i.e. the average direct current level per complete sampling cycle is the critical value to be regulated.

The slow rate aliasing type of sampling is useful to adapt the sampling frequency to that feasible with an economical and simple processing means 18-10 (e.g., a type 8048 microprocessor). Other aliasing sampling approaches could operate by scanning at a desired frame interval less one pulse, e.g., for the example of FIGS. 20A and 20B to sample Vsense at Vsw pulses corresponding to S=1, ns1=1; S=64, ns2=32; S=128, ns3=31; S=192, ns4=30; etc. Other schemes to scan the Vsense signal could both skip frames and slip sample points, e.g. sampling Vsense at Vsw pulses corresponding to S=1, ns1=1; S=128, ns2=32; S=256, ns3=31; S=384, ns4=30; etc., or S=1, ns1=1; S=129, ns2=2; S=257, ns2=3; S=385, ns4=4, etc.

By way of example, processor 18-10 may read battery temperature via input 18-40 at ten second intervals, and adjust the charging current set point value accordingly at each ten second reading of temperature. A noise filter in the form of a digital algorithm may insure that the actual digital current readings based on Vsense are free of disruptive noise.

By way of example, if the waveform of FIG. 19 corresponds to a duration of Vsw of twenty modulation increments and a charging rate of about C/8, then for temperatures of less than minus twenty degrees Celsius (−4° F.), the active duty cycles of Vsw may be set to zero; for temperatures between minus twenty degrees Celsius and minus ten degrees Celsius (+14° F.), the charging current may be set to about C/20 (resulting in an average of about eight modulation increments for each active duty cycle of Vsw); for temperatures between minus ten degrees Celsius and zero degrees Celsius (32° F.), the charging current may be set to about C/16 (resulting in an average of about ten modulation increments for each active duty cycle of Vsw); for temperatures between zero degrees Celsius and ten degrees Celsius (50° F.), the charging current may be set to about C/10 (to produce an average of about sixteen modulation increments for each active duty cycle of Fsw); for temperatures between ten degrees Celsius and seventy degrees Celsius (158° F.), the charging rate may be set to about C/8; above seventy degrees Celsius, the charging rate may be set to about C/100, (the active duty cycle of Fsw then varying generally between one modulation increment and two modulation increments in successive ten second intervals).

In a less precise control system, the programming of processor 18-10 may simply provide a table of numbers of modulation increments for the active duty cycle of Fsw according to respective ranges of measured temperature readings in digital form and the values of measured charging current may not enter into the selection of modulation increments. In such an open loop system, the sampling of charging current may be used for the fuel gauge function during normal operation of the hand held unit such as indicated at 10 in FIGS. 1 and 2, or in FIGS. 10, or at 12-10, FIG. 12. As described with reference to FIG. 12, the circuitry of FIG. 18 may be permanently associated with the hand held device 10, rather than being a permanent part of the battery pack. As another embodiment, the circuitry of FIG. 18 may be a permanent part of the battery pack along with a casing 60, FIG. 4, while the rechargeable battery means 18-20, FIG. 18, may be readily removable from casing 60 so as to be replaceable without replacement of components such as 18-10, 18-22, 18-24, 18-26, 18-28, 18-30, and 18-32. The transducer 18-30 need not be in physical proximity with the battery means 18-20. The processor 18-10 and switch means 18-22 can be part of the same silicon chip, for example. As indicated at 18-42, sensing means 18-28 may also receive an analog measure of battery voltage as indicated by a V(BATT) input at 18-42 and/or an analog measure of input charging voltage V(+CHG) as indicated at 18-44, and supply such analog measures to an analog to digital channel of processor means 18-10.

In generating the Vsw waveform, the processor 18-10 may load a number equal to the number of desired modulation increments for the active duty cycle of Vsw into a register, and apply a suitable turn on voltage to line 18-27 until a number of clock pulses of oscillator means 18-32 has been counted corresponding to the number selected.

Figure 22:
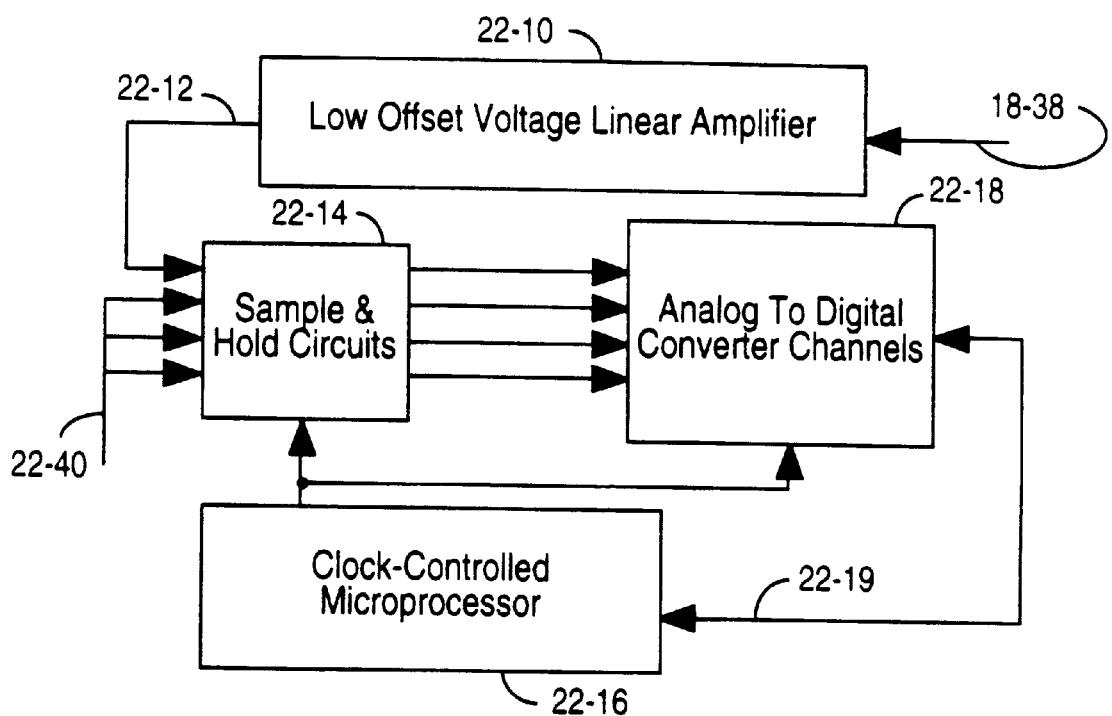
FIG. 22 is a block diagram for illustrating exemplary sampling circuitry for association with the V sense input of the processor means of FIG. 18.

As indicated in FIG. 22, the voltage across current measuring resistor 18-26, FIG. 18, may be supplied via line 18-38 to a low offset voltage linear amplifier 22-10. The output signal at 22-12 from amplifier 22-10 and the analog signals of multiconductor line 18-40 are supplied to respective sample and hold circuits of component 22-14. Successive samples of the battery current measurement waveform such as indicated at ns1, ns2, ns3, ns4, . . . , ns32, ns33, . . . , FIG. 21, may be selected by means of microprocessor 22-16 which is controlled by clock 18-32. Each sample may be obtained over a sample interval which may be equal to the clock period interval of one-sixth microsecond, for example, and may be held until it is converted to digital form by component 22-18 and supplied to a register of microprocessor 22-16 e.g. via conductors of a data bus forming part of the interconnecting means 22-19. The other analog signals are similarly sampled and transmitted e.g. to respective further registers of microprocessor 22-16.

The microprocessor 22-16 may be programmed to compute a new average battery charge rate with each sample of actual battery current after the first N samples. The microprocessor would also take account of any changes in battery temperature, for example. As a specific example, it may be desired to maintain a maximum battery charging rate consistent with assurance of prolonged battery life, e.g., avoiding an excessive overcharge rate as discussed in relation to FIG. 6.

Figure 6:
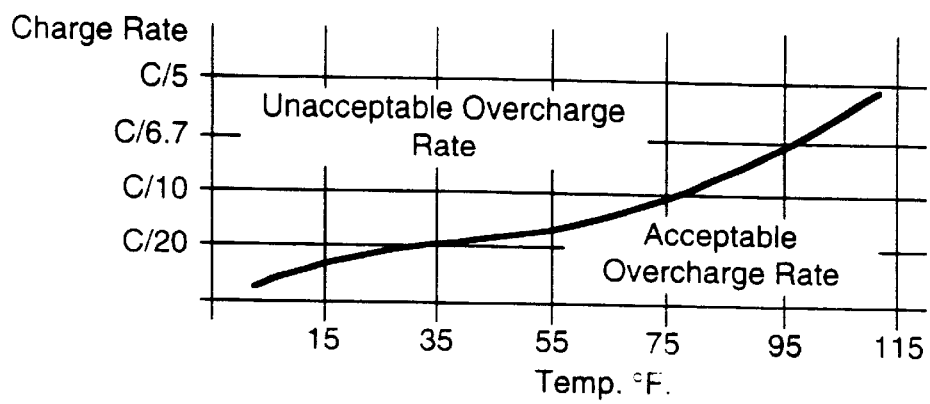
FIG. 6 shows a typical plot of permissible continuous overcharge rate as a function of temperature, for a particular type of rechargeable electrochemical energy storage cell, by way of example and not by way of limitation.
Figure 7:
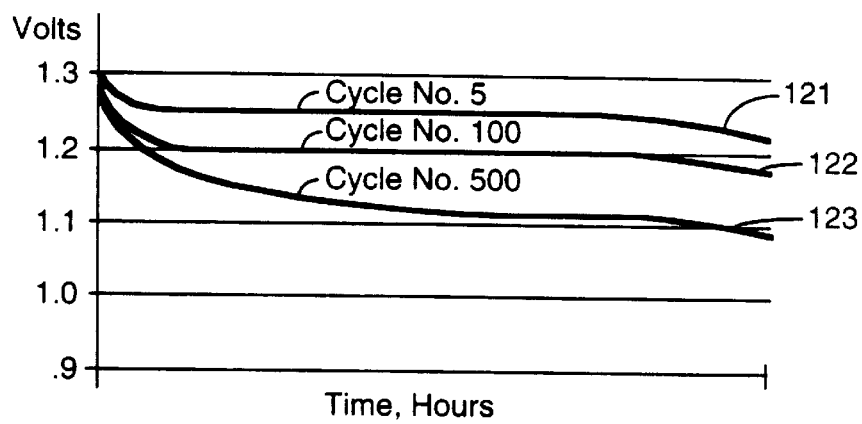
FIG. 7 is a plot of the effect of repetitive shallow cycling for the particular energy storage medium also represented by the plot of FIG. 6.
Figure 8:
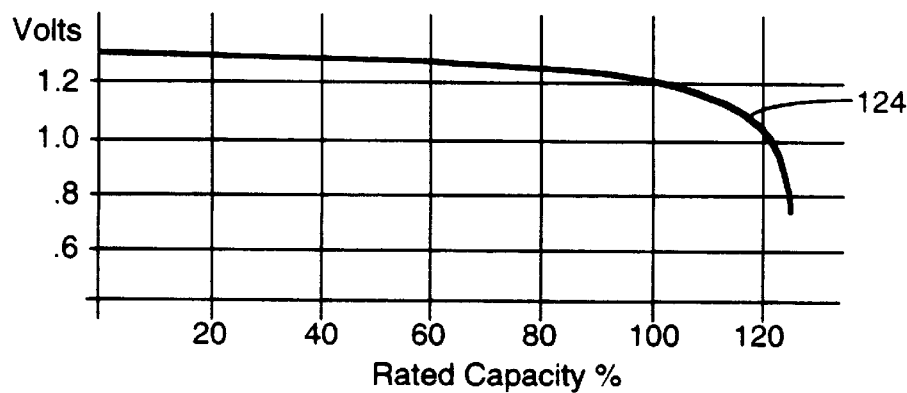
FIG. 8 is a plot of discharge characteristics for the particular energy storage medium also represented by the plots of FIGS. 6 and 7.

As a simplified example, processor means 18-10 may include a stored look up table wherein for respective temperature ranges, respective different settings for the desired average battery charging current are entered. An exemplary table based on FIG. 6 is as follows:

Exemplary Table Of Desired Average Battery Charging Current As A Function Of Temperature (See FIG. 6.)

| Temperature Range (°F.) | Average Battery Charging Current | Corresponding Nominal n Value |
|---|---|---|
| Below 2.5 | Zero | 0 |
| 2.5 to 35 | C/100 | 1 |

-continued

Exemplary Table Of Desired
Average Battery Charging
Current As A Function Of
Temperature (See FIG. 6.)

| Temperature Range (°F.) | Average Battery Charging Current | Corresponding Nominal n Value |
|---|---|---|
| 35 to 76 | C/20 | 5 |
| 76 to 98 | C/10 | 10 |
| 98 to 112.5 | C/6.7 | 15 |
| Over 112.5 | Zero | 0 |

If at the initiation of a battery charging operation, the temperature were in the range from 76 F. to 98 F., then a number ten (n=10) would initially be inserted into a duty cycle register. At the start of each operating cycle, switch means 18-22 would be turned on, and clock pulses of clock oscillator 18-32 would be counted until the number corresponding to the n value stored in the duty cycle register was reached. Switch means 18-22 would then be turned off.

For the case of closed loop control, sampling would take place as shown in FIG. 21. After sample ns32, a value of actual charging current would be calculated. If for example, the average actual current were calculated at 0.10 C., and the battery temperature remained in the same range of 76 F. to 98 F., there would be a zero error and the value of ten would remain in the duty cycle register.

With successive samples of actual battery current and successive temperature readings, if the actual battery current were found to increase to 0.11 C., the error of 0.01 C. could cause one count to be subtracted from the duty cycle register. If a new temperature range were measured, then the corresponding nominal n value from the foregoing table could be inserted into the duty cycle register. A more sophisticated control procedure taking account of further variables and narrower temperature ranges can be readily constructed based on the foregoing explanation.

The microprocessor 22-16 may be programmed to sample battery current during deep discharge of the battery means and during portable operation to obtain a measure of remaining battery life which may be displayed by the portable unit. See for example, Tables A and B herein.

Features of a preferred implementation of FIGS. 18, 19, 20A, 20B, 21 and 22 include the following by way of example and not of limitation:

(1) Constant frequency duty cycle repetition rate for Vsw, e.g., a fraction of the clock rate of component 18-32 corresponding to a desired number of modulation increments per cycle of Vsw.

(2) Digitally selectable duration for the active duty cycle of Vsw.

(3) Current in inductor 18-24 may reach zero before the end of each cycle of Vsw as illustrated in FIGS. 19 and 20B over a range of numbers of modulation increments including a maximum charging rate, e.g., C/8, for battery 18-20.

(4) Vsense at 18-38 is measured via a low offset voltage linear amplifier, a sample and hold circuit, and an analog to digital converter, e.g., as indicated in FIG. 22.

(5) Processor 18-10 obtains a measure of battery current during both battery charging and battery discharging operations.

(6) Current sense resistor 18-26 adds little to the resistance of battery means 18-20.

(7) The actual analog current pulse waveform in resistance 18-26 is deliberately under-sampled to alias the resultant waveform (as indicated in FIG. 21) to a very low frequency so that processor 18-10 can readily obtain a measure of average charging current without requiring a high processor operating rate.

(8) Processor 18-10 selects the duty cycle of Vsw according to ambient temperature to prolong battery life and enhance reliability of the complete hand-held unit.

SUMMARY OF OPERATION

From one standpoint, the illustrated embodiment exemplifies a method of operation in a battery charging system wherein current is intermittently supplied from a voltage source means, e.g., V(+CHG), FIG. 18, to a chargeable battery means 18-20 via an energy storage means, e.g., inductance 18-24. The circuit arrangement is such that battery charging current continues to flow from the energy storage means to the battery means, e.g., via diode 18-36, at each interruption of the current flow at current regulator means 18-22. The intermittent actuation of current regulating means 18-22 produces a fluctuating battery charging current such as represented in FIGS. 19 and 20B which fluctuates in each of the successive operating cycles.

In order to obtain a measure of average battery charging current, the sampling means of component 18-10 is operated in an aliased asynchronous manner relative to the operating cycles of the battery charging current waveform such that battery charging current is sampled at respective different sampling times, e.g., ts1, ts2, ts3, . . . , FIG. 20B, in respective different operating cycles e.g. cycles S1, S65, S129, . . . , FIG. 20A, over a certain aliased sampling time interval, e.g., as represented at ns1 to ns32, FIG. 21. Because of the clock rate of clock oscillator 18-32, FIG. 18, e.g., six megahertz, the waveform of each operating cycle such as shown in FIG. 19 could be sampled a number of times, e.g., at intervals of one-sixth microsecond, such intervals being termed potential sampling intervals. In aliased sampling however, a given cycle of the battery charging current may not be sampled at all, and for example, as shown in FIG. 20B, sampling may take place at intervals of about sixty-four operating cycles but asynchronously to the repetition interval of the operating cycles, so that successive actual sampling intervals such as ts1, ts2, ts3, ts4, . . . , FIG. 20B, scan through the potential sampling points, in each of a succession of aliased sampling cycles, each such aliased sampling cycle having a duration, for example, greater than one millisecond (e.g., 43.696 milliseconds).

If, for example, the sampling takes place at N respective different potential sampling intervals, covering the potential sampling points of the operating cycle, then after N samples have been obtained, the sample values can be added and an average obtained as a measure of average battery charging current. With each new sample such as sample N plus one, the earliest sample, e.g., sample number one, can be discarded, and a new average value calculated.

In the exemplary embodiment, the battery or environmental sensing means 18-28 in conjunction with transducer 18-30 may measure an ambient temperature related to the temperature of the battery means 18-20 and determine an optimum battery charging rate based at least in part on the most recent measurement of battery temperature.

For example, for a given chargeable battery means the processor means 18-10 may be programmed to select a maximum battery charging rate consistent with assurance of prolonged battery life, e.g. avoiding an excessive overcharge rate as discussed in relation to FIG. 6.

As an example, processor means 18-10 may include a stored look up table wherein for each respective temperature range of significance, respective different settings for the desired average battery charging current are entered.

By way of example, where there is a number of potential discrete sampling intervals per operating cycle equal to the fifth power of two (32), sampling may be effected at time intervals equal to about the fifth power of two (32) times the duration of an operating cycle, or about the tenth power of two (1024) times the duration of a discrete sampling interval. For the example of a clock rate of six megahertz, the potential discrete sampling intervals may have a duration of one-sixth microsecond (about 167 nanoseconds).

Thus, the time between samples may be substantially longer than one microsecond, e.g. of the order of one-sixth of a millisecond.

For the case where the clock time period is one-sixth of a microsecond, and the operating frame interval of an operating cycle is equal to e.g. the fifth power of two (32) times such clock time period, the operating frame period is itself greater than one microsecond (e.g. 5.33 microseconds).

It can be seen from FIG. 19 that where switch means 18-22 is to be operated with a maximum duty cycle limited to twenty clock period time intervals of one-sixth microsecond, the energy in the inductance 18-24 may be essentially dissipated in less than ten microseconds, for example in a time interval of about one-third microsecond.

From FIG. 19, it can be seen that with a duty cycle of fifty percent, i.e. with switch means 18-22 turned on for sixteen clock period intervals (about 2.67 microseconds), or even with a duty cycle of seventy percent, the current in inductance means 18-24 will be substantially zero at the end of the operating cycle.

With closed loop control of battery charging current, it would be feasible to have duty cycles of switch means 18-22 where appreciable current was flowing in inductance means 18-24 at the beginning of successive duty cycles, e.g. as indicated at 19-4, FIG. 19, since the sampling means of FIG. 22 would sample current over the entire operating cycle, and would provide a measure of total current flow in the battery means.

Definition of Aliased Sampling Means

In the normal sampling of a periodically fluctuating current, a sufficient number of samples would be taken to obtain values in the vicinity of an abrupt change such as at 19-3, FIG. 19. With the exemplary waveform, such an abrupt change may take place at numerous discrete positions, suggesting a number of samples per cycle. An "aliased" sampling is one that takes place at intervals greater than the period of the fluctuating waveform.

Figure 23:
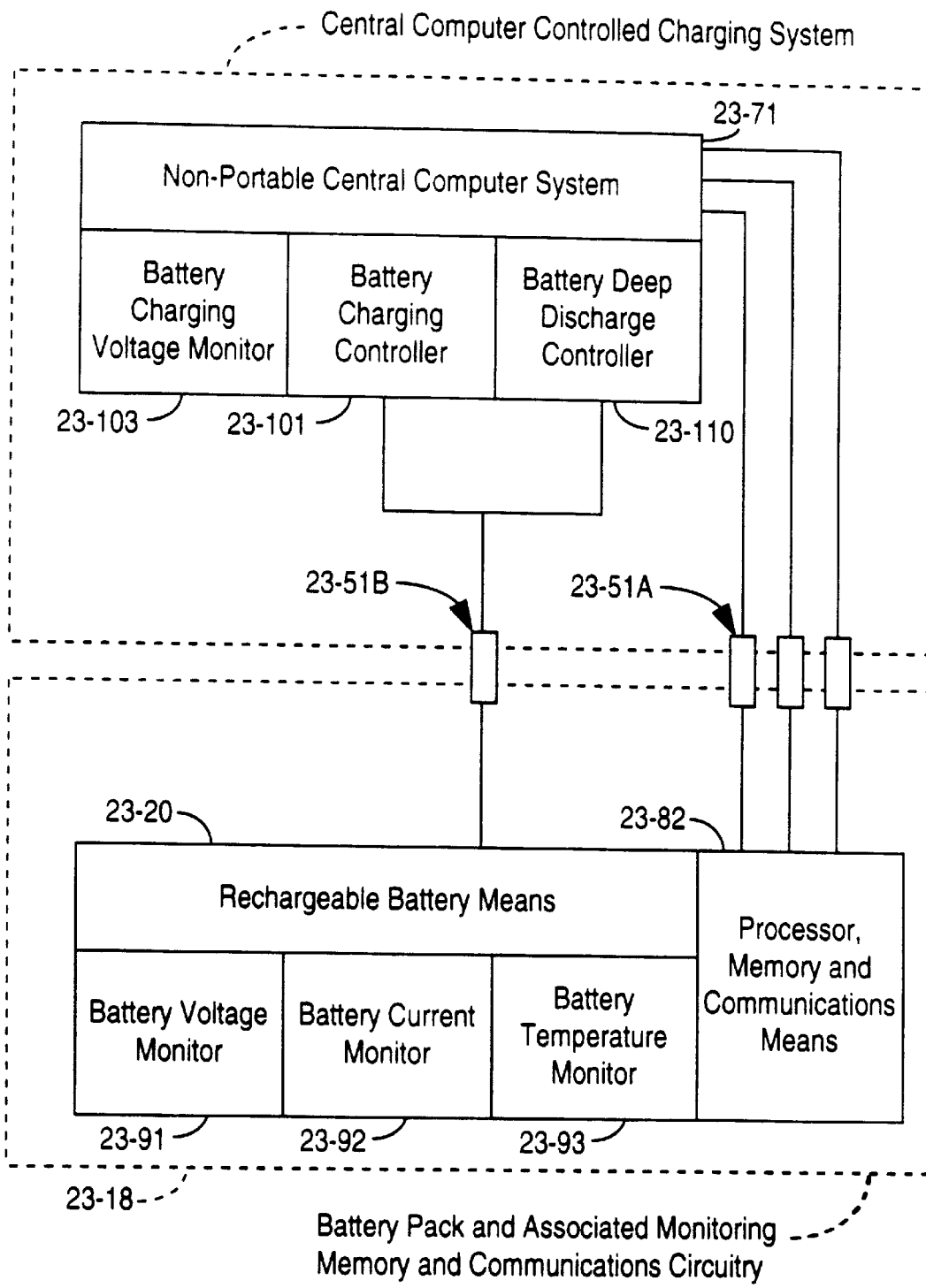
FIG. 23 illustrates a battery conditioning system as described at col. 17, lines 51–68 of the incorporated U.S. Pat. No. 4,455,523 and wherein two-way communication may be established between memory means associated with a portable unit comprised of rechargeable battery means, and a non-portable central computer controlled conditioning station.

Description of FIG. 23

FIG. 23 illustrates a non-portable system for inserting a measured value of battery capacity of a rechargeable battery means 23-20 into a memory of processor, memory and communications means 23-82 of the battery system indicated at 23-18, after each deep discharge cycle as effected by deep discharge controller 23-110. For example the deep discharge cycle of controller 23-110 and the charging cycle of charging controller 23-101 may be controlled by a separate non-portable computer system 23-71 at a central charging station. This computer system may be capable of communication with the memory of means 23-82 of the battery system via communications interface means 23-51A for inserting an accurate actual measurement of battery capacity. The central computer of non-portable computer system 23-71 may interrogate the memory of means 23-82 for relevant battery history and then selectively determine a suitable charging voltage and charging current at charging interface means 23-51B.

As will be explained with reference to FIG. 24, the memory of component 23-82 may contain a non-volatile read only memory which identifies the particular associated battery pack as to its capacity, rated voltage and other characteristics relevant to conditioning operations. Thus, where a series of different battery packs have respective read only memories identifying the same, the central charging station may interrogate the different battery packs coupled therewith and select charging and deep discharge cycle parameters according to the individual characteristics of the respective different battery packs.

Figure 5:
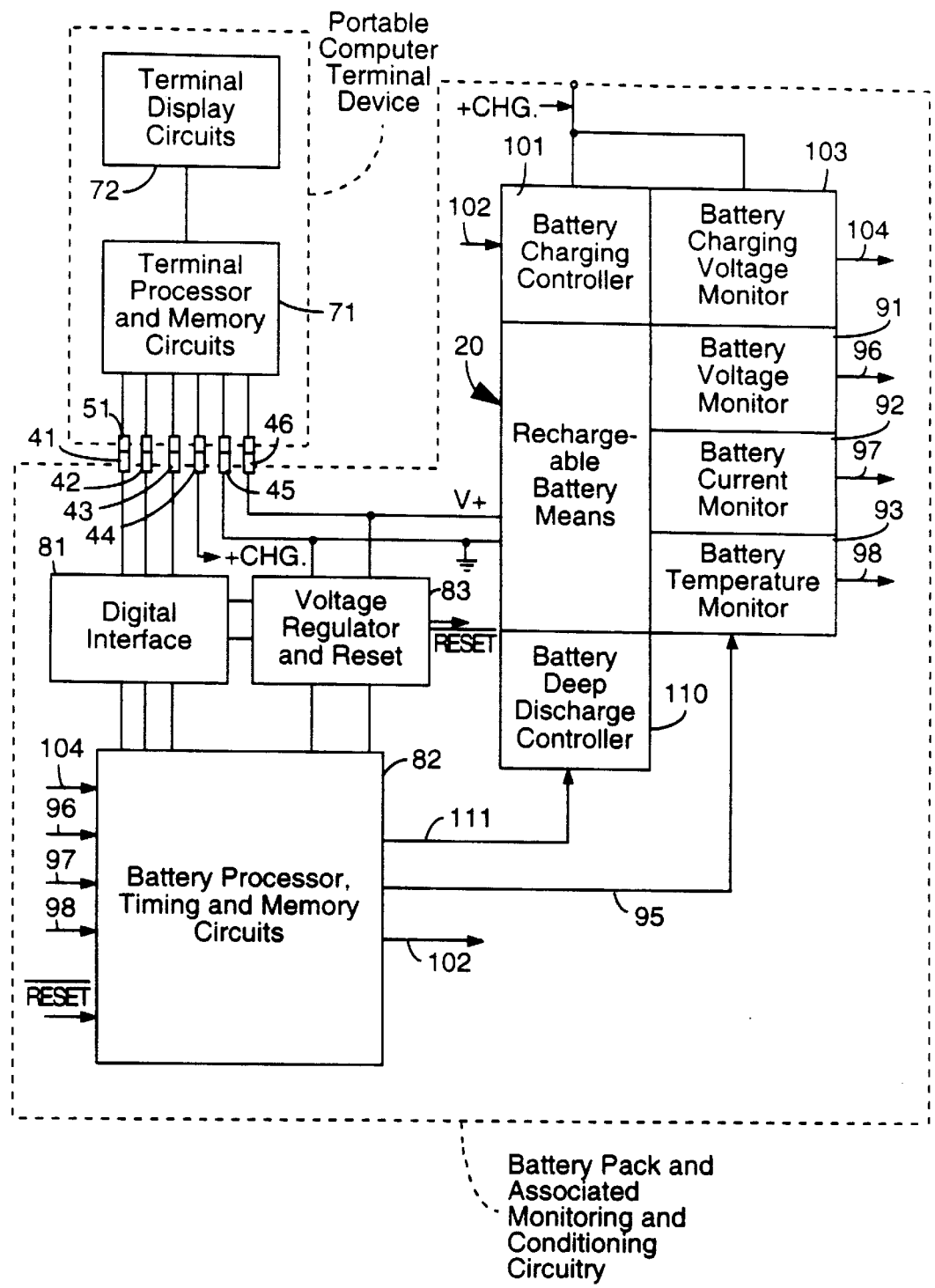
FIG. 5 shows a block diagram for explaining the cooperative relationship of the electronic parts of the particular portable computer terminal device and battery system shown in FIGS. 1 through 4, by way of example and not by way of limitation.

As will be apparent to those skilled in the art, the respective components of FIG. 23 may correspond with components of FIG. 5 as follows:

| Component of FIG. 23 | Corresponding Component or Components of FIG. 5 |
|---|---|
| Battery System 23-18 | Components 20, 81–83, and 91–93 |
| Rechargeable Battery Means 23-20 | Rechargeable Battery Means 20 |
| Memory and Communications Means 23-82 | Battery Processor, Timing and Memory Circuits 82, Digital Interface 81 and Voltage Regulator and Reset Component 83 |
| Battery Voltage Monitor 23-91 | Component 91 |
| Battery Current Monitor 23-92 | Component 92 |
| Battery Temperature Monitor 23-93 | Component 93 |

Components 23-71, 23-101, 23-103, and 23-110 may be analogous to components 71, 101, 103 and 110 in FIG. 5. Interface means 23-51A and 23-51B may be analogous to interface or connector means 51, FIG. 5.

Figure 24:
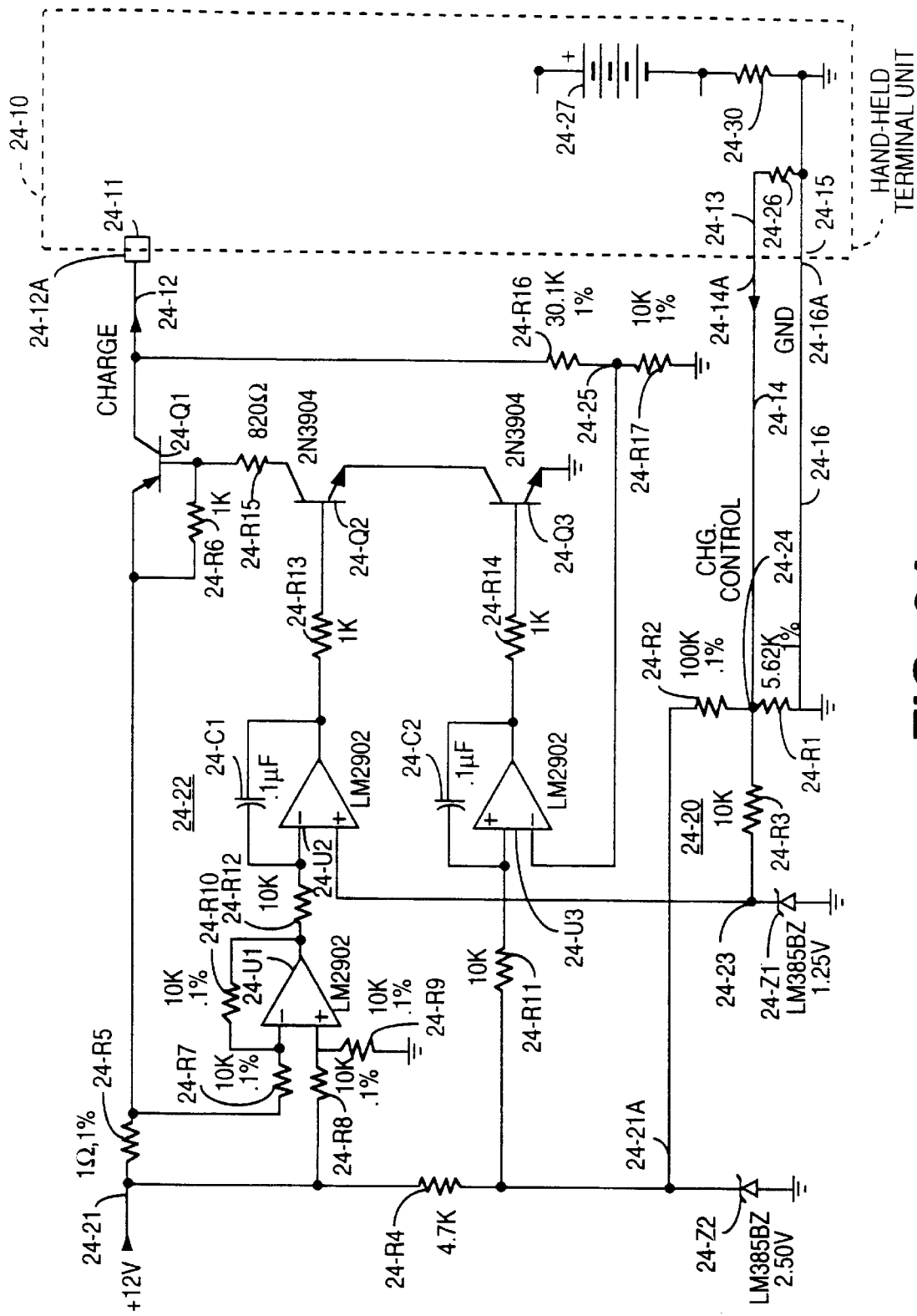
FIG. 24 shows a battery conditioning system wherein a battery identifying circuit element directly controls the set point of a battery charging circuit to determine a battery charging parameter, e.g., battery charging current.

Description of FIG. 24

FIG. 24 shows a battery conditioning circuit which may be utilized in place of the central computer controlled charging station of FIG. 23. The system of FIG. 24 may have a receiving device for a hand-held unit as described in Chadima et al U.S. Pat. No. 3,823,388 (e.g. in reference to the fifth figure thereof at col. 9, lines 20–31). See also a brochure of Norand Corporation entitled "Route Commander" Portable Data System for bakery distribution, No. 960-382-0884, copyright 1984, a copy of two sections thereof being included in Appendix A hereto.

When a hand-held device indicated at 24-10, FIG. 24, (such as shown in incorporated FIG. 1) is inserted into its receptacle, its charge input indicated at 24-11 is coupled with contact 24-12A, FIG. 24, of the CHARGE output line 24-12, and a further terminal contact 24-13 is coupled with contact 24-14A of the CHG CONTROL line 24-14. By way of example, the receptacle may receive different hand-held terminals with different battery configurations, and each configuration would provide a characteristic resistance value between the terminal ground contact such as 24-15 (connected with ground contact 24-16A of GND line 24-16) and the terminal charge control contact such as 24-13. The terminal resistance value is thus connected between contact 24-14A and the ground contact 24-16A, and in parallel with a resistor 24-R1 of a charge control reference network 24-20 which further includes resistors 24-R2, 24-R3 and zener 24-Z1. The network receives an activating potential from a charging supply input line 24-21 (+12 V) via a charging supply potential responsive line 24-21A which is connected between a resistor 24-R4 and a zener 24-Z2.

The current flow path between the charging supply input line 24-21 and CHARGE output line 24-12 includes a charge current sensing resistor 24-R5 and a charge current regulating transistor 24-Q1. The value of charge current is controlled by means of a control circuit 24-22 which includes linear operational amplifiers 24-U1, 24-U2 and 24-U3, transistors 24-Q2 and 24-Q3, resistors 24-R6 through 24-R17, and capacitors 24-C1 and 24-C2. As an example, the linear operational amplifiers may receive a supply voltage of plus twelve volts (+12 V) relative to ground potential from supply input 24-21, and may be of type LM2902.

It will be apparent to those skilled in the art that the charging current supplied by the circuit of FIG. 24 will increase for increasing potentials at control point 24-23 up to the limit potential of zener 24-Z1 (which may for example be 1.25 volts). If for example, the limit potential for zener Z4-Z2 is 2.50 volts, the maximum potential at circuit point 24-24 may be designated VR1 with an open circuit between contacts 24-14A and 24-16A. This potential VR1 is then progressively reduced for respective terminal resistance values between about three times the value of 24-R1 (e.g. 5.62 kilohms plus or minus one percent) and about one-third the value of 24-R1, for example.

Exemplary circuit parameters for FIG. 24 are as follows (the letter K standing for kilohms):

| Exemplary Circuit Parameters, FIG. 24 | |
| --- | --- |
| 24-U1, 24-U2, 24-U3 | Type LM2902 |
| 24-Q1 | power transistor |
| 24-Q2, 24-Q3 | Type 2N3904 |
| 24-R1 | 5.62K (1%) |
| 24-R2 | 100K (1%) |
| 24-R3 | 10K |
| 24-R4 | 4.7K |
| 24-R5 | one ohm (1%) |
| 24-R6 | one kilohm (1K) |
| 24-R7, 24-R8, 24-R9, 24-R10 | 10K (.1%) |
| 24-R11, 24-R12 | 10K |
| 24-R13, 24-R14 | one kilohm (1K) |
| 24-R15 | 820 ohms |
| 24-R16 | 30.1K (1%) |
| 24-R17 | 10K (1%) |
| 24-C1, 24-C2 | .1 microfarad |
| 24-Z1 | LM385BZ (1.25 volts) |
| 24-Z2 | LM385BZ (2.50 volts) |

Summary of Operation for FIG. 24

In operation, respective different terminals 24-10, (such as terminal 10 of incorporated FIG. 1), having respective different charging current requirements are provided with respective corresponding ohmic resistance values between their contacts such as indicated at 24-13 and 24-15, FIG. 24. Thus each respective different terminal 24-10 will automatically produce the respective required charging current by virtue of the action of control circuit 24-22.

If the charging potential at output 24-12 tends to increase beyond its rated value, the potential at circuit point 24-25 tends to increase, decreasing the turn on potential supplied to transistor 24-Q3 by amplifier 24-U3.

The potential at 24-24, FIG. 24 may be coupled with a central computer system such as 23-71 via an analog to digital converter so as to identify the type of battery means to the central computer. The resistance between terminals 24-13 and 24-15 would normally be a resistor such as indicated at 24-26 fixedly associated with the battery means such as indicated at 24-27, so that replacing a battery means in a given terminal with a battery means of different ampere-hour capacity would automatically change the resistance value engaged with terminal contacts 24-13, 24-15. The computer system 23-71 of FIG. 23 in this modification, would thus receive an identification of battery capacity along with other battery parameters, and control battery conditioning (e.g. deep discharge) according to relevant parameters including battery capacity, while battery charging would be automatically controlled by a circuit such as shown in FIG. 24.

Figure 25:
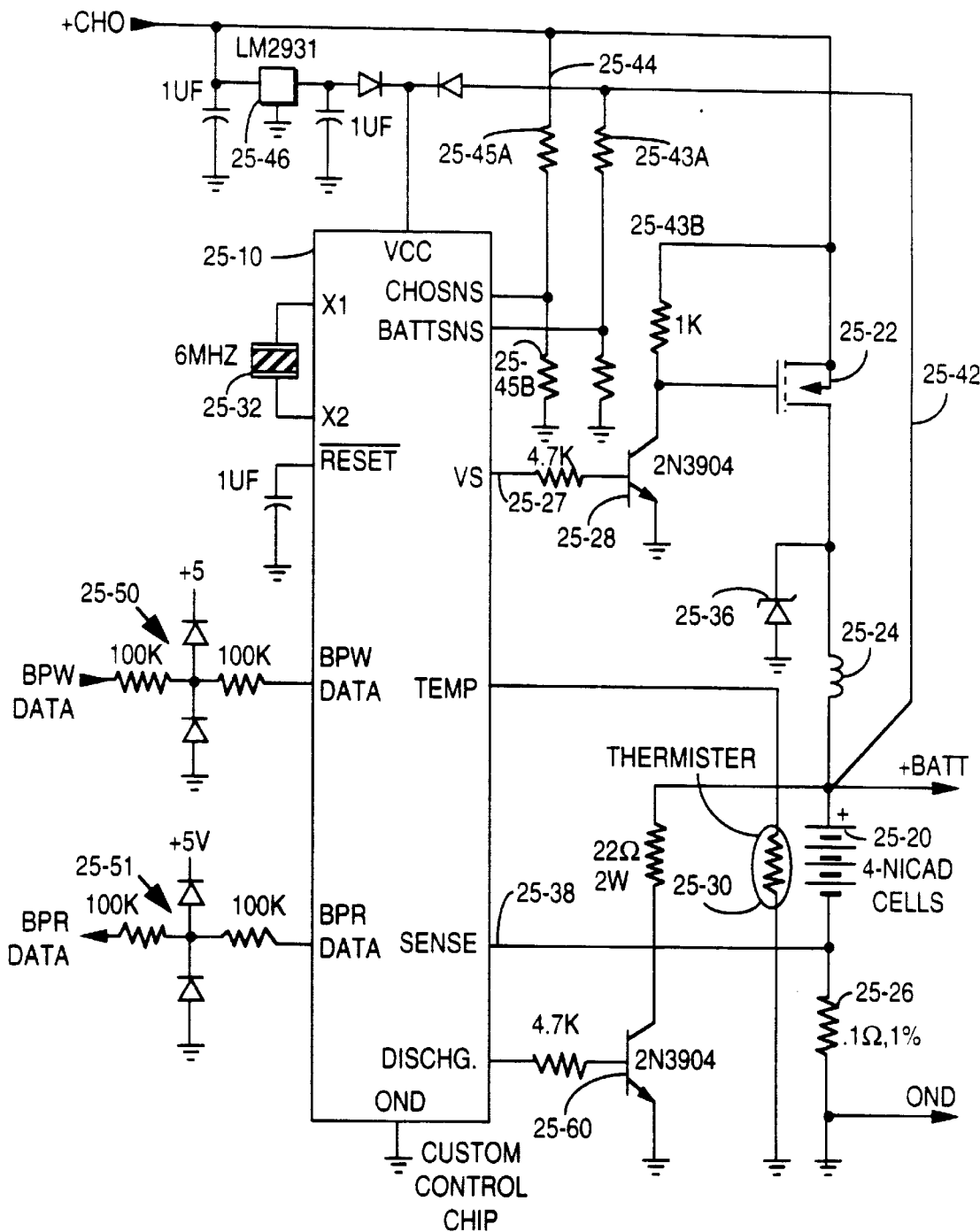
FIG. 25 shows a highly integrated semiconductor device, e.g., for implementing the system of FIGS. 18–22.

Description of FIG. 25

In FIG. 25, component 25-10 is a custom control chip for integrating the functions of components 18-10 and 18-28, FIG. 18, into a single monolithic semiconductor element. The external path for supplying charging current to battery 25-20 includes transistor 25-22, inductor 25-24 and charging current sensing resistor 25-26 which may correspond with components 18-22, 18-24 and 18-26, FIG. 18. A pulse width modulated output corresponding to that shown in FIG. 20A, is supplied at VS output 25-27 of chip 25-10 for controlling the on-time of transistor 25-28 which in turn controls the switching action of transistor 25-22. Components 25-30, 25-32 and 25-36 may essentially correspond with components 18-30, 18-32 and 18-36 in FIG. 18.

Charging current sensing input 25-38 may correspond with input 18-38, FIGS. 18-22, and may control circuitry of chip 25-10 such as represented by components 22-10, 22-14, 22-16 and 22-18, FIG. 22. The chip 25-10 is shown as sensing battery voltage (+BATT) via a line 25-42 and a first resistance voltage divider 25-43A, 25-43B, and is shown as sensing charging input potential (+CHG) via a line 25-44 and a second resistance voltage divider 25-45A, 25-45B.

Operating potential (VCC) is supplied to chip 25-10 from charging input potential (+CHG) via a voltage regulator 25-46.

Data communications, e.g., between chip 25-10 and a central computer system such as 23-71, FIG. 23, may take place via stage 25-50 for data reception (BPWDATA) and via stage 25-51 for data transmission (BPRDATA).

Chip 25-10 may control battery discharge conditioning via transistor 25-60.

The operation of FIG. 25 will be apparent from a consideration of the preceding Description of FIGS. 18, 19, 20A, 20B, 21 and 22.

Figure 26:
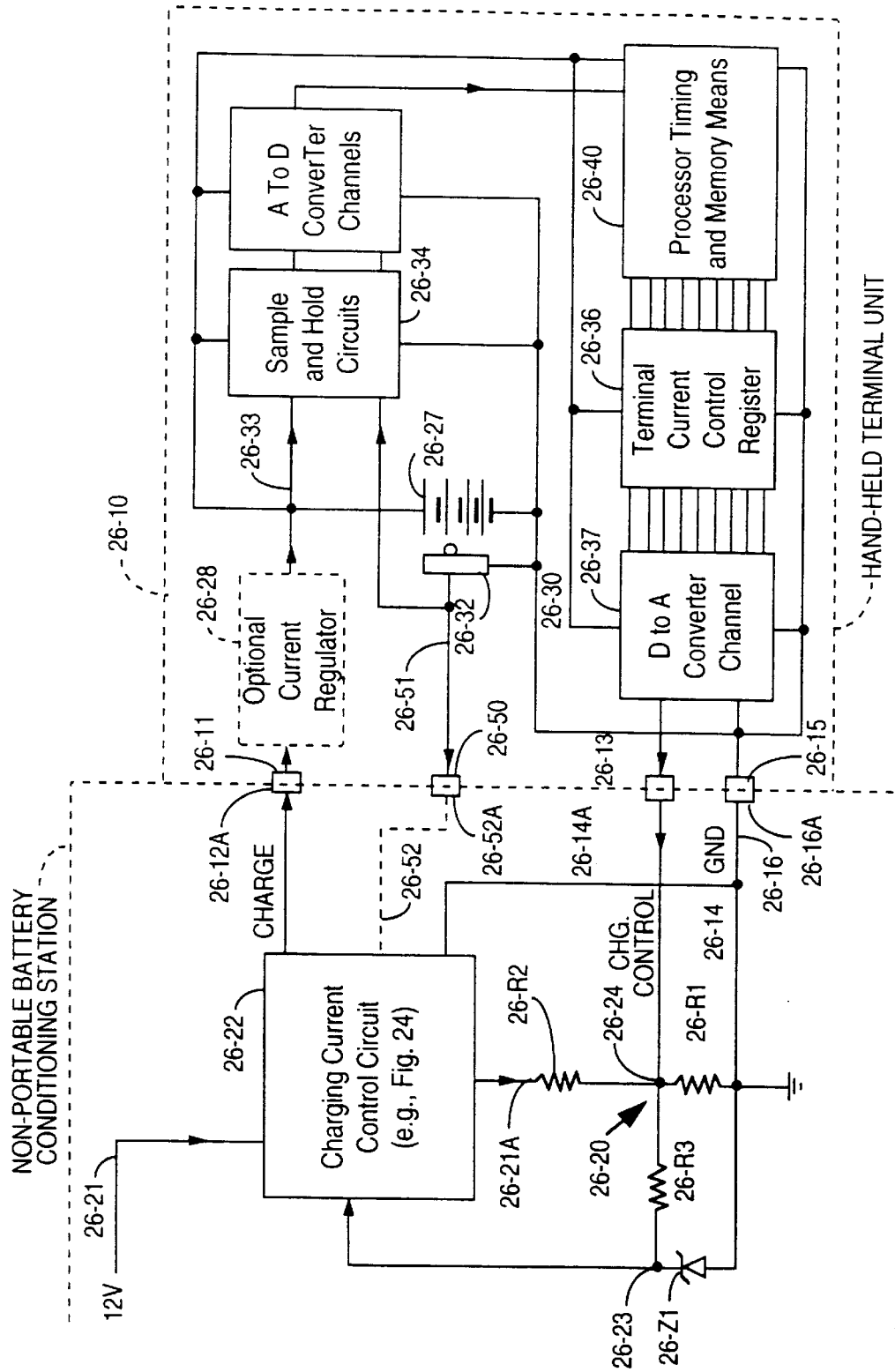
FIG. 26 is an electric circuit block diagram showing a battery conditioning system wherein a preferred hand-held terminal unit contains battery parameter sensing means and computer operating means for optimizing battery charging current as supplied by an external circuit (which may correspond with a standardized circuit such a shown in FIG. 24 applicable to a complete family of hand-held terminals)

Description of FIG. 26

FIG. 26 shows a preferred form of hand-held terminal unit 26-10 which may be associated with an external conditioning circuit such as shown in FIG. 24 by means of respective sets of mating contacts 26-11, 26-12A; 26-13, 26-14A; 26-15, 26-16A; in the same way as described for FIG. 24. Charging current is supplied to terminal unit 26-10 via CHARGE line 26-12, and an analog charge rate control signal may be applied from terminal unit 26-10 to CHG Control line 26-14, while terminal ground is connected with GND line 26-16 of the conditioning station.

As in FIG. 24, a charge control reference network 26-20 may comprise a resistance network 26-R1, 26-R2 and 26-R3 and a zener 26-Z1 for receiving activating potential from a charging supply input line 26-21 (+12 V) via a charging supply potential responsive line 26-21A. A charging current control circuit 26-22 may correspond with that of FIG. 24 and controls the charging current supplied via line 26-12 in accordance with a control signal potential at 26-23.

As in FIG. 24, resistance network 26-20 serves as a control signal generating network which provides a default value of control signal at circuit point 26-23 in the absence of any modifying input from a hand-held terminal unit. By way of example, both for FIGS. 24 and 26, older model terminal units may present an open circuit to station contacts 24-14A, 24-16A or 26-14A, 26-16A, and the generating network 24-20 or 26-20 by itself may provide a default value of control signal which results in the supply of a generally suitable value of charging current at 24-12 or 26-12, say 130 milliamperes.

In FIG. 26, the potential at circuit point 26-24 may be modified from the default value according to information and programming carried by the terminal unit, for example, to produce a rapid charge rate, a moderate charge rate or a maintenance charge rate in dependence on the battery parameters of the terminal battery means 26-27, ideally so that an optimum charging rate is selected. Such charging rate can in principle take account of the load to be presented to the charging circuit by components of the terminal unit which will be functioning during the charging operation, e.g. terminal circuits for effecting a downloading of data from the memory of the terminal unit.

In a preferred example, the charging current path in FIG. 26 may include an optional current regulator 26-28 which is part of the portable terminal unit. The current regulator 26-28 could be present in cases where the terminal might be charged by means of a charging circuit without the current control features of circuit 26-22. For the sake of simplicity and economy, it is preferred that current regulator 26-28 be unnecessary, (because of the use of a charger configuration such as shown in FIGS. 24 and 26) and therefore preferably current regulator 26-28 is omitted, and line 26-33 is directly connected with contact 26-11.

The negative terminal of the battery means is preferably returned directly to ground potential as indicated at 26-30, without the presence of a current sensing resistor such as indicated at 25-26, FIG. 25. Correspondingly current sense resistor 24-30, FIG. 24, may be short circuited, particularly where the terminal processor means is programmed to accumulate a measure of battery usage. Omission of a current sense resistor such as 24-30 is particularly advantageous where the battery is to supply relatively high peak current as in portable radio frequency (RF) terminals which communicate data on line to a base computer station an RF link.

In the preferred example of FIG. 26, battery parameter sensing means are illustrated, comprised of a temperature transducer 26-32 for obtaining a measure of battery temperature, and a battery potential sensing line 26-33 for sensing battery terminal voltage. As in FIG. 25, components 26-34, 26-35, 26-36 and 26-37 may be on a single semiconductor chip with processor, timing and memory means 26-40 of the portable unit. Components 26-35 and 26-36 correspond with components 22-14 and 22-18 of FIG. 22 and comprise battery parameter input means for supplying measures of battery temperature and battery terminal voltage e.g. in binary digital format to the processor and memory components. Component 26-40 may include the clock-controlled microprocessor corresponding to 22-16, FIG. 22, and the interconnections of FIG. 22 have been omitted in FIG. 26 for simplicity of illustration.

According to a feature of the present invention, temperature transducer 26-32 may have its signal coupled to a further contact 26-50 via a line 26-51. Thus where a charger is present with a cooperating contact 26-52A and a line 26-52, the control circuit 26-22 can itself adjust charging current according to battery temperature. Further, the presence of a nonzero potential at line 26-51 may indicate that operating potential has been applied to transducer 26-32 from a charger circuit. (See, e.g., the specific circuit of FIG. 27.)

Figure 27:
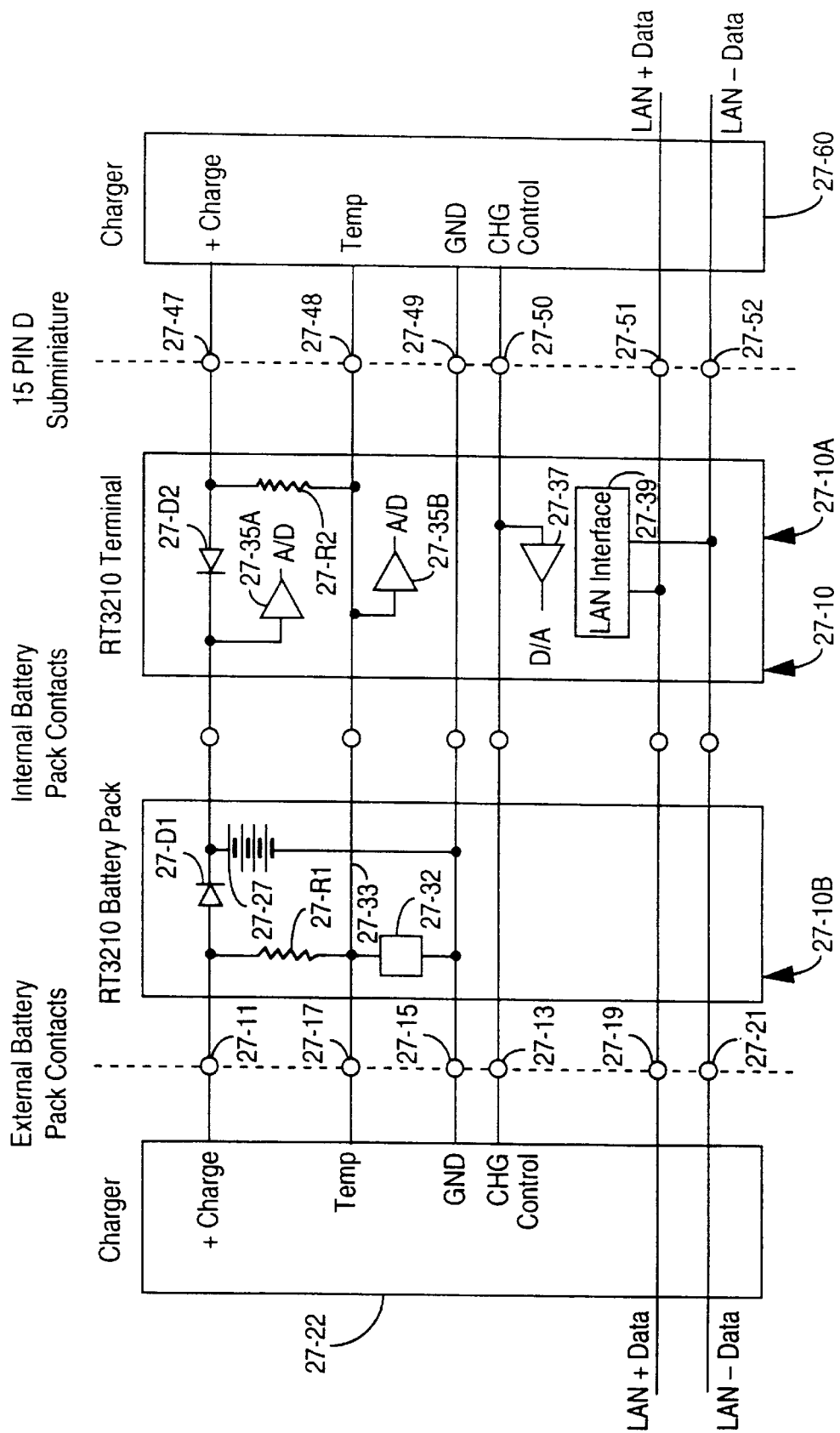
FIG. 27 shows a new RF terminal unit including charge control and temperature transducer outputs as in FIG. 26, and also incorporating an interface for coupling with a local area network so as to enable batch transmission of data to and from the RF terminal.

Description of FIG. 27

FIG. 27 illustrates a new RF terminal unit which may be associated with a non-portable battery conditioning system in a similar way as FIG. 26. In particular, FIG. 27 diagrammatically illustrates an RF terminal system 27-10A which removably receives a rechargeable battery pack 27-10B. By way of example, the rechargeable batteries may be contained in a removable drawer as illustrated in pending application of George E. Chadima, Jr., et al, U.S. Ser. No. 104,653 filed Oct. 2, 1987, and entitled "HAND-HELD COMPUTER SYSTEM", and this disclosure is incorporated herein by reference in its entirety. As illustrated in the tenth figure of the incorporated application Ser. No. 104,653, an end cap of the RF terminal unit may be provided with conventional contactors such as indicated at 27-11, 27-13, 27-15, 27-17, 27-19 and 27-21, which provide for quick connection with the battery pack and terminal circuitry simply by placing the terminal assembly into a suitable receptacle, for example, in a delivery vehicle or the like. The delivery vehicle may be provided with a charger circuit such as indicated at 27-22 which may be provided with a conventional terminal unit receptacle similar to that shown in page A2 of Appendix A hereto, which receptacle is provided with contacts for quick release engagement with the terminal contacts 27-11 etc. The battery pack may be provided with a rechargeable battery 27-27 and a temperature transducer 27-32, e.g., a solid state type LM335.

The terminal assembly designated generally 27-10 further is indicated as including a resistor 27-R1 and a diode 27-D1 in the battery pack and a corresponding resistor 27-R2 and a corresponding diode 27-D2 in the terminal itself. It will be noted that the potential across transducer 27-32 will be zero until such time as a charge potential is applied at contact 27-11, so that the presence of a potential different from zero volts at contact 27-17 and at line 27-33 will indicate application of charging potential to the assembly 27-10. The circuitry at 27-35A and 27-35B in FIG. 27 may correspond with the circuitry 26-34 and 26-35 in FIG. 26, and may represent a suitable commercially available integrated circuit for sensing analog values of battery terminal voltage and temperature, and for supplying corresponding digital values to a terminal processor such as indicated at 26-40 in FIG. 26. Component 27-37 in FIG. 27 may correspond with components 26-36 and 26-37 in FIG. 26 and may receive an output control word from a processor corresponding to 26-40 in FIG. 26 for establishing a desired control signal potential at contact 27-13 as described in detail with reference to FIG. 26.

Furthermore, the processor circuit of FIG. 27 may be provided with a local area network (LAN) interface 27-39 for commnunication with exterior devices via contacts 27-19 and 27-21, for example. Thus the terminal 27-10A is not only provided with RF circuitry and antenna means for on-line data interchange with a RF base station, but further the plug-in contacting of the terminal body at 27-19 and 27-21 provides for batch type transmission between the terminal 27-10 and an exterior station, permitting the batch type downloading of data, for example programming, into the terminal 27-10, and the batch type uploading of stored data from the terminal to an external station, for example a printer of a vehicle such as previously mentioned.

The incorporated patent application Ser. No. 104,653 shows in the tenth figure a fifteen pin "D" subminiature connector. Certain pins of this connector are indicated at 27-47 through 27-52 in FIG. 27, so that the terminal 27-10 can be coupled by means of such connector with a charger circuit such as indicated at 27-60, for example by means of a suitable connecting cable or the like. The charger circuit 27-60 may correspond with the charger circuit of FIG. 24 or FIG. 26, for example, and may include components connected to the local area network interface 27-39 via contacts 27-51 and 27-52.

It will be apparent that the local area network interface 27-39 may be utilized to transmit to the charger 27-22 or 27-60 battery information such as rated battery capacity and hours of use subsequent to a previous charge as explained in detail with respect to FIGS. 23 and 26.

Discussion of FIGS. 23 through 27

The processor of components 23-71, 25-10, 26-40 or of FIG. 27 can be programmed with a schedule of battery charging currents as a function of temperature such as described with reference to FIGS. 18–22. As another example, reference is made to the lookup table of Appendix B (page B10 of APPENDIX B). Generally the charging rate can be adjusted according to a quantitative measure of battery temperature so as to achieve a maximum charging rate consistent with the specific characteristics of the battery means 23-20, 25-20, 26-27 or 27-27.

Where battery terminal voltage is measured, abnormally high or low values may represent a defective battery or short circuit, so that the processor of component 23-71, 25-10, 26-40, or of FIG. 27 would be programmed to provide a shutoff control potential for the charging circuit. For example, in FIG. 26, a maximum potential from the converter channel 26-37 could establish a control potential at circuit point 26-23 of 1.25 volts, the limit potential of zener 26-Z1, and produce zero charging current (corresponding to a shut-off of transistor 24-Q1, FIG. 24).

Where the processor and memory means of component 23-82, FIG. 23, or 26-40, FIG. 26, or of FIG. 27 keeps track of usage of the hand-held terminal unit in the portable (off the charger) mode, the accumulated hours of use along with rated battery capacity can be transmitted to the central computer system 23-71 at the start of a conditioning operation, or can be utilized in selecting a suitable computer generated control word for register 26-36 in FIG. 26 or for component 27-37, FIG. 27. As described in incorporated U.S. Pat. No. 4,553,081 (at col. 45, line 58 et seq.), when the terminal unit 26-10 or 27-10 is unplugged from the conditioning station, the processor e.g. of 26-40 may increment an elapsed time counter (e.g. a register or memory location of 26-40) by a constant of two minutes for every minute off charge, until a maximum of twelve hours has been incremented (six hours of real time). When the terminal unit again is plugged into the charger circuit (such as 26-22 or 27-22) the CPU e.g. of 26-40 may then decrement from the incremented amount to determine charge time, or transmit the incremented amount as battery information to the central computer of 23-71, FIG. 23. As previously a maximum charge time of twelve hours may be set as the incremented amount if the unit should be deactivated, e.g. by turning off battery power in the field. (See also col. 47, lines 36–53 of incorporated U.S. Pat. No. 4,553,081.)

Generally, the processor of each portable terminal unit may store battery information such as indicated in TABLE B of incorporated U.S. Pat. No. 4,553,081 (col. 14, line 40-col. 15, line 58), and battery information may be transmitted to an external processor e.g. of component 23-71, FIG. 23, when the terminal unit is plugged into a conditioning station preparatory to conditioning operation, and in any case the stored data may be used as battery information in the generation of charging current control signals, e.g., in the embodiments of FIGS. 23, 25, 26 and 27.

Generally, communication between a processor, e.g., of components 18-10, 23-82, 25-10, 26-40, or of FIG. 27, and an external station may include the types of commands given in TABLE A of incorporated U.S. Pat. No. 4,553,081 (col. 14, lines 14–39).

In each of the embodiments of incorporated U.S. Pat. No. 4,553,081 referring to charging of a spare battery pack (e.g., col. 19, line 61 to col. 20, line 4; and col. 48, line 31 to col. 49, line 53), the same description may apply to charging of a plug-in portable terminal unit, e.g. generally as in FIG. 23, FIG. 26 or FIG. 27. (At col. 49, line 10, "C/B" should read —C/8—; see application U.S. Ser. No. 612,588 filed May 21, 1984, page 76, line 12.)

In the interest of supplying further exemplary detail concerning battery conditioning operation, flowcharts, timing diagrams and an exemplary lookup table, suitable for the processor of a portable terminal unit such as processor 14 of FIGS. 1–12, or of 18-10, FIG. 18, or of 26-40, FIG. 26, or of FIG. 27, and also suitable for a central processor such a 21-71, FIG. 23, are shown in APPENDIX B hereto (pages B1 to B10 following the ABSTRACT OF THE DISCLOSURE). This information was generated for the battery processor 140, FIG. 9B, but was not originally included since it was not considered to be required for practicing this mode of the invention.

Figure 1:
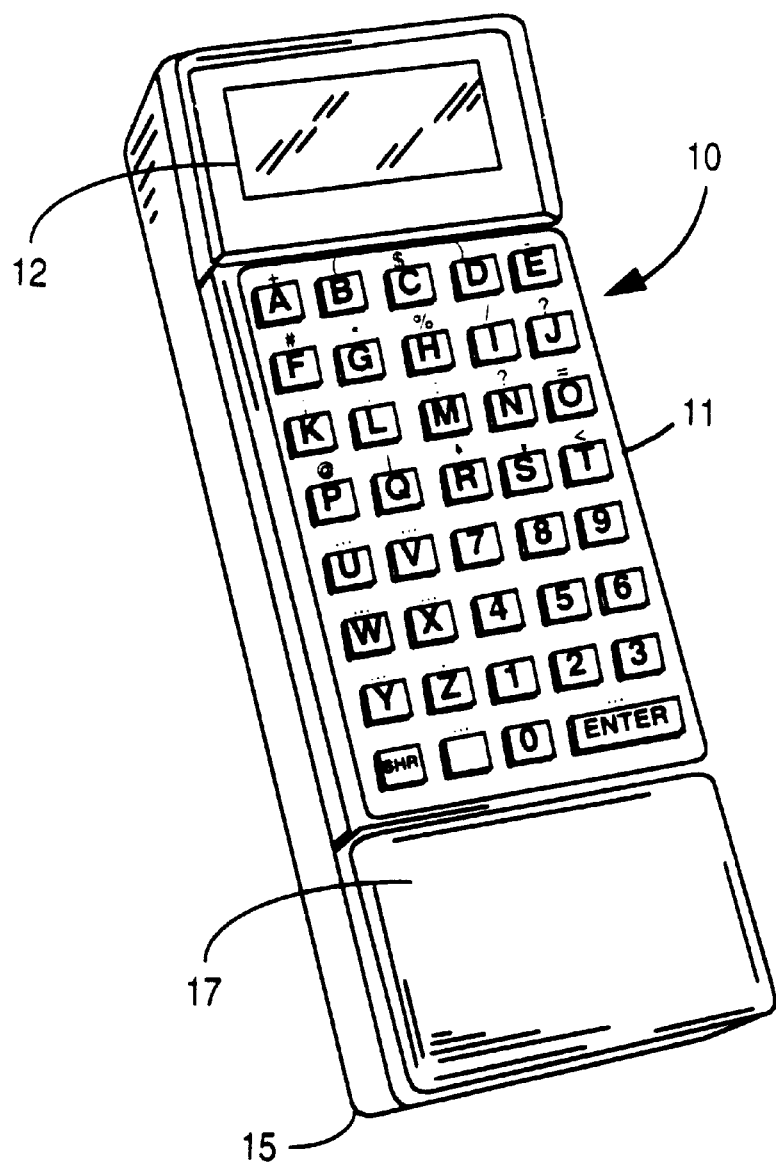
FIG. 1 is a somewhat diagrammatic perspective view of a portable battery powered device which may incorporate a battery system in accordance with the teachings and principles of the present invention.
Figure 2:
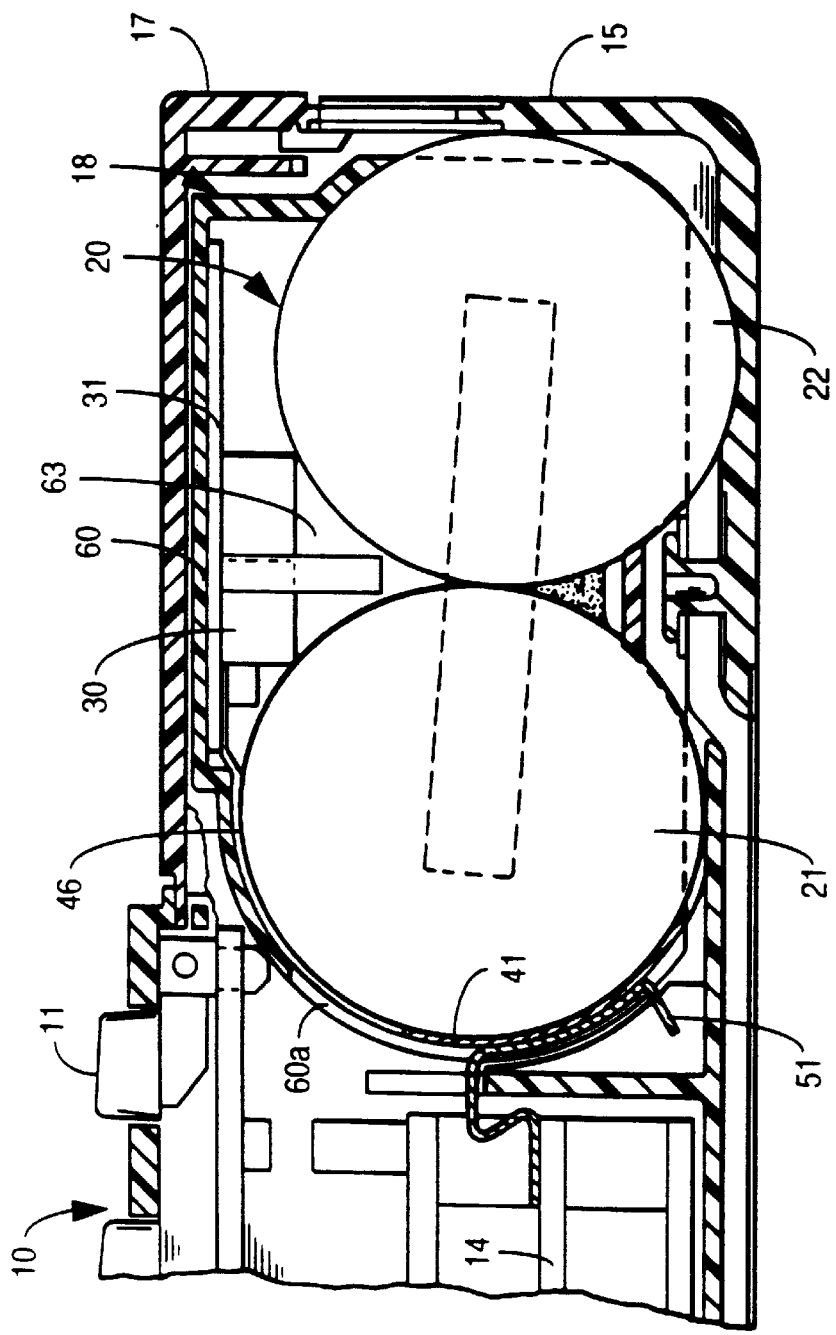
FIG. 2 is a somewhat diagrammatic enlarged longitudinal sectional view showing the battery compartment section and adjacent portions of the portable device of FIG. 1, with a battery pack assembly disposed in the battery compartment in operative coupling relationship with a central processing unit of the portable device for purposes of power supply to the central processing unit and for purposes of transmission of data and command signals.
Figure 3:
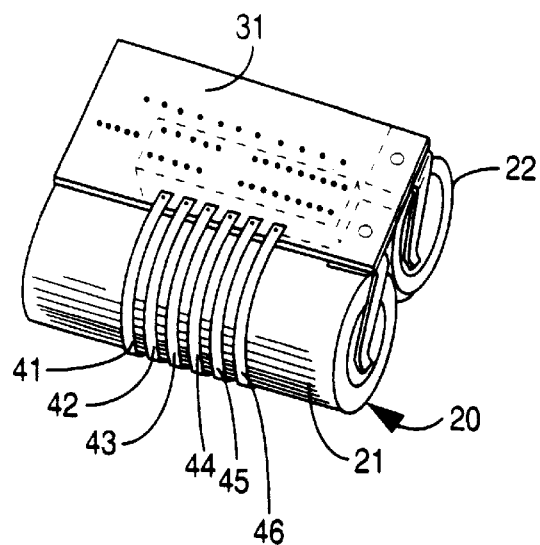
FIG. 3 is a somewhat diagrammatic perspective view of a battery system in accordance with the teaching and principles of the present invention.
Figure 4:
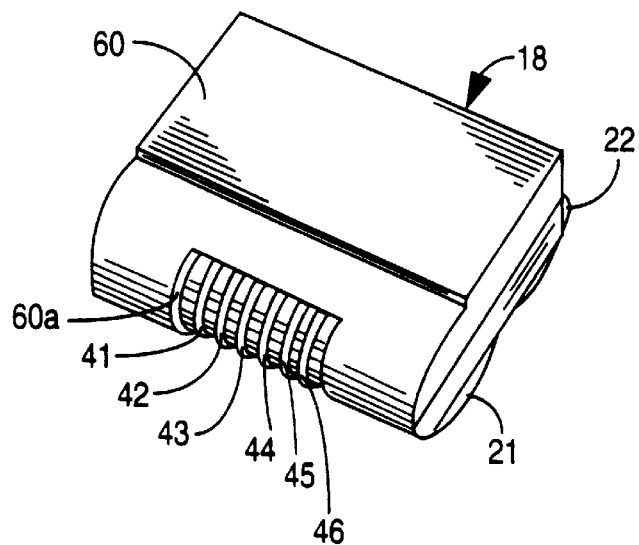
FIG. 4 is a perspective view similar to FIG. 3 but illustrating the battery system enclosed in a protective casing, to form a complete battery pack assembly for insertion into the battery compartment of the portable device, as a unit.
Figure 28:
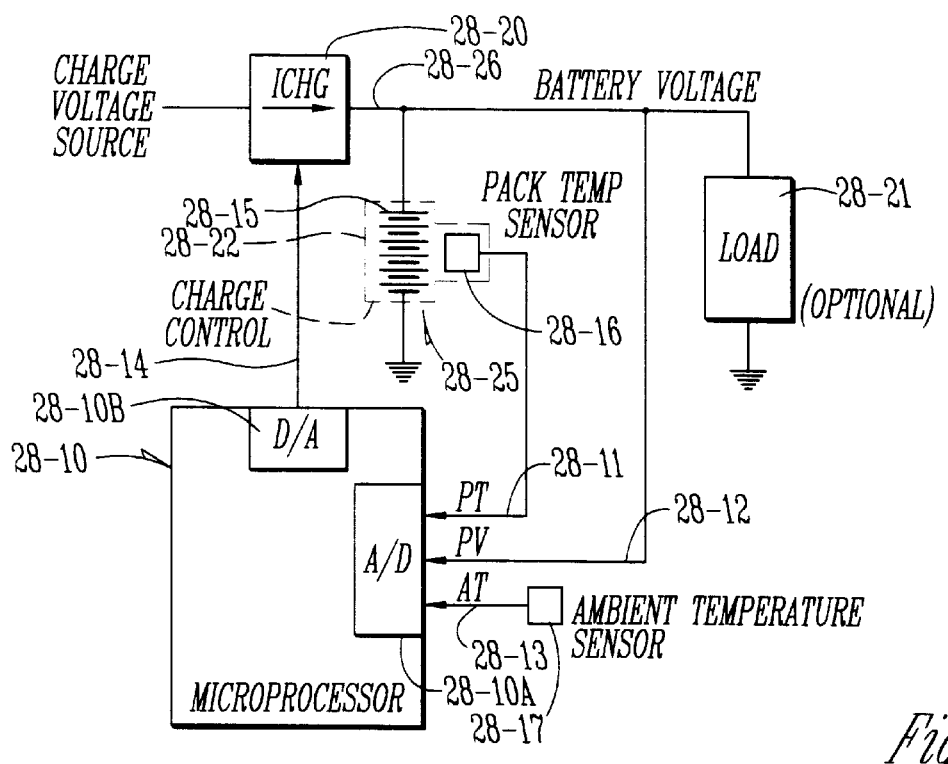
FIG. 28' depicts the electrical circuit arrangement of an exemplary battery pack having memory.
Figure 28:
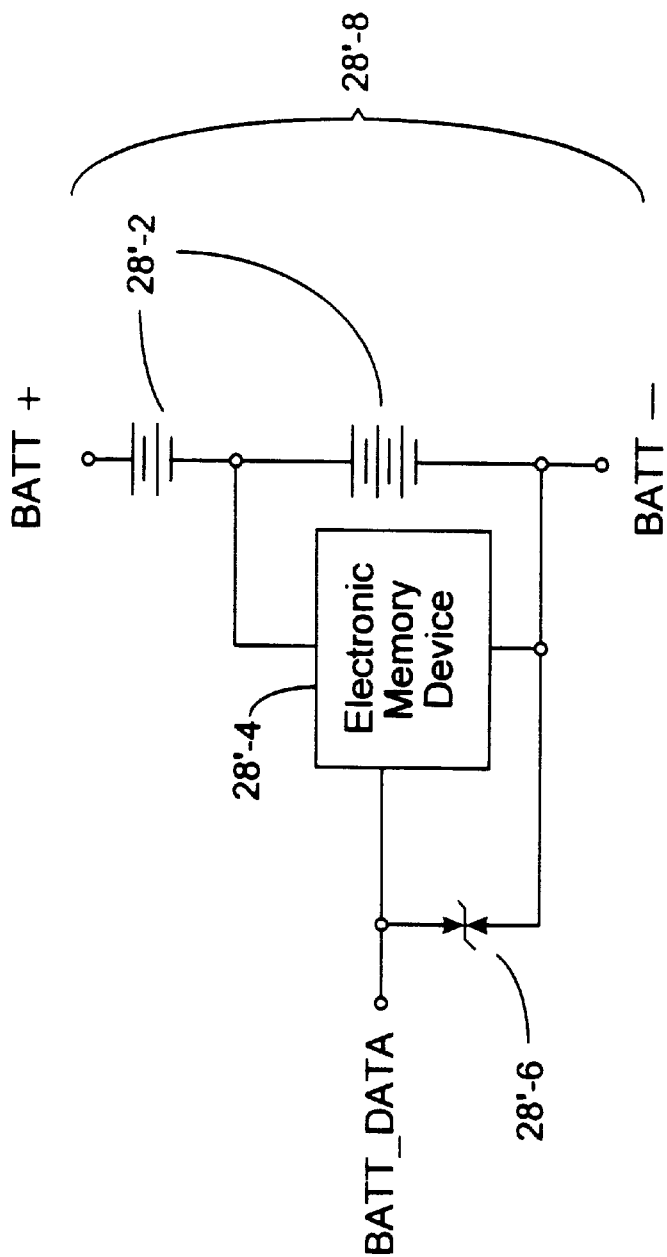

It will be apparent that the various modifications and features previously mentioned can be incorporated with one or more features of FIGS. 18, 19, 20A, 20B, and 21-27. For example, the system of FIGS. 18–22 or 25 may form a part of a stationary battery charging system which removably receives spare battery packs, and/or which removably receives hand-held units such as shown in FIG. 1. The processor means 18-10 or 25-10 as the main processor of a hand-held terminal unit may measure actual battery discharge current during use of the hand-held unit and then control the duration of recharging according to such measure, and/or according to rated battery capacity as stored in a read only memory of the main processor, or the like. FIG. 28' illustrates a circuit arrangement of an exemplary data pack having memory 28'-8 in accordance with one embodiment of the present invention. A number of electrochemical cells 28'-2 are arranged in series to provide a predetermined voltage for powering a particular utilization device (not shown). In a preferred embodiment the electrochemical cells 28'-2 are nickel-metal hydride cells of the type generally used for portable electronic equipment. Alternatively, the electrochemical cells may be nickel-cadmium cells, lithium-ion cells, or the like. In a preferred embodiment, five cells may be electrically arranged in series resulting in a positive battery voltage terminal BATT+ and a negative battery voltage terminal BATT−.

An electronic memory device 28'-4 receives power from the electrochemical cells. The electronic memory device 28'-4 is capable of storing information of the particular history of the battery pack 28'-8 which may be later retrieved and acted upon accordingly by a utilization device. The electronic memory device 28'-4 may store identification information such as manufacturer, date of manufacture, date of sale, serial number, type of electrochemical cells, chain of title from manufacturer to buyer, etc. for tagging and identifying that individual battery pack 28'-8. Such information may be useful for example to trace the origin of defects or to determine the age of the battery pack, for example. Information as to the actual charging and discharging characteristics of the battery pack 28'-8 may also be stored for determining the amount of available capacity remaining in the battery pack 28'-8 or for optimizing recharging algorithms. The battery pack 28'-8 history may include information such as maximum available capacity, remaining capacity, the total number of charge/discharge cycles the battery pack 28'-8 has experienced, the number of charge/discharge cycles since a conditioning cycle, particular charge/discharge characteristics of the battery pack 28'-8, battery temperature, or the like. The actual physical characteristics of the electrochemical cells may thus be monitored and stored in the electronic memory device and retrieved by the utilization device to effectively manage and employ the energy stored in the battery pack 28'-8.

An ideal electronic memory device 28'-4 consumes little or no power, is reliable, and is manufactured in a small package. In a preferred embodiment of the invention the electronic memory device 28'-4 may be a Dallas Semiconductor DS2434 Battery Identification Chip. The DS2434 is manufactured in a 3 lead TO-92 package having two power leads and a 1-wire data interface lead. The DS2434 has 96 bytes of random access memory (RAM) and 32 bytes of nonvolatile EEPROM memory available for battery storage, includes a digital temperature sensor, and operates at low power. A utilization device may access the battery pack 28'-8 data stored in the electronic memory device through the 1-wire interface at communications line BATT_DATA.

Operational power of the electronic memory device 28'-4 may be supplied by the electrochemical cells 28'-2 when the battery pack 28'-8 is charged or by an external power source during charging. The nonvolatile memory of the electronic memory device 28'-4 allows for retention of stored data in the event that the battery pack 28'-8 is completely depleted. The electronic memory device 28'-8 may be powered by fewer than the total number of electrochemical cells 28'-2 in the battery pack 28'-8 when the total series voltage from the entirety of the electrochemical cells 28'-2 exceeds the maximum operating voltage of the electronic memory device. In an exemplary embodiment employing five nickel-metal hydride electrochemical cells 28'-2 the electronic memory device 28'-6 may be powered by three of the electrochemical cells 28'-2 by tapping an intermediate voltage point in the battery pack 28'-8.

A voltage clamping component 28'-6 may be utilized to protect the memory device 28'-6 from accidental loss of stored memory states due to electrostatic discharge. For example an operator may touch communications terminal BATT_DATA during installation of the battery pack 28'-8 into a utilization device and inadvertently apply an electrostatic discharge through the communications terminal BATT_DATA to the electronic memory device 28'-4 thereby destroying the stored memory states and causing a loss of the stored battery pack 28'-8 data. The voltage clamping component 28'-6 may be an AVX Transguard type component connected between communications line BATT_DATA and negative terminal BATT– of the battery pack 28'-8 which is typically a ground reference. The voltage clamping component 28'-6 clamps any high voltage transient occurring at the BATT_DATA terminal in order to prevent damage to the electronic memory device 28'-4.

Figure 29A:
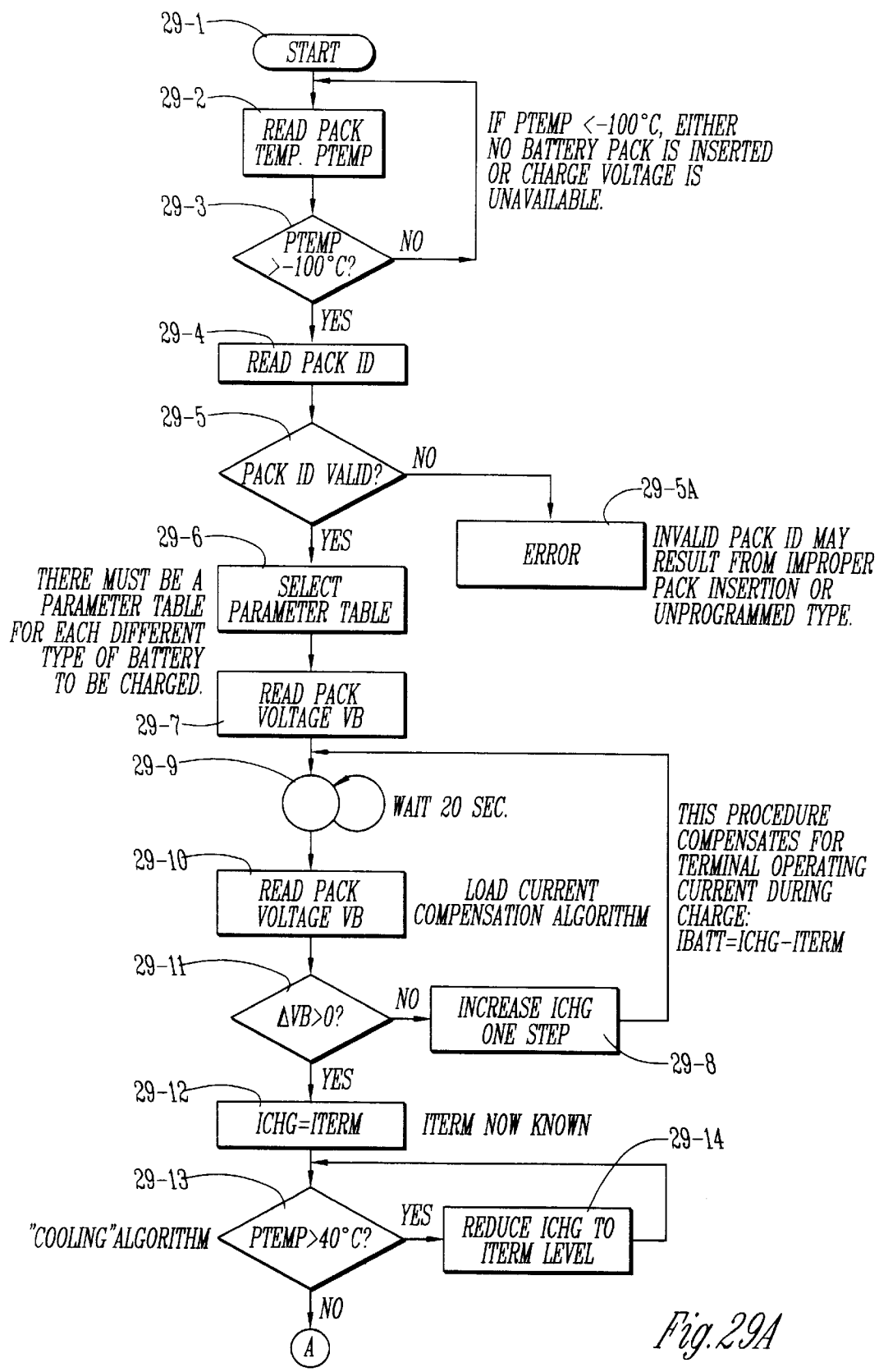
FIGS. 29A and 29B show a flow chart for illustrating a preferred fast charging algorithm for use with the microprocessor of FIG. 28.
Figure 29B:
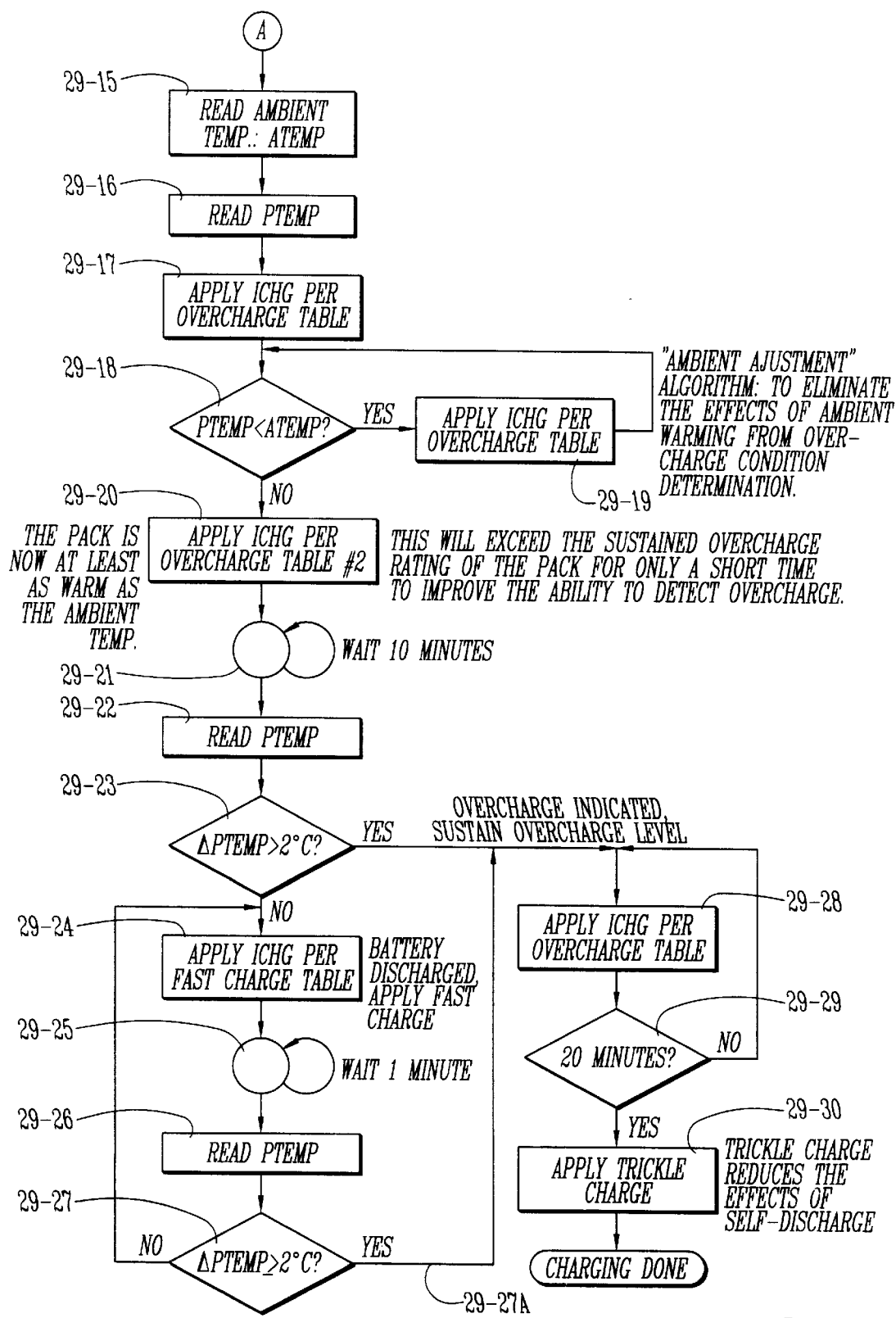
Figure 29:
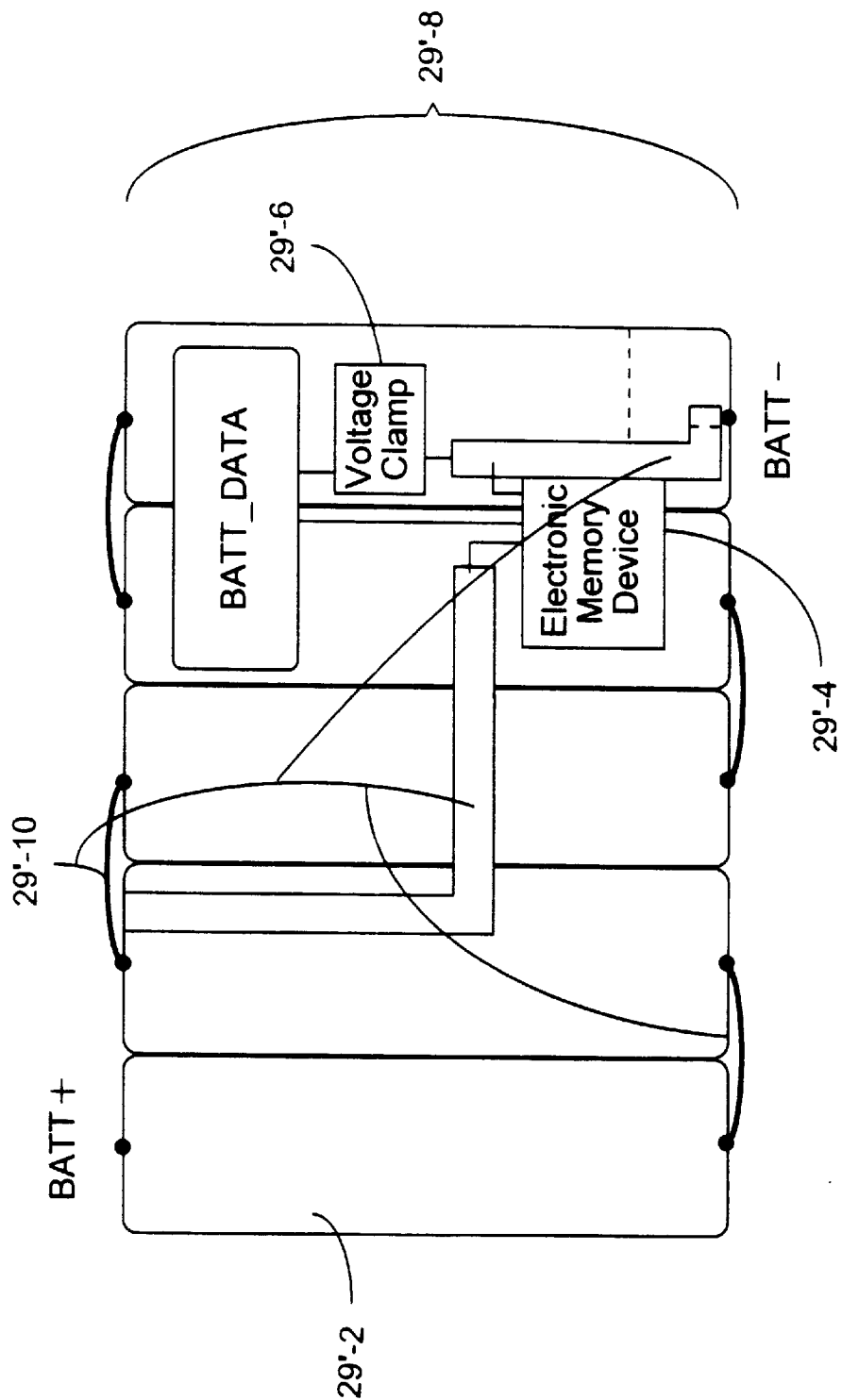
FIG. 29' shows a physical arrangement of the components of the battery pack having memory in an exemplary manufacture of the invention.

FIG. 29' depicts a physical configuration of the battery pack 28'-8 as manufactured. The battery pack 28'-8 may be assembled using the process normally employed to assemble rechargeable battery packs wherein thin metal straps 29'-10 are spot welded to the electrochemical cells 29'-2 to interconnect the electrochemical cells 29'-2. Using standard battery pack assembly techniques provides reliable low impedance and low cost connections within the battery pack 29'-8. No circuit board nor any other components which may increase manufacture costs and reduce the reliability of the connections are needed to assemble the battery pack 29'-8.

Communications line BATT_DATA requires a large area contact pad as shown in FIG. 29' for optimum signal integrity. The straps 29'-10 may be comprised of individual pieces of metal and may be placed on an insulating substrate to hold them in the proper orientation for assembly. Metal pieces 29'-10 may be formed by chemical etching from a single sheet of material which may consist of a traditional flexible circuit or an equivalent thereof.

The spot welding process may be a possible source of damage to the electronic memory device 29'-4 due to the application of a potentially damaging high voltage on the pins of the electronic memory device 29'-4 by the spot welder. The potentially damaging effects of spot welding to the electronic memory device 29'-4 may be mitigated or eliminated by assembling the voltage clamping 29'-6 device to the battery pack 29'-8 assembly prior to attaching the electronic memory device. The electronic memory device 29'-4 and the voltage clamping component 29'-6 may be affixed to metal conductors 29'-10 using a traditional electrical connection technique such as soldering before the spot weld is applied. Once the electronic component 29'-4 and the voltage clamping device 29'-6 are affixed to metal conductors 29'-10, metal conductors 29'-10 may be mechanically clamped to a low electrical potential point such that no damaging voltage will be applied to the pins of the electronic memory device.

DESCRIPTION OF FIGS. 28–32

A block diagram of the charging system is shown in FIG. 28. A microprocessor 28-10 is preferably of a type that has analog to digital inputs such as 28-11 to 28-13 and digital to analog outputs such as 28-14 for interface to sensor and control-functions. Both the temperature of battery 28-15 and ambient temperature are sensed as indicated at 28-16 and 28-17 so that absolute and relative temperature measurements may be made. The terminal voltage of the battery pack is sensed as indicated at 28-12 so that charge trends may be determined. The charge regulator consists of a voltage controlled current source 28-20 whose output current (Ichg) is controlled by the level of the charge control signal at 28-14 from the microprocessor. A load 28-21 may or may not be connected during charge.

In the microprocessor 28-10, analog to digital (A/D) means and digital to analog (D/A) means are indicated at 28-10A and 28-10B. Preferably these means are integrated with the other components of the microprocessor as part of a monolithic unit or "chip" formed from a unitary substrate of semiconductor material.

With a charging system as shown in FIG. 28, an algorithm has been developed for fast charging of NiCad batteries as shown in FIGS. 29A and 29B. The charging function is initiated as represented by "start" at 29-1 e.g. by placing the battery 28-15 in the charger. The temperature sensor 28-16 is preferably in a housing 28-22 which together with battery 28-15 forms the battery pack 28-25. The sensor 28-16 is preferably of the type whose output is proportional to absolute temperature e.g. at the rate of ten millivolts per degree Kelvin (10 mv/° K.). The microprocessor 28-10 tests for insertion of the battery in the charger by reading the temperature Ptemp as indicated at 29-2, and checking to determine if Ptemp shows a temperature greater than –100° C.; see decision block 29-3. The decision at block 29-3 will be affirmative only if a battery pack has been inserted to provide a non-zero voltage on the Ptemp signal line 28-11.

Figure 30:
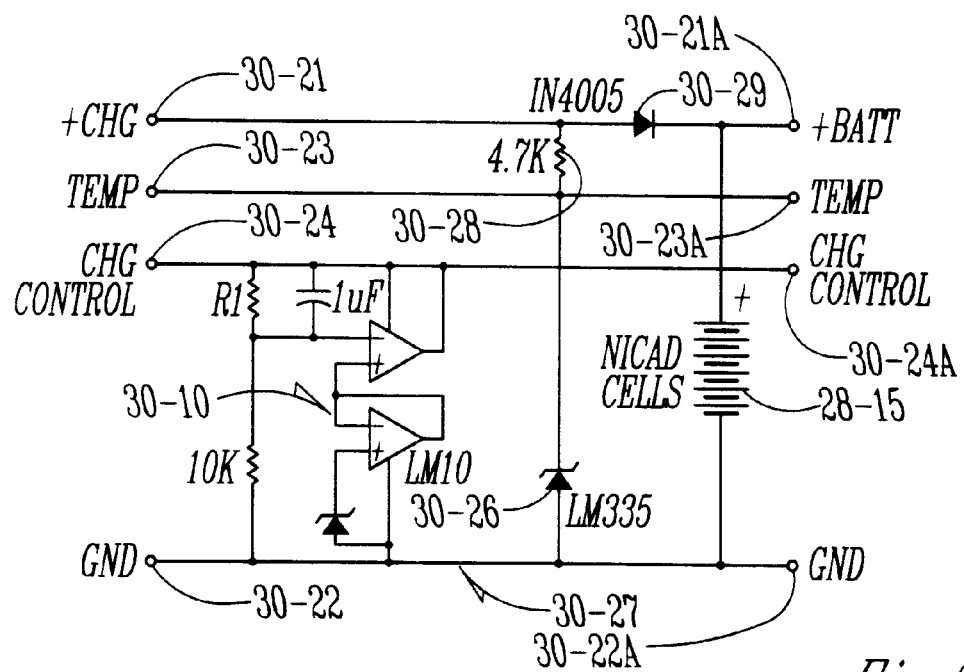
FIG. 30 is a circuit diagram illustrating a preferred arrangement for the automatic identification of various types of batteries which may be associated with a fast charging system according to FIGS. 28 and 29.

Following determination of the presence of a battery pack 28-25 in the charger, the pack type must be identified as represented at 29-4 and 29-5 to allow for cells with different charge characteristics. In the case of an invalid reading of battery pack identity, the program may branch to an error subroutine as indicated at 29-5A. The identification of the type of battery inserted into the charger is a significant step in the battery processing operation since battery cells of specialized types may offer significantly higher capacity than ordinary NiCad cells, but they may require charging at lower maximum rates. Other cells may allow high charging rates at extreme temperatures. Future technology developments may offer new cell types with unusual charging parameters that may be accommodated by applying an appropriate charging algorithm. As shown in FIG. 30, a proposed method for identification of the pack type is to connect a shunt voltage regulator 30-10 to the battery pack 30-27 represented in FIG. 30. The shunt regulator may consist of a simple zener diode or it may be implemented with an active regulator e.g. as indicated in FIG. 30, depending on the number of different pack types that must be identified. Upon determination of the pack type a suitable one of a set of parameter tables may be selected that contains the appropriate values for charging the specified cell type, as shown at 29-6.

Figure 31:
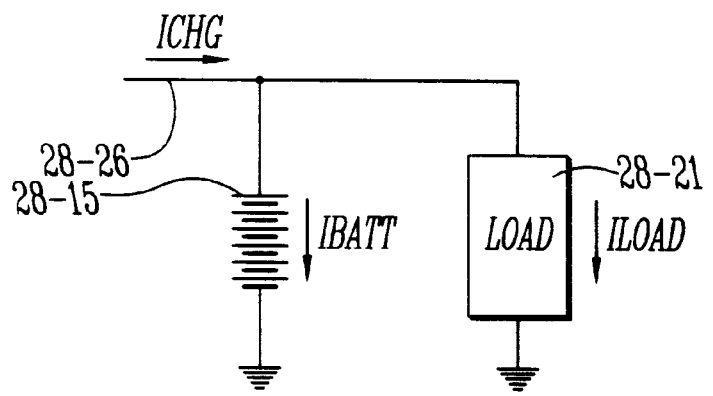
FIG. 31 is a diagram useful in explaining certain steps of the flow chart of FIG. 29.

As indicated in FIG. 28, there may be a load 28-21 placed on the battery that requires current. Consequently, current supplied by a charger is shared by the load and the battery as shown in FIG. 31. If the load current Iload is larger than the charge current Ichg, the battery will provide the difference, resulting in further discharge of the battery rather than charging. To compensate for this effect, the algorithm senses the terminal voltage (Vh) of the battery (step 29-7, FIG. 29) and applies increasing charge current to the battery in small increments (step 29-8) until the terminal voltage trend is positive (steps 29-9 to 29-11) meaning the battery is accepting charge rather than providing current to a load (see block 29-12).

While the absolute terminal voltage of a NiCad battery is a poor indicator of its condition, its trend is a good indicator of charging versus discharging if it is measured over a short enough time that the pack temperature remains relatively constant. Once the battery voltage trend is determined to be positive, the level of current required by the load (Iterm of block 29-12 corresponding to Iload, FIG. 31) is known, and may be added to the desired net battery current level (Ibatt, FIG. 31) to select the actual charge current (Ichg, FIG. 31).

Typical NiCad cell specifications call for charging in a temperature range of 0° to 40° C. Many of the products that utilize NiCad batteries may operate in environments with temperatures that range from −30° C. to 60° C. Consequently, it is possible that a battery pack may be placed in a charger immediately after being removed from either of these temperature extremes. If the pack temperature is greater than 40° C., (see decision step 29-13), the pack must be "cooled" to no more than 40° C. before charging may proceed. This is accomplished (as shown by step 29-14) by applying a charge current Ichg that equals the terminal load Iterm so that no net charge current is received by the battery and it may be by the ambient environment. If the battery pack is cold, it must be warmed to a temperature above 0° C. This is carried out by steps 29-15 to 29-19. By applying a safe (low) charge current per the charge table of steps 29-17 and 29-19 (and FIG. 33), the pack my be warmed by the ambient environment of the charger.

Figure 35:
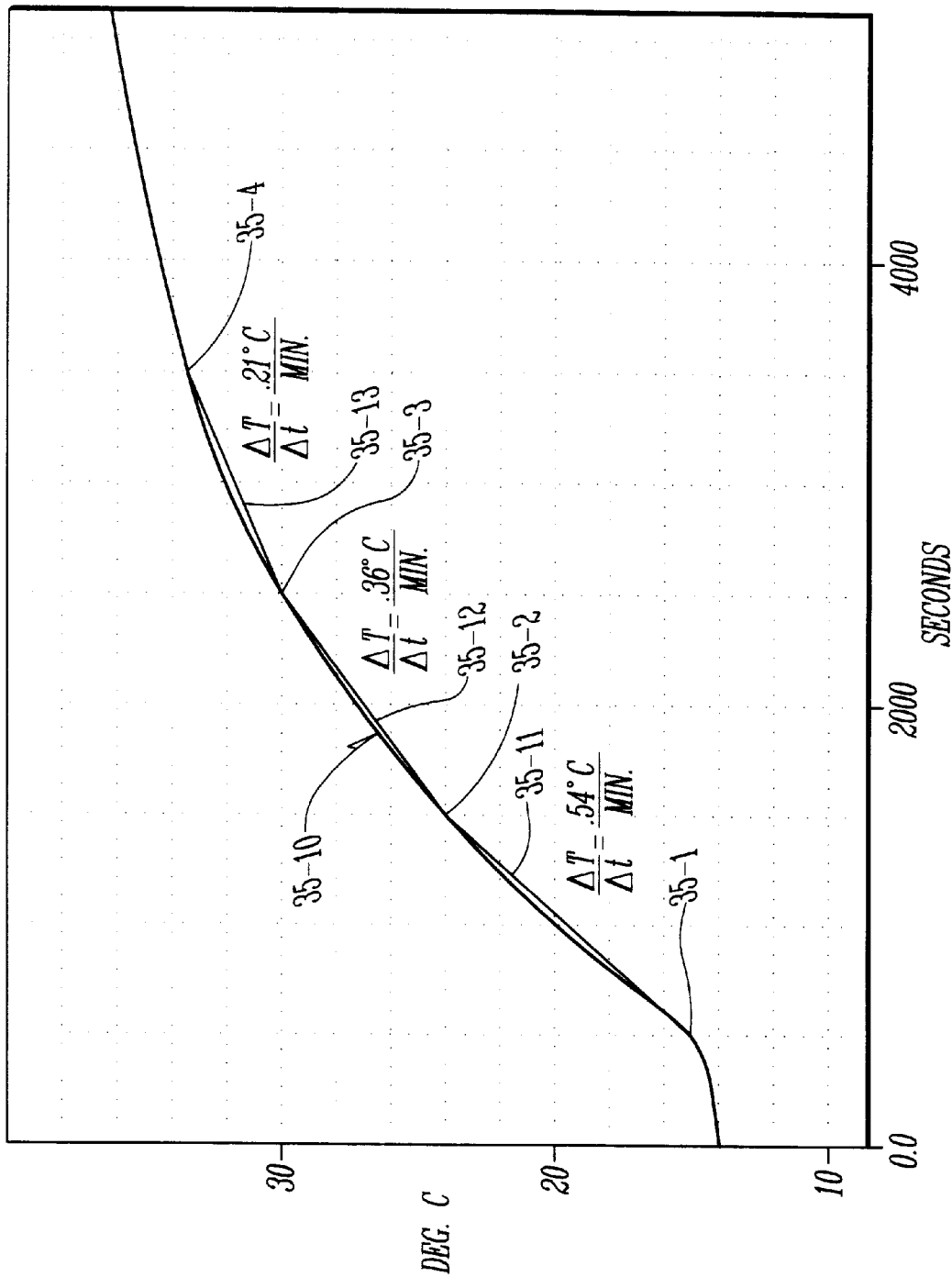
FIG. 35 shows a plot of measured battery pack temperature as a function of time for a previously fully charged enclosed battery pack where an overcharge current (Ichg) of three hundred milliamperes is applied and the ambient temperature $T_A$ is about fourteen degrees Celsius (14° C.) and also illustrates successive approximate slope values for selected successive time intervals.

Although charging may begin when the battery temperature exceeds 0° C. according to the battery charging specifications, additional information is needed to determine the state of charge of the battery. The clearest method to determine whether a battery is fully charged is to detect the presence of the overcharge condition. In overcharge, the oxygen recombination reaction is highly exothermic which results in rapid heating of the battery. By applying twice the permissible substained overcharge rate as at steps 29-20 to 29-23 and monitoring cell temperature, it is possible to reliably determine that the overcharge condition has been reached. Unfortunately, when a cold pack is placed in a warm environment, there is a resultant temperature rise due to ambient warming that can actually occur at a rate faster than the heating due to the supply of a high value of overcharge current. Consequently, the only reliable means of detecting heating due to overcharge current is first insure that the battery temperature is not substantially less than the ambient temperature (as determined by step 29-18). Once the battery is warmed to ambient temperature, the overcharge condition can be quickly detected by means of steps 29-20 to 29-23 since any further substantial increase in temperature can be attributed to internal heat being evolved by the battery. If the pack has been in a hot environment, the cooling (steps 29-13 and 29-14) will bring its temperature down to no more than 40° C., which is above the ambient temperature of the charger. Overcharge induced heating will cause the pack temperature to begin to increase again as shown by FIG. 35. According to the described algorithm, the charge current applied to the battery for overcharge detection (step 29-20) is double the standard overcharge table value of steps 29-17, 29-19 and 29-28 (and of FIG. 33) to improve the ability to detect a temperature increase. Since the test time is relatively short, little gas pressure increase and potential for cell venting is involved.

Once it has been determined that the battery is not in the overcharge condition (at decision block 29-23), it is a relatively simple matter to apply the appropriate charge value from the fast charge parameter table (as at step 29-24, FIG. 29). The fast charge table value may correspond to that indicated in FIG. 34 and is a function of temperature so that a temperature regulation capability is implemented for reducing the current applied at elevated temperatures. During the fast charge operation, battery temperature increase is closely monitored (steps 29-25 to 29-27) to determine when overcharge has been reached, so that the fast charge cycle may be terminated (as represented by branch line 29-27a) and a controlled temperature overcharge cycle may be initiated as represented by step 29-28 and FIG. 33 to "top-off" the battery for maximum capacity. After the overcharge cycle is complete (after step 29-29), a trickle charge current is applied per step 29-30 to maintain the full battery capacity and offset the effects of self-discharge normally seen when a battery rests in an idle condition.

Figure 32A:
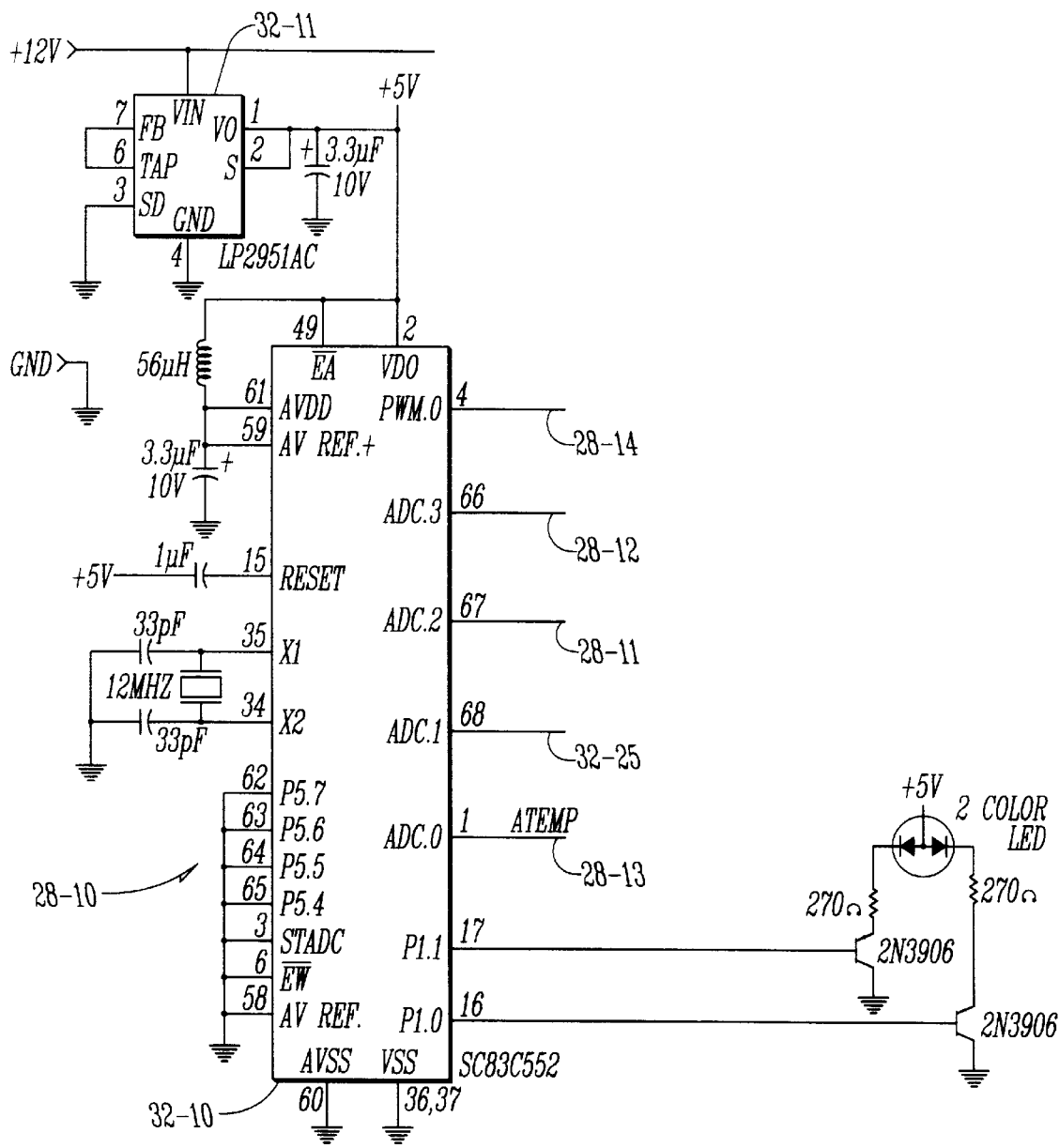
FIGS. 32A and 32B are a circuit diagram for illustrating an exemplary implementation of the block diagram of FIG. 28.
Figure 32B:
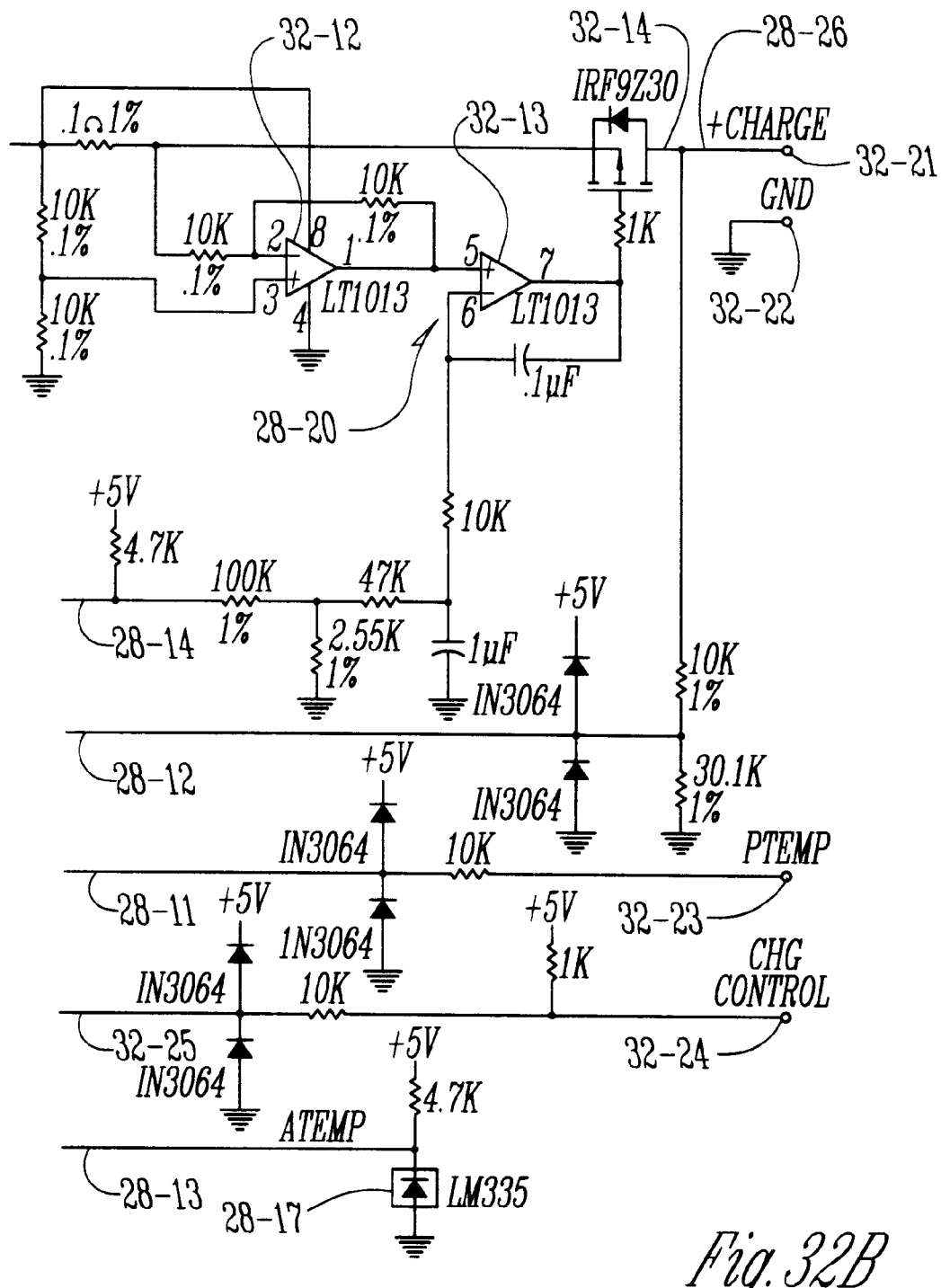

FIG. 32 shows a preferred embodiment of the described fast charging system utilizing a microprocessor system with a programmed algorithm for fast charging of battery packs. Other embodiments involving control circuits contained within a data terminal or other utilization device may employ identical algorithms without departing from the concepts described.

FIG. 32 represents an implementation of FIG. 28, and corresponding reference numerals have been applied in FIG. 32 so as to facilitate correlation therewith. The major components of FIG. 32 may comprise commercially available parts which are identified as follows:

microprocessor chip 32-10 of microprocessor system 28-10, type SC83C552
voltage regulator 32-11, type LP2951AC amplifiers 28-12 and 28-13 of charge regulator 28-20, type LT1013 transistor 32, type 1RF9Z30 temperature sensor 28-17, type LM335

The programming for microprocessor element 32-10 of FIG. 32 may correspond with that represented in FIGS. 29, 33 and 34, as described with reference to these figures and the circuits of FIGS. 28, 30 and 31. By way of example, terminals 32-21, 32-22, 32-23 and 32-24, FIG. 32, may be connected with terminals 30-21, 30-22, 30-23 and 30-24 respectively in FIG. 30. Temperature sensor 30-26, FIG. 30, which is connected between terminals 30-22 and 30-23, may correspond with sensor 28-16 and may be mounted in intimate heat transfer relation with battery 28-15 and within the housing of the battery pack 28-25 as represented in FIG. 28. Resistor R1, FIG. 30, has a respective one of a set of values so as to provide a voltage level between terminals 30-22 and 30-24 selected so as to identify the particular type of battery pack 30-27 with which it is associated.

Terminals 30-21A, 30-22A, 30-23A and 30-24A may be connected with a utilization circuit to supply energy thereto during portable operation. It will be noted that the battery pack 30-27 can be associated with the circuitry of FIGS. 16A and 16B hereof (corresponding to FIGS. 16A and 16B of incorporated U.S. Pat. No. 4,709,202), terminals 30-21A and 30-22A having a quick-release connection with terminals JP-1, JP-2, FIG. 16B, and terminals 30-23A having a quick-release coupling with terminal J7-3, FIG. 16B. Terminal 30-24A can be used by the portable device to identify the battery pack, where the portable device provides a circuit such as associated with terminal 32-24, FIG. 32, leading to an analog to digital input such as 32-25, FIG. 32.

FIG. 35 illustrates by a plot 35-10 the increase in temperature as a function of time of an enclosed battery pack such as 27-10B, FIG. 27, 28-25, FIG. 28 or 30-27, FIG. 30, due to an overcharge current of 300 milliamperes, where the battery means 27-27, 28-15 is initially fully charged and is at a battery temperature of about minus eight degrees Celsius, the ambient temperature being about fourteen degrees Celsius. The slopes between successive points 35-1, 35-2, 35-3 and 35-4, are represented by straight line segments 35-11, 35-12 and 35-13, with respective slope values of 0.54 degrees Celsius per minute, 0.36 degrees Celsius per minute and 0.21 degrees Celsius per minute.

Figure 36:
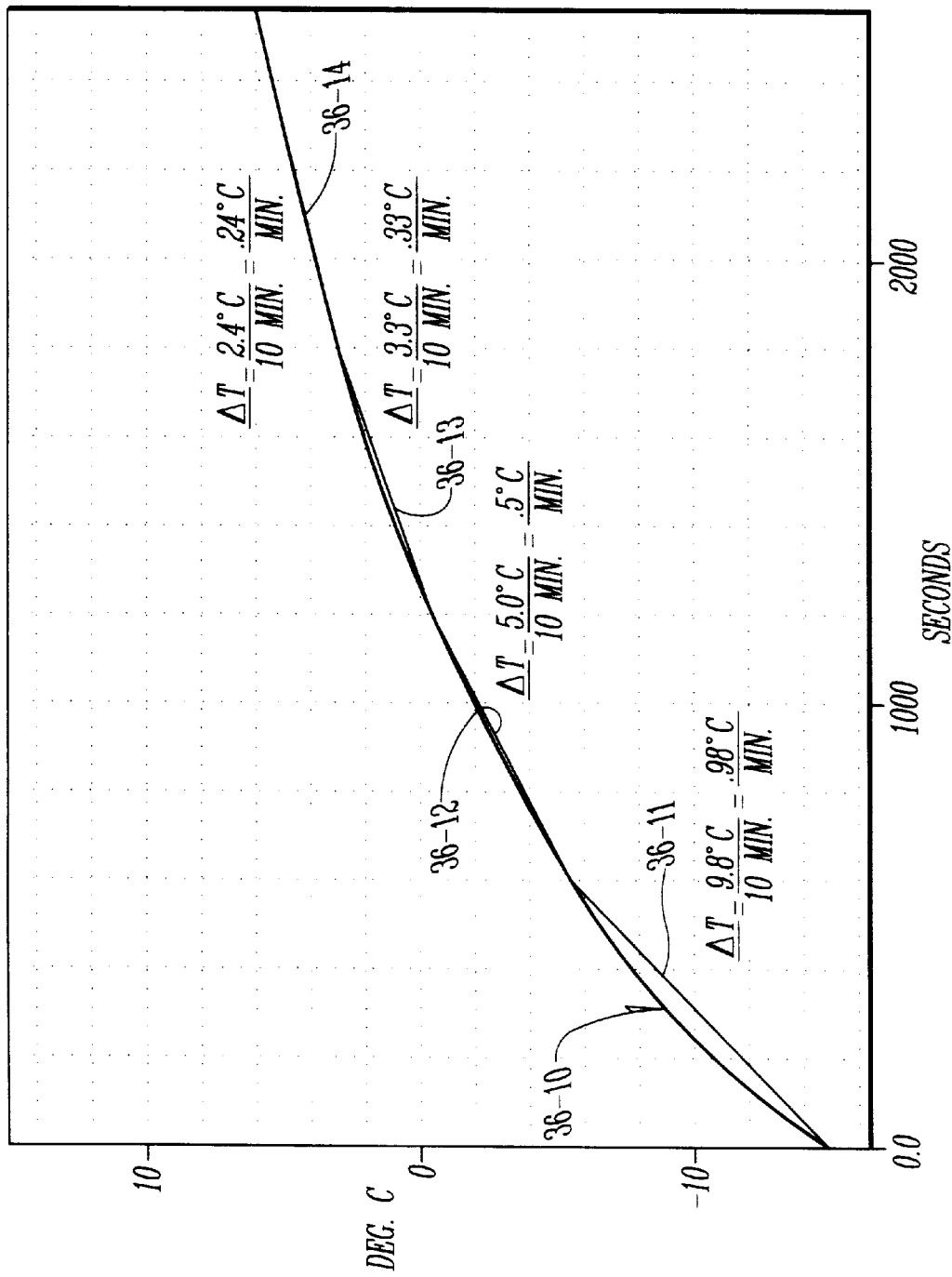
FIG. 36 is a plot of measured battery pack temperature as a function of time for the case of an enclosed battery pack which is initially at a much lower temperature than ambient temperature; specifically the battery pack was initially at a temperature of about minus fifteen degrees Celsius (−15° C.) while the ambient temperature was about twenty degrees Celsius (20° C.), the battery pack receiving only a small charging current of six milliamperes.

FIG. 36 for the sake of comparison shows by a curve 36-10 the rate of warming of such a battery pack due to an ambient temperature which is substantially higher than battery temperature. Specifically FIG. 36 shows the case where initial battery temperature is about minus fifteen degrees Celsius and ambient temperature is about twenty degrees Celsius. Straight line segments 36-11, 36-12, 36-13, 36-14 show approximate slope values of 0.98 degrees Celsius per minute, 0.5 degrees Celsius per minute, 0.33 degrees Celsius per minute and 0.24 degrees Celsius per minute. The relatively high slope values indicate that the differential between a high ambient temperature and a low battery temperature must be taken into account when using steps 29-20 to 29-23 to determine whether a battery is in the overcharge range.

DISCUSSION OF FIGS. 33 THROUGH 36 AND TABLES I AND II

Figure 33:
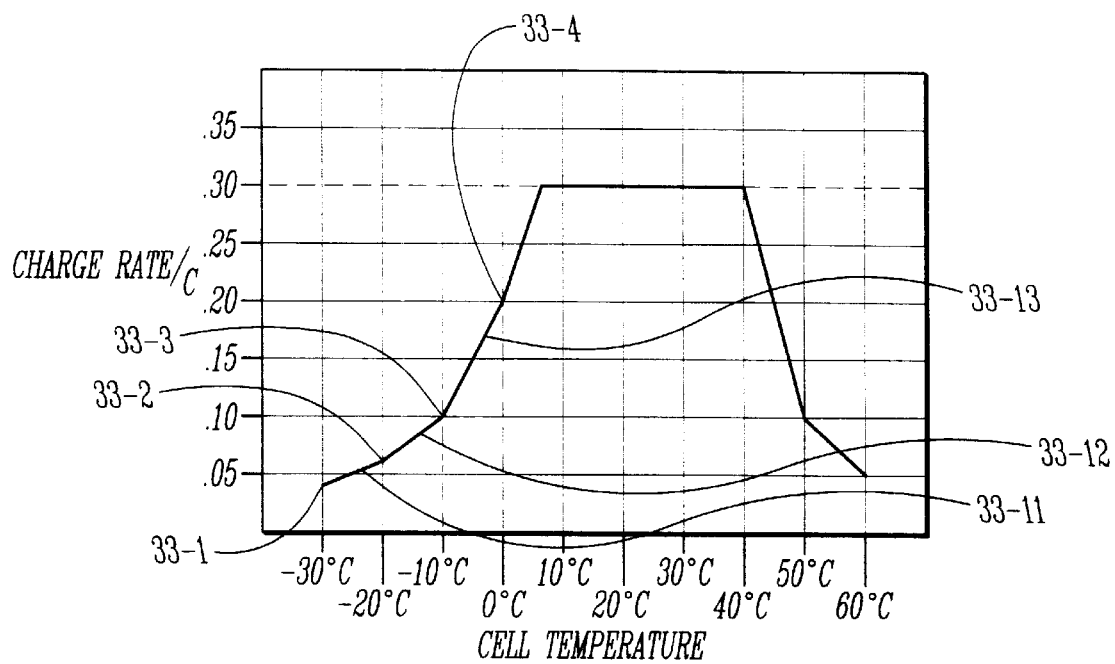
FIG. 33 illustrates a plot showing a maximum permissible overcharge rate for fast charge cells as a function of cell temperature, and provides information which may be incorporated in the programming of the system of FIGS. 28–32 for establishing an optimum value of charging current (Ichg) during sustained overcharging.
Figure 34:
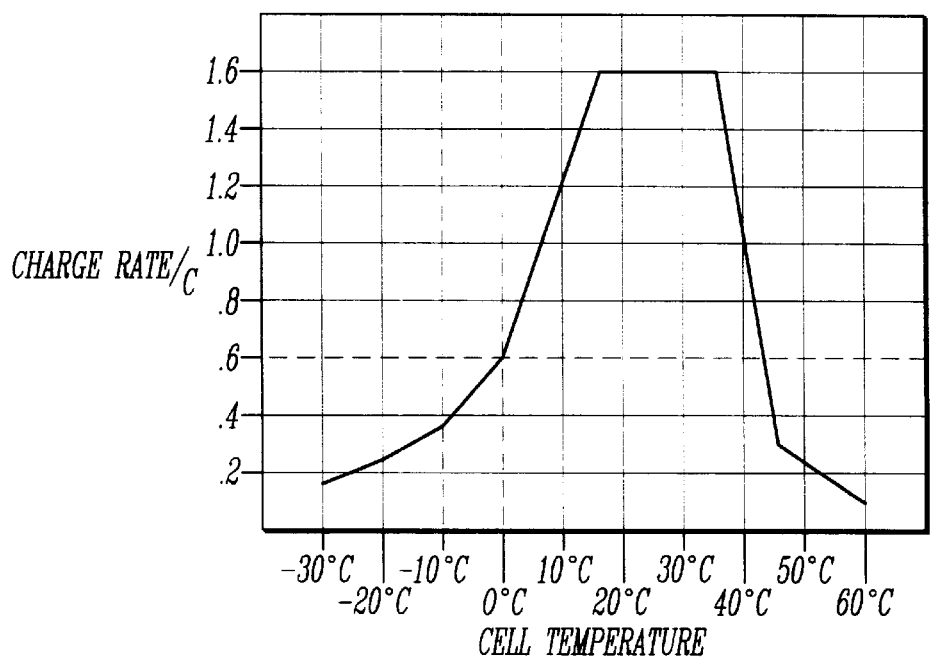
FIG. 34 illustrates a plot of maximum charge rate for fast charge cells as a function of cell temperature to show exemplary data which may be used for the system programming FIGS. 28–32 for establishing an optimum value of charging current for a battery which has not yet reached the overcharge state.

FIGS. 33 and 34 represent in effect a series of tables of charge rate versus temperature since the ordinate values are in units of charge rate (e.g. current Ibatt in milliamperes divided by capacity C in milliampere-hours). The following TABLES I and II give values of overcharge and fast charge corresponding to FIGS. 33 and 34 for successive temperatures in increments of two degrees Celsius, and give corresponding current values milliamperes for two different values of battery capacity C, namely C equals 800 milliampere-hours and C equals 1200 milliampere hours.

TABLE I

Charge Table: Overcharge and Fast Charge
Battery type: 800 ma-hr fast charge

| Temp, °C. | Overcharge value | | Fast Charge value | |
|---|---|---|---|---|
| | C. units | ma. | C. units | ma. |
| −30 | 0.040 | 32 | 0.160 | 128 |
| −28 | 0.044 | 35 | 0.176 | 141 |
| −26 | 0.048 | 38 | 0.192 | 154 |
| −24 | 0.052 | 42 | 0.208 | 166 |
| −22 | 0.056 | 45 | 0.224 | 179 |
| −20 | 0.060 | 48 | 0.240 | 192 |
| −18 | 0.068 | 54 | 0.264 | 211 |
| −16 | 0.076 | 61 | 0.288 | 230 |
| −14 | 0.084 | 67 | 0.312 | 250 |
| −12 | 0.092 | 74 | 0.336 | 269 |
| −10 | 0.100 | 80 | 0.360 | 248 |
| −8 | 0.120 | 96 | 0.408 | 326 |
| −6 | 0.140 | 112 | 0.456 | 365 |
| −4 | 0.160 | 128 | 0.504 | 403 |
| −2 | 0.180 | 144 | 0.552 | 442 |
| 0 | 0.200 | 160 | 0.600 | 480 |
| 2 | 0.220 | 176 | 0.742 | 594 |
| 4 | 0.240 | 192 | 0.886 | 709 |
| 6 | 0.260 | 208 | 1.029 | 823 |
| 8 | 0.280 | 224 | 1.171 | 937 |
| 10 | 0.300 | 240 | 1.314 | 1051 |
| 12 | 0.300 | 240 | 1.457 | 1166 |
| 14 | 0.300 | 240 | 1.600 | 1280 |
| 16 | 0.300 | 240 | 1.600 | 1280 |
| 18 | 0.300 | 240 | 1.600 | 1280 |
| 20 | 0.300 | 240 | 1.600 | 1280 |
| 22 | 0.300 | 240 | 1.600 | 1280 |
| 24 | 0.300 | 240 | 1.600 | 1280 |
| 26 | 0.300 | 240 | 1.600 | 1280 |
| 28 | 0.300 | 240 | 1.600 | 1280 |
| 30 | 0.300 | 240 | 1.600 | 1280 |
| 32 | 0.300 | 240 | 1.600 | 1280 |
| 34 | 0.300 | 240 | 1.600 | 1280 |
| 36 | 0.300 | 240 | 1.340 | 1072 |
| 38 | 0.300 | 240 | 1.080 | 864 |
| 40 | 0.300 | 240 | 0.820 | 656 |
| 42 | 0.260 | 208 | 0.560 | 448 |
| 44 | 0.220 | 176 | 0.300 | 240 |
| 46 | 0.180 | 144 | 0.275 | 220 |
| 48 | 0.140 | 112 | 0.250 | 200 |
| 50 | 0.100 | 80 | 0.225 | 180 |
| 52 | 0.090 | 72 | 0.200 | 160 |
| 54 | 0.080 | 64 | 0.175 | 140 |
| 56 | 0.070 | 56 | 0.150 | 120 |
| 58 | 0.060 | 48 | 0.125 | 100 |
| 60 | 0.050 | 40 | 0.100 | 80 |

TABLE II

Charge Table: Overcharge and Fast Charge
Battery type: 1200 ma-hr fast charge

| Temp. °C. | Overcharge value | | Fast Charge value | |
|---|---|---|---|---|
| | C. units | ma. | C. units | ma. |
| −30 | 0.040 | 48 | 0.160 | 192 |
| −28 | 0.044 | 53 | 0.176 | 211 |
| −26 | 0.048 | 58 | 0.192 | 230 |
| −24 | 0.052 | 62 | 0.208 | 250 |
| −22 | 0.056 | 67 | 0.224 | 269 |
| −20 | 0.060 | 72 | 0.240 | 288 |
| −18 | 0.068 | 82 | 0.264 | 317 |
| −16 | 0.076 | 91 | 0.288 | 346 |

TABLE II-continued

Charge Table: Overcharge and Fast Charge
Battery type: 1200 ma-hr fast charge

| Temp. ° C. | Overcharge value | | Fast Charge value | |
|---|---|---|---|---|
| | C. units | ma. | C. units | ma. |
| −14 | 0.084 | 101 | 0.312 | 374 |
| −12 | 0.092 | 110 | 0.336 | 403 |
| −10 | 0.100 | 120 | 0.360 | 432 |
| −8 | 0.120 | 144 | 0.408 | 490 |
| −6 | 0.140 | 168 | 0.456 | 547 |
| −4 | 0.160 | 192 | 0.504 | 605 |
| −2 | 0.180 | 216 | 0.552 | 662 |
| 0 | 0.200 | 240 | 0.600 | 720 |
| 2 | 0.220 | 264 | 0.742 | 890 |
| 4 | 0.240 | 288 | 0.886 | 1063 |
| 6 | 0.260 | 312 | 1.029 | 1280 |
| 8 | 0.280 | 336 | 1.171 | 1280* |
| 10 | 0.300 | 360 | 1.314 | 1280* |
| 12 | 0.300 | 360 | 1.457 | 1280* |
| 14 | 0.300 | 360 | 1.600 | 1280* |
| 16 | 0.300 | 360 | 1.600 | 1280* |
| 18 | 0.300 | 360 | 1.600 | 1280* |
| 20 | 0.300 | 360 | 1.600 | 1280* |
| 22 | 0.300 | 360 | 1.600 | 1280* |
| 24 | 0.300 | 360 | 1.600 | 1280* |
| 26 | 0.300 | 360 | 1.600 | 1280* |
| 28 | 0.300 | 360 | 1.600 | 1280* |
| 30 | 0.300 | 360 | 1.600 | 1280* |
| 32 | 0.300 | 360 | 1.600 | 1280* |
| 34 | 0.300 | 360 | 1.600 | 1280* |
| 36 | 0.300 | 360 | 1.340 | 1280* |
| 38 | 0.300 | 360 | 1.080 | 1280* |
| 40 | 0.300 | 360 | 0.820 | 984 |
| 42 | 0.260 | 312 | 0.560 | 672 |
| 44 | 0.220 | 264 | 0.300 | 360 |
| 46 | 0.180 | 216 | 0.275 | 330 |
| 48 | 0.140 | 168 | 0.250 | 300 |
| 50 | 0.100 | 120 | 0.225 | 270 |
| 52 | 0.090 | 108 | 0.200 | 240 |
| 54 | 0.080 | 96 | 0.175 | 210 |
| 56 | 0.070 | 84 | 0.150 | 180 |
| 58 | 0.060 | 72 | 0.125 | 150 |
| 60 | 0.050 | 60 | 0.100 | 120 |

*note: maximum charge current available is 1280 ma.

TABLES I and II may be stored in machine readable form in the memory of microprocessor system 28-10 or 32-10, e.g. in first and second read only memory segments. Thus if step 29-4 identified an 800 milliampere-hour capacity fast charge nickel-cadmium battery means, the microprocessor would access the first memory segment corresponding to TABLE I for steps such as 29-17, 29-19, 29-20, 29-24 and 29-28, while if step 29-4 showed a 1200 milliampere-hour capacity fast charge nickel-cadmium battery means the second memory segment corresponding to TABLE II would be addressed.

If for example, the battery temperature (Ptemp) in step 29-16 were greater than nineteen degrees Celsius but less than or equal to twenty-one degrees Celsius, the overcharge value read from memory segment I would be 240 milliamperes (0.300 units in FIG. 33 times 800 milliampere-hours, the battery capacity C, equals 240 milliamperes). Thus according to step 29-17 and step 29-19, an overcharge current of 240 milliamperes (plus any needed load current) would be supplied by regulator 28-20 until temperature sensor 28-16 showed that battery temperature exceeded ambient temperature (Atemp, 28-13, FIG. 28).

If ambient temperature were thirty degrees Celsius and the battery temperature were in the range from thirty-one to thirty-three degrees Celsius, a current of 480 amperes would be applied according to step 29-20, but for a limited duration (e.g. about ten minutes per step 29-21) such as to avoid substantial detriment to the useful life of the battery means.

FIG. 36 illustrates warming of the battery pack as a function of time with the battery pack initially at a temperature of about minus fifteen degrees Celsius. From FIG. 33, it can be seen that maximum permissible overcharge current corresponds to about 0.08 units. For a battery capacity of 800 milliampere hours, this would correspond to an overcharge current value of greater than sixty milliamperes, while FIG. 36 shows the warming rate with an ambient temperature of about twenty degrees Celsius and a relatively negligible value of charging current (i. e., Ichg equals six milliamperes). It will be noted that the warming rate in FIG. 36 in the first 600 seconds is 0.98 degrees Celsius per minute which considerably exceeds the warming rate produced by a current of 300 milliamperes in FIG. 35.

SUPPLEMENTARY DISCUSSION OF FIGS. 28–36

For representing an embodiment such as that of FIG. 30, a microprocessor system such as indicated at 28-10 in FIG. 28 would be shown with a fourth input to A/D means 28-10A corresponding with input 32-25, FIG. 32. For such an embodiment each type of battery means such as the one with 800 milliampere-hour capacity and temperature characteristics as shown in Table I, and the one with 1200 ampere-hour capacity and characteristics according to Table II would have a respective distinct value of R1, FIG. 30, and a respective different shunt voltage level so as to enable the microprocessor system 28-10 to reliably identify each of numerous types of battery means pursuant to step 29-4. The microprocessor system 28-10 or 32-10 may store a set of parameter tables such as Tables I and II in machine readable form with each table of such set having an address associated with the corresponding shunt voltage level. In this way the appropriate stored table can be interrogated by the microprocessor in accordance with a given battery temperature reading so as to obtain appropriate current values for steps 29-8, 29-17, 29-19, 29-20, 29-24 and 29-28.

The battery identification means 26-36 or 30-10 would distinguish the presence or absence of an internal current regulator 26-28 as well as identifying the various battery types requiring different charging and overcharge treatment.

Other stored machine readable tables of computer system 28-10 or 32-10 may include acceptable maximum overcharge rates as represented in FIG. 6 and have charge rates, e.g., as described at Col. 9, line 26 to Col. 10, line 32 of the incorporated U.S. Pat. No. 4,455,523. Such stored tables would insure that the charging system of FIG. 28 or FIG. 32 would be compatible with a battery means such as shown in FIG. 5 or in FIGS. 9A and 9B. For example, the stored table for the battery means of FIGS. 9A and 9B could take account of internal heating within the internal regulator 173 of the battery pack and insure that the current to the battery (20, FIG. 5) and to the battery load did not exceed the power dissipation capacity of the internal regulator network (173, FIG. 9A).

Figure 9A:
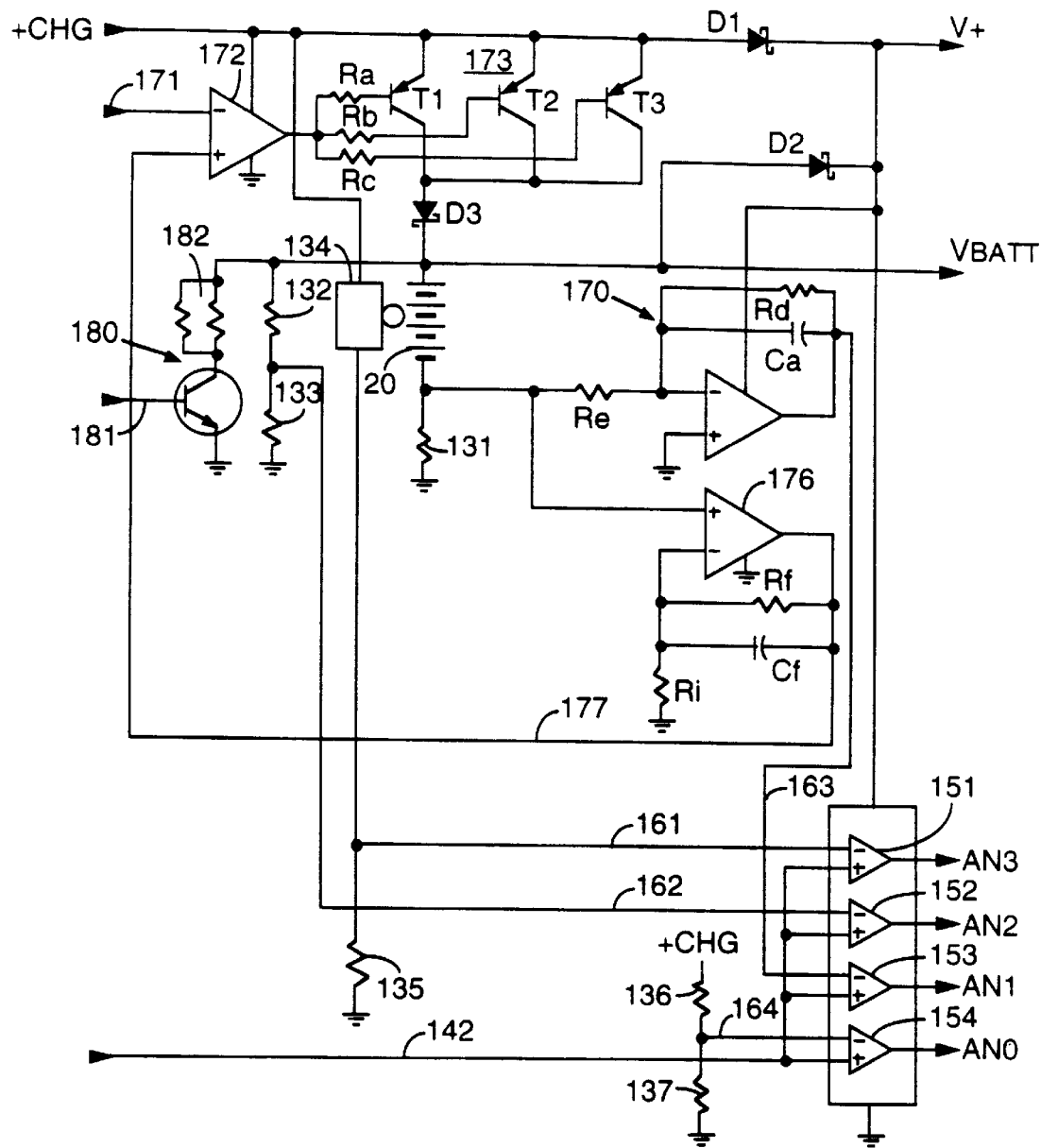
FIGS. 9A and 9B show a specific circuit implementation in accordance with the block diagram of FIG. 5, by way of example and not by way of limitation.

The current regulator 28-20 may be controlled to provide a voltage VCHG at the line CHG in FIG. 9A of approximately seven volts which would result in minimum power dissipation in the interior regulator network (173, FIG. 9A). The presence of an internal current regulator within a hand-held terminal unit is indicated at 26-28, FIG. 26, and charging current control circuit 26-22 could conform with the embodiments of FIGS. 28–36 in the selection of charging and overcharge current values while tending toward minimum power dissipation in the internal regulator network (173, FIG. 9A) or in the internal regulator 26-28, FIG. 26.

In a different embodiment, each battery pack could have an internal digitally stored identification code digitally stored in the battery pack and accessible to an external microprocessor system such as 28-10 or 32-10 as in the embodiment of e.g. FIG. 23 (via contacts 23-51A), FIG. 25 (via data output 25-51), FIG. 26 (via components 26-36, 26-37, 26-20 and 26-23), or FIG. 27 (via D to A component 27-37 or LAN interface 27-39).

Instead of bringing battery temperature up to ambient temperature as in steps 29-15 to 29-19, it would be conceivable to establish ambient temperature to match battery temperature, and then proceed with a test for overcharge condition as in steps 29-20 to 29-23. Similarly before steps 29-24 to 29-27, where the battery is initially at a low temperature, it would be conceivable to control ambient temperature so as to bring battery temperature up to zero degrees Celsius or six degrees Celsius by control of ambient temperature alone, or in combination with a suitable charging current. In this way, a relatively high charge rate according to FIG. 34 would be suitable, e.g., at least 0.6 C, and a maximum overcharge rate according to FIG. 33 would quickly be appropriate for the overcharge cycle of steps 29-28 and 29-29.

The stored charge rate information can take the form of end points such as 33-1, 33-2; 33-2, 33-3; 33-3, 33-4, FIG. 33, for successive substantial straight segments such as 33-11, 33-12 and 33-13, so that the microprocessor could interpolate a precise charge rate multiplier for any measured battery temperature. Thus, if segment 33-12 had end points at −20° C., 0.060 units and at −10°, 0.100, a battery temperature of −19° might be computed to correspond to 0.064 by linear interpolation. Of course of course the points given in Tables I and II could be similarly interpolated to obtain intervening more precise overcharge and fast charge values.

Figure 9B:
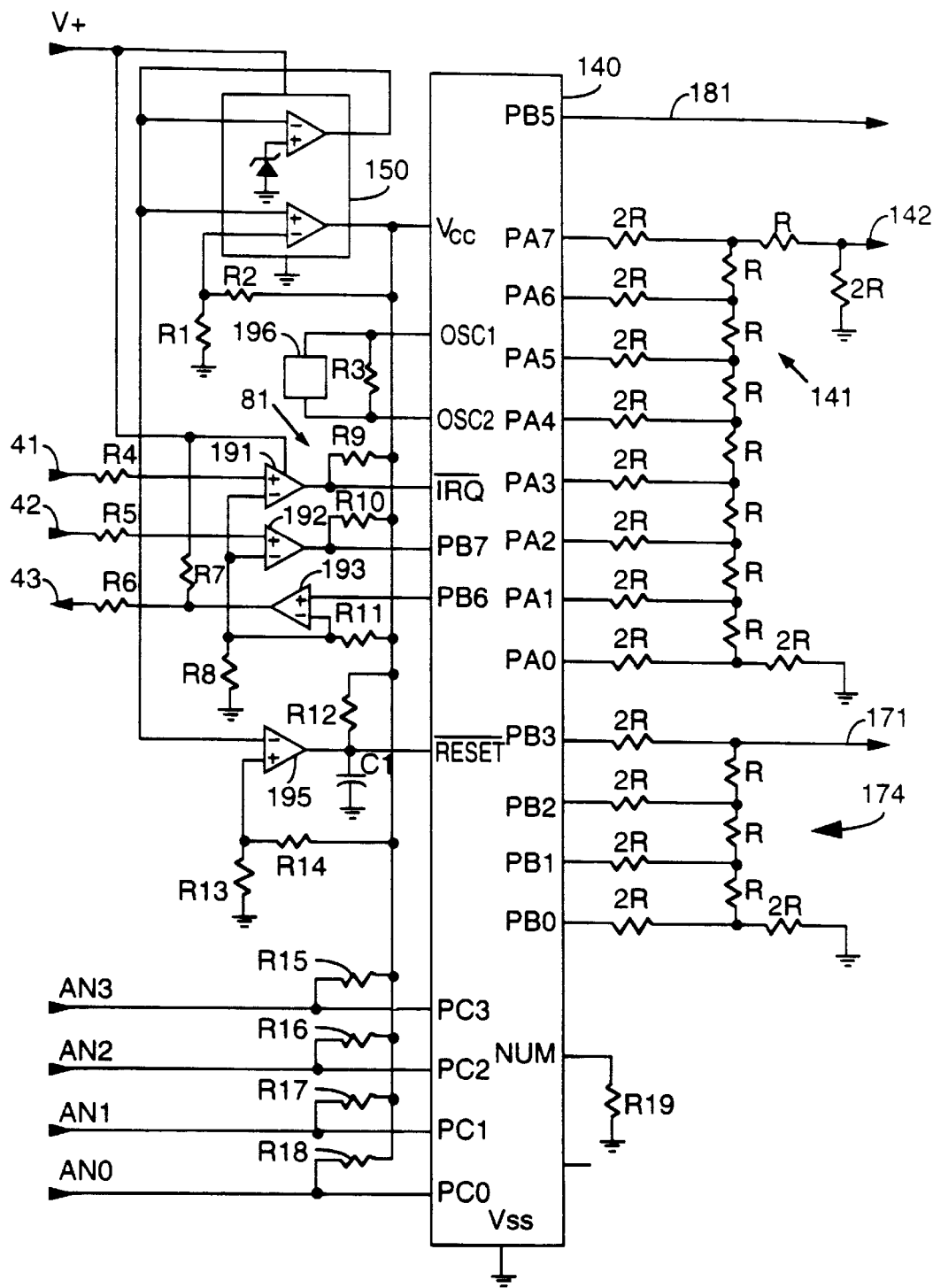
Figure 10:
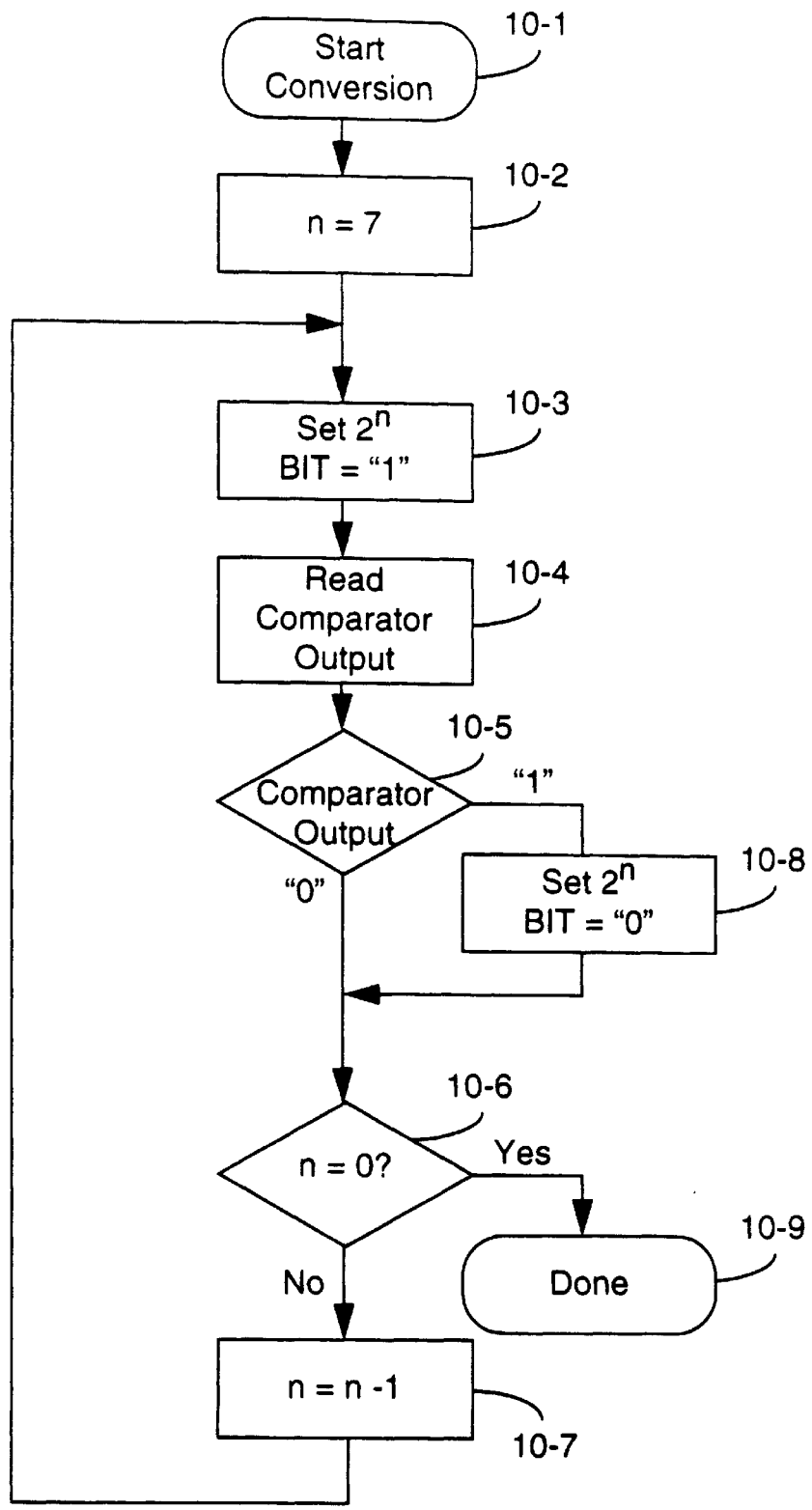
FIG. 10 is a flow diagram for illustrating an exemplary control program for carrying out analog to digital conversion of battery parameter values utilizing the particular exemplary circuit of FIGS. 9A and 9B.
Figure 11:
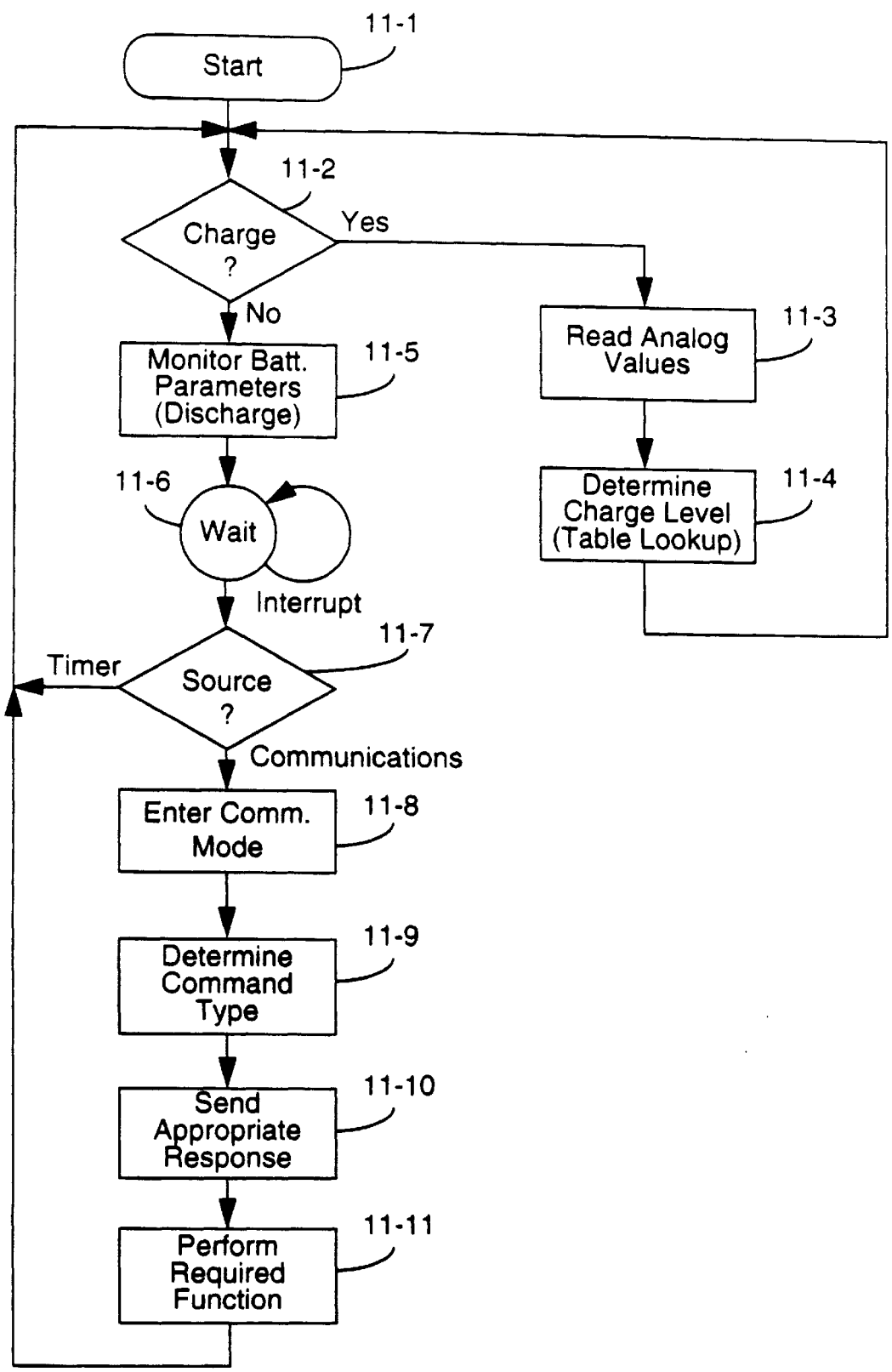
FIG. 11 is a flow diagram illustrating the general battery processor control program utilized in conjunction with simplified system currently in use.
Figure 12:
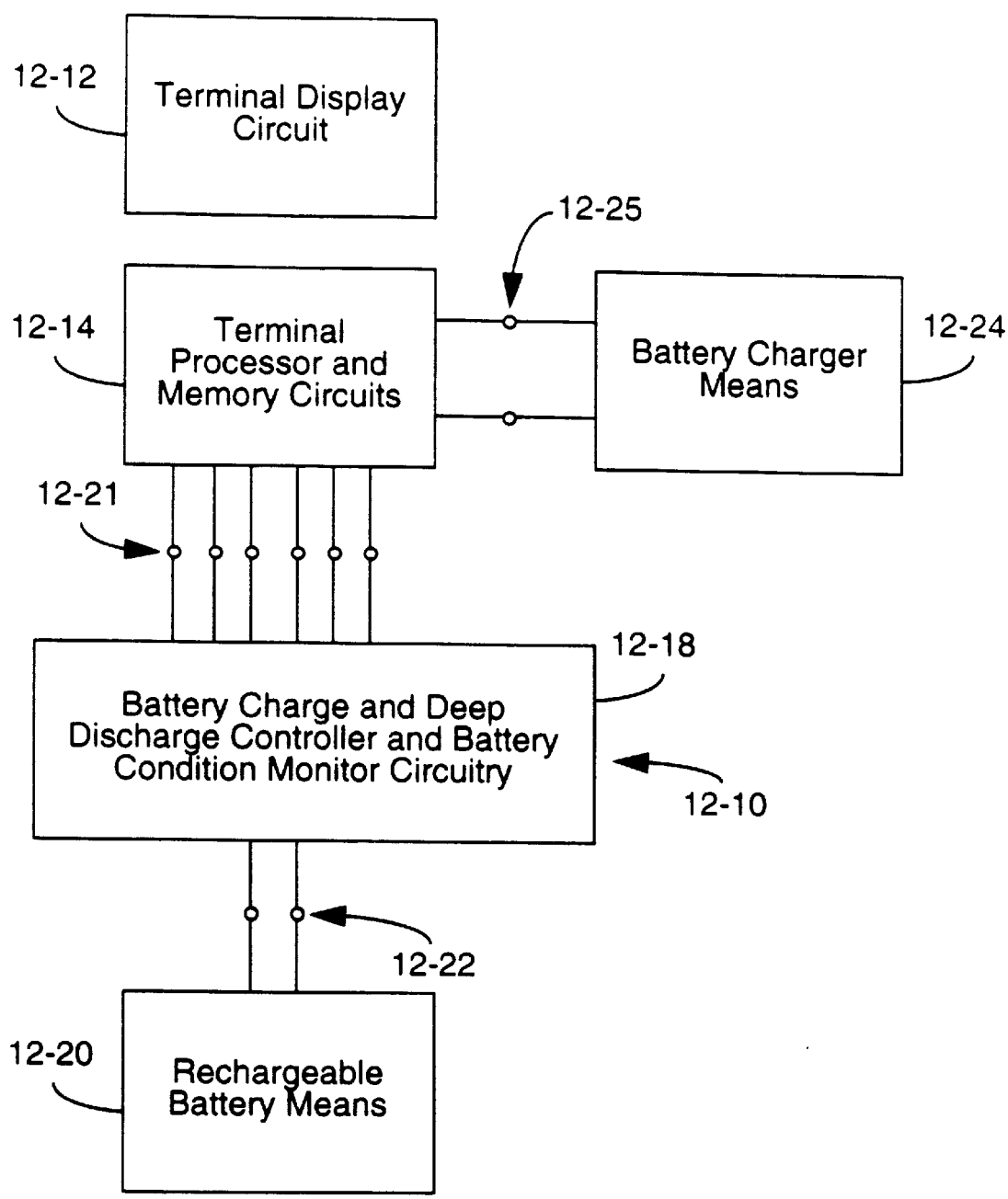
FIG. 12 is a block diagram of a simplified portable battery powered device in accordance with the present invention associated with a battery charger means, and also serves to illustrate a stationary battery conditioning system for spare battery packs.
Figure 13:
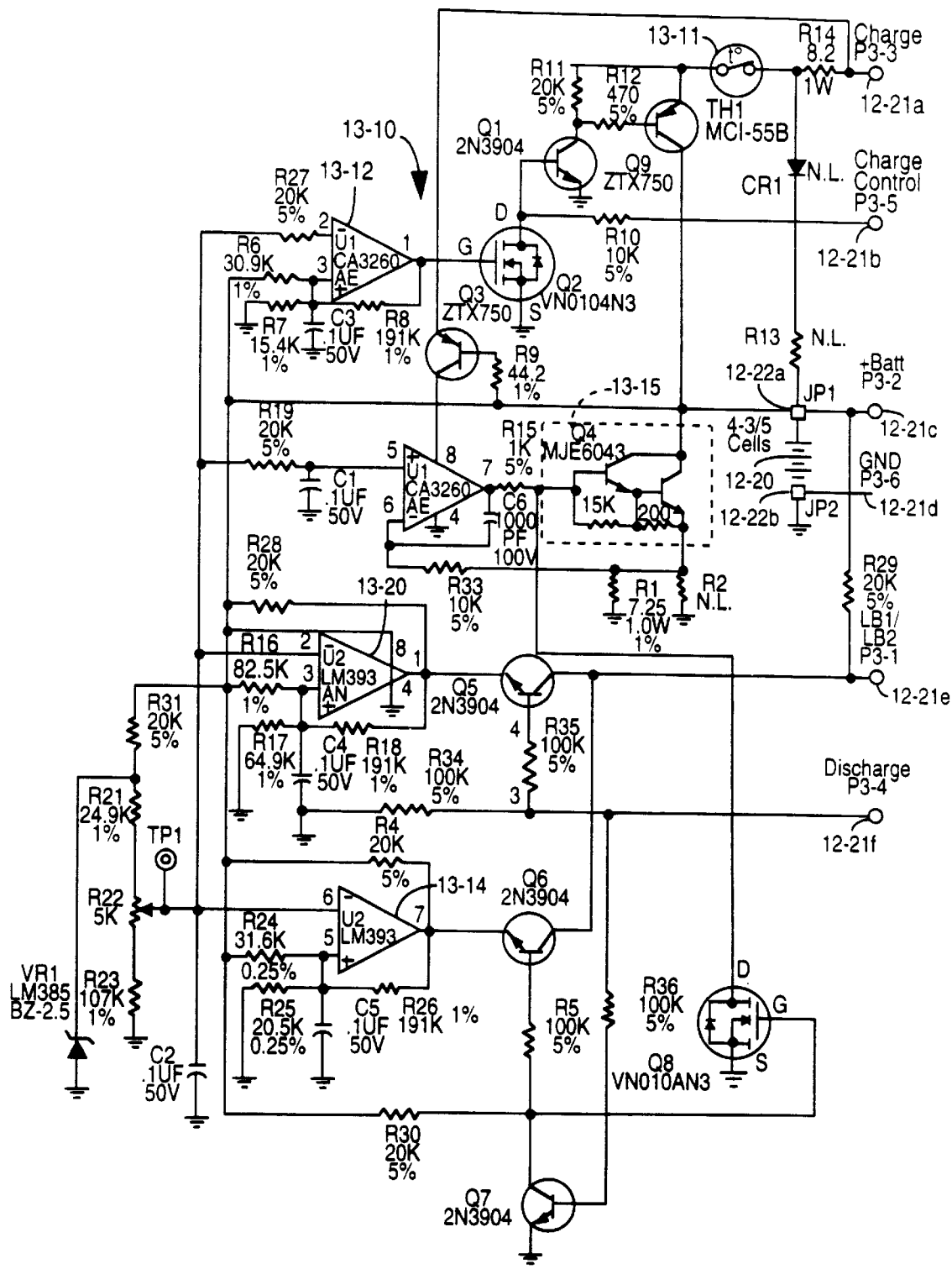
FIG. 13 shows a specific implementation of the battery charge and deep discharge controller and monitor circuitry which is represented as a labeled rectangle in FIG. 12.
Figure 14:
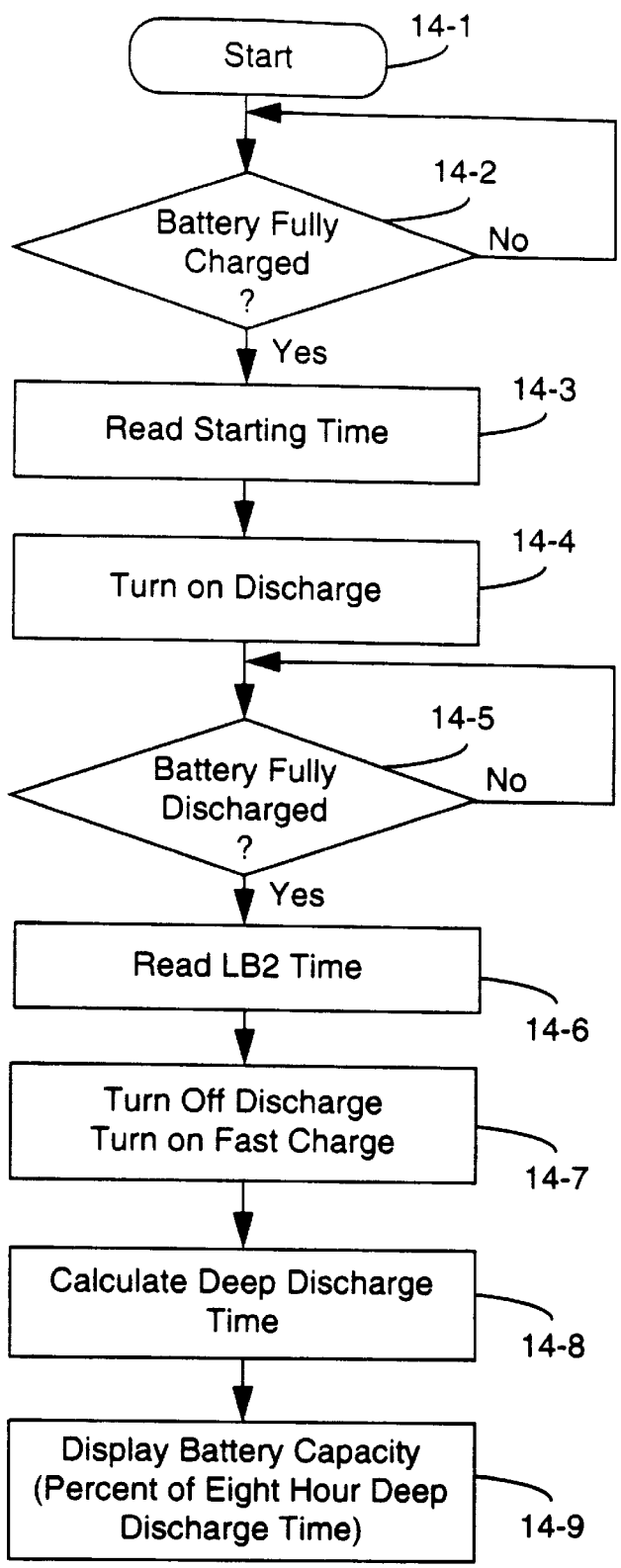
FIG. 14 is a flow diagram indicating the operating means for effecting an automatic discharge cycle with the specific circuitry of FIG. 13.
Figure 15:
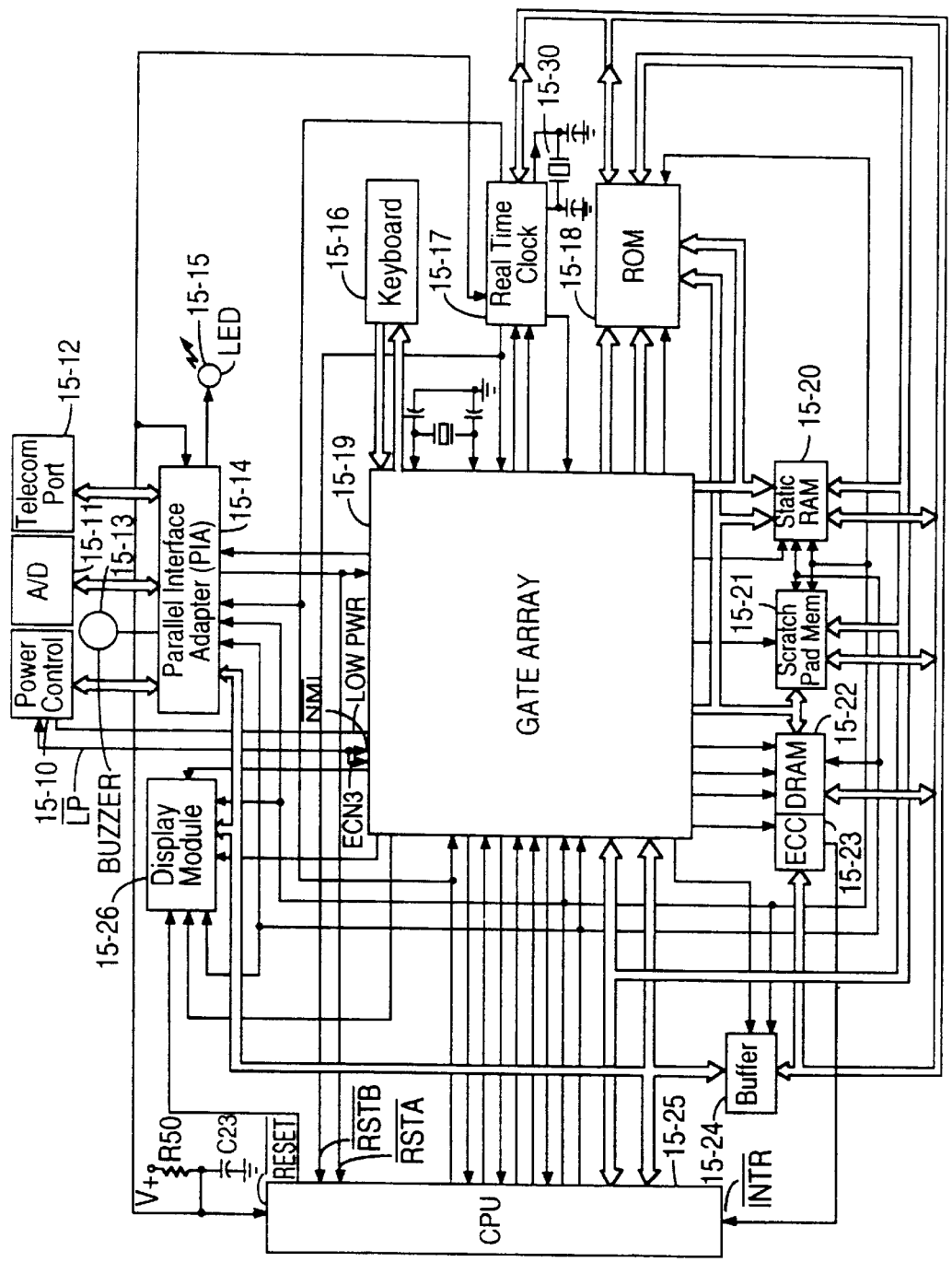
FIG. 15 shows a block diagram for illustrating an exemplary commercial implementation of the present invention.
Figure 16A:
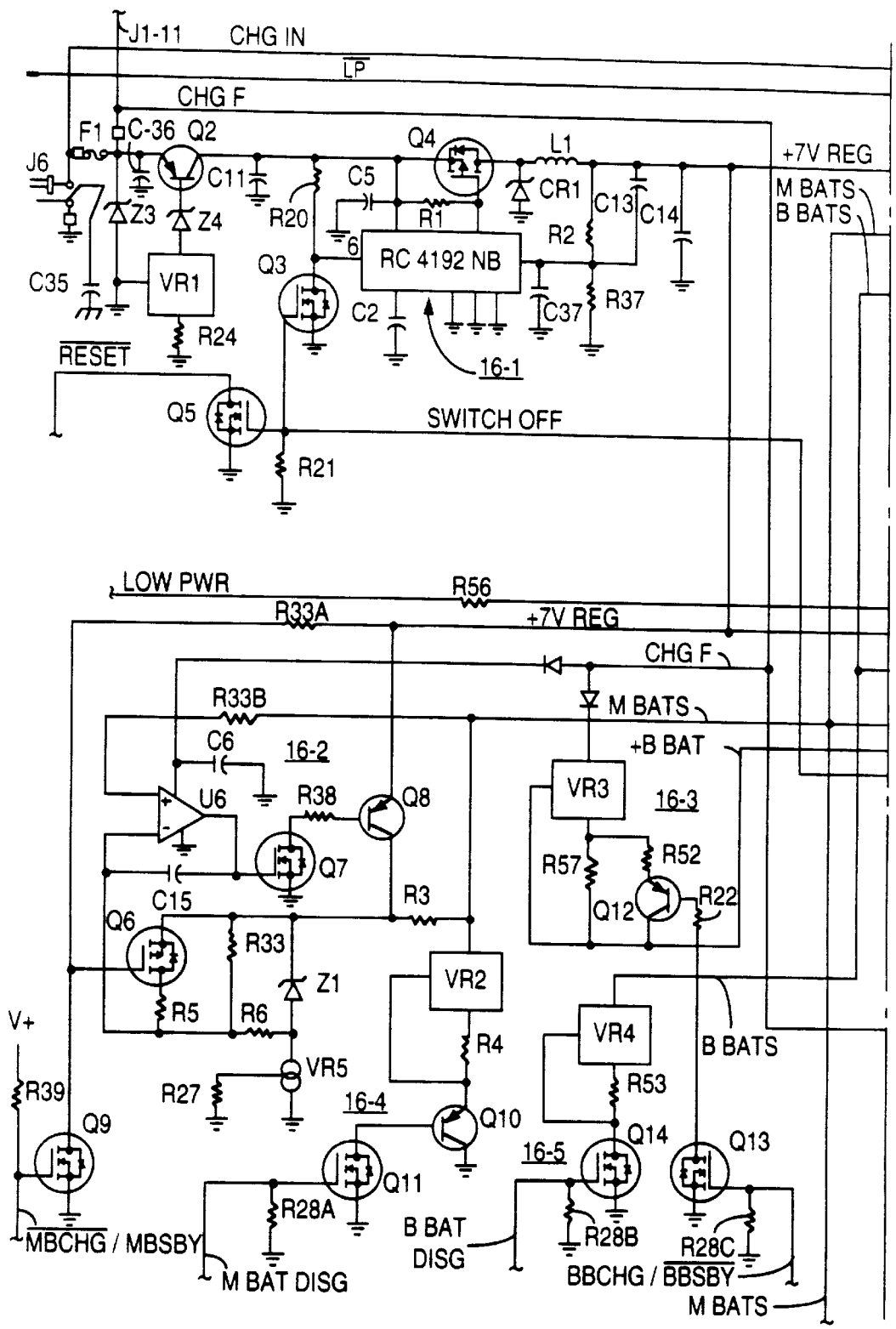
FIG. 16A shows a portion of an electric circuit diagram for illustrating preferred implementations of a direct current to direct current converter, a main battery charging circuit, a backup battery charging circuit, and main and backup discharge circuits for such commercial implementation.
Figure 16B:
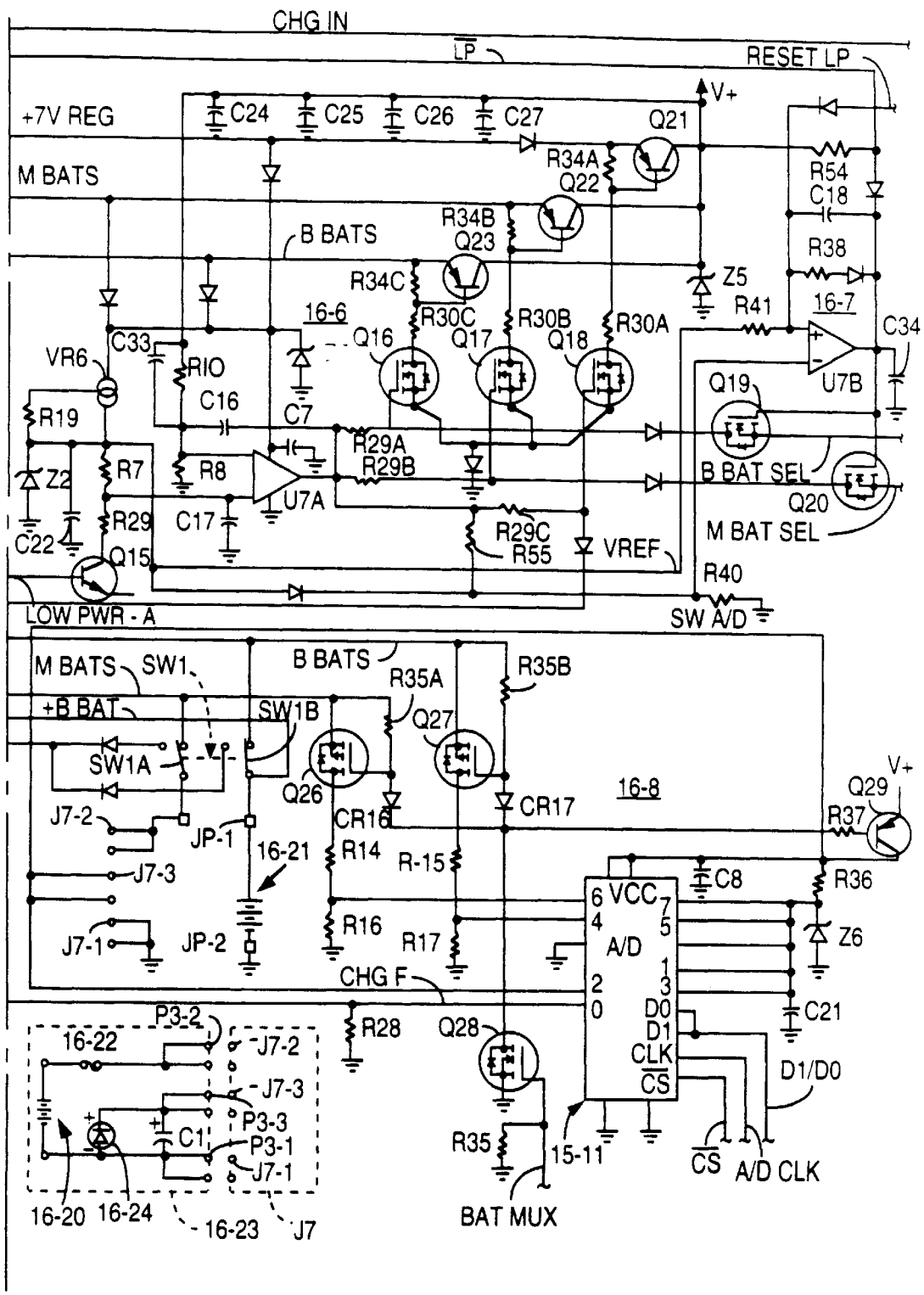
FIG. 16B shows a continuation of the electric circuit diagram of FIG. 16A to the right, and particularly illustrates preferred regulator circuitry, preferred low power detection circuitry, and the preferred association of an integrated circuit analog to digital converter means with a main battery means and a backup battery means, in accordance with a preferred commercial implementation of the present invention.
Figure 17:
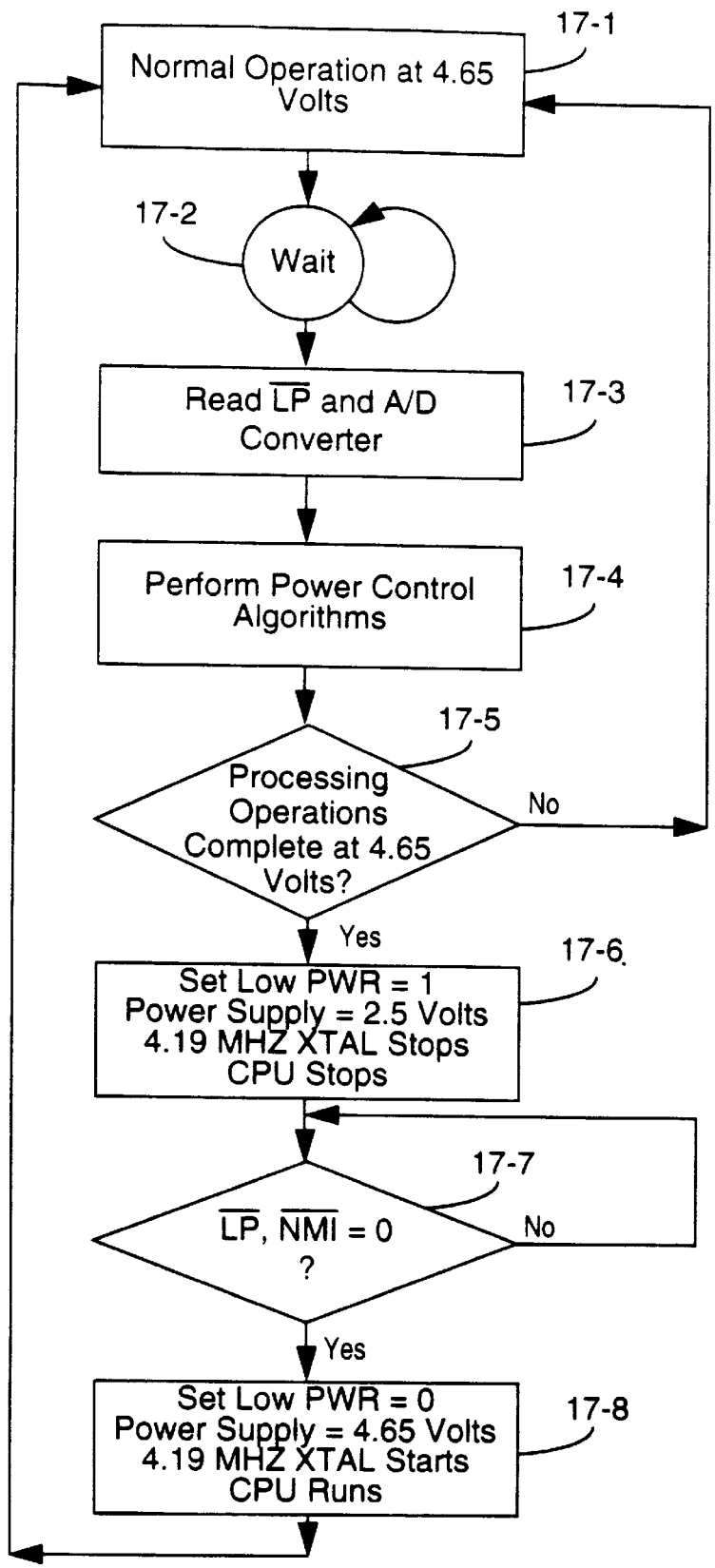
FIG. 17 is a flow diagram for illustrating the manner in which the power control circuitry of FIGS. 16A and 16B interacts with components 15-19 and 15-25 for FIG. 15 during operation of a preferred portable unit under battery power.

With respect to steps 29-7 to 29-12, an internal microprocessor such as in FIG. 5 or FIGS. 9A, 9B may determine battery load current and communicate the same to an external microprocessor such as 28-10 as shown in FIGS. 23, 25, 26 or 27, for example, FIG. 28 may represent the association of a non-portable battery conditioning station including components 28-10, 28-17 and 28-20 with a hand-held terminal unit containing a quickly removable battery pack 28-25 comprised of a nickel-cadmium rechargeable battery 28-15 and a battery temperature sensor 28-16 within housing 28-22. The hand-held terminal unit may provide load means 28-21, which may comprise a dynamic random access memory and other circuitry which is to be continuously energized during a charging operation.

As in the embodiment of FIG. 30, the hand-held terminal units which are to be associated with components 28-10, 28-17 and 28-20 may include coupling means such as 30-21, 30-21A, 30-23 and 30-24 which are automatically engaged with cooperating coupling means of the charging station when the hand-held unit is bodily inserted into a receptacle of the charging station. The coupling means 30-21 and 30-21A in FIG. 30 would be represented in FIG. 28 by a line (+BATT) from component 28-20 corresponding to line 28-26, and a further line (+CHG) leading to a network (representing components 30-28 and 30-29) in turn connected with battery 28-15 and line 28-11.

An exemplary charging station adaptable for a hand-held unit including battery pack 30-27 of FIG. 30 is shown in greater detail in FIG. 27.

Where FIGS. 28–36 are applied to a system as represented in FIG. 27, components 28-10, 28-17 and 28-20 would be part of charger station 27-22. Line 28-26 would lead to a charging station contact engageable with external battery pack contact 27-11. Input line 28-12 would be connected via a further set of mating contacts with internal battery pack contact 27-61. Input line 28-11 would connect with contact 27-17. Alternatively, charger station 27-22 would have a LAN interface corresponding to 27-39 and would receive digital information as to battery terminal voltage for example via amplifier 27-35A, an A to D converter of terminal 27-10A, LAN interface 27-39 and LAN data coupling means 27-19, 27-21. The charging station would then charge the battery packs such as 27-10B of terminals such as 27-10A in accordance with the embodiments of FIGS. 28–36. In place of amplifier 27-37, (representing components 26-36, 26-37), an identifying shunt voltage regulator 30-10 would be part of each battery pack 27-10B.

As a further embodiment, the charger station 27-22 could comprise the components of FIG. 32, the line 28-12 being coupled with a battery such as 27-27 via mating terminals 32-21 and 27-11 and through forward biased diode 27-D1, for example. In this embodiment terminal 27-13 would mate with terminal 32-24, and battery pack 27-10B would conform with battery pack 30-27 for example by including a respective identifying shunt regulator 30-10, and e.g., nickel-cadmium batteries with respective characteristics as shown by FIGS. 33 to 36 and Tables I and II.

SUMMARY OF OPERATION OF FIGS. 28–36

Operation of the specific exemplary embodiment as presented in FIG. 29 may be summarized as follows.

As represented by steps 29-2 and 29-3, the presence of a battery pack 28-25, FIG. 28, or 30-27, FIG. 30, may be sensed by means of the input 28-11, FIG. 28 or FIG. 32, from battery pack temperature sensor 28-16, FIG. 28, or 30-26, FIG. 30. A non-zero voltage input level on line 28-11 may signal the presence of a battery pack 28-25 coupled with components 28-10 and 28-20. The physical connections may be analogous to those of FIG. 26, for example, an exemplary arrangement of terminals for a battery pack 30-27 being shown in FIG. 30.

Referring to FIG. 31, the load current may be automatically sensed by means of steps 29-7 to 29-11 since battery voltage as measured at 28-12, FIG. 28 or FIG. 32, will not increase until a current Ichg, FIG. 30, in excess of battery load current Iload is applied to line 28-26, FIG. 28.

Where the battery pack has a given upper temperature limit which must be observed to avoid detriment to battery life, the battery may be automatically allowed to cool to a suitable temperature (e.g. 40°) if it is introduced into the charger at an unacceptably high temperature. This is represented by steps 29-13 and 29-14 which may be automatically performed by microprocessor 28-10 or 32-10 according to battery temperature (Ptemp) as sensed at input 28-11, FIG. 28 or FIG. 32.

As explained in reference to FIG. 36, in order to detect the battery overcharge condition, the microprocessor 28-10 or 32-10 automatically performs steps 29-15 to 29-19 to assure that battery temperature as measured at input 28-11 is not substantially lower than ambient temperature as sensed at input 28-13. Once battery temperature is at least essentially equal to ambient temperature, steps 29-20 to 29-23 are effective to automatically determine whether the battery is to receive a fast charge according to steps 29-24 to 29-27, and e.g. FIG. 34, or whether the microprocessor 28-10 or 32-10 is to govern the supply of charging current at 28-26 according to steps 29-28 and 29-29 and e.g. FIG. 33.

DISCUSSION OF TERMINOLOGY

From the foregoing, it will be understood that steps 29-20 to 29-23 are effective where the battery system can be made to exhibit a temperature characteristic which rises as a function of overcharge current over a given time interval generally as illustrated in FIG. 32. To accomplish this the charging system may operate automatically as in steps 29-15 to 29-19 to insure that the battery means has a state such that its temperature will not increase at a substantial rate due to a higher ambient temperature (e.g. as in FIG. 36). In particular, the state of the battery means may be automatically assured to be such that it will exhibit a substantially greater increase in battery temperature in response to a given selected charge rate when the battery is in overcharge condition that when it is not in such a overcharge condition.

As represented by step 29-20, the current automatically applied to the battery means exceeds battery load current by a substantial overcharge magnitude, e.g. twice the overcharge value obtained from FIG. 33, but the application is of limited duration (e.g. ten minutes per step 29-20) such as to void substantial detriment to the useful life of the battery.

According to steps 29-22 and 29-23, the microprocessor system automatically determines whether any increase in battery temperature due to step 29-20 is of a magnitude (e.g. two degrees Celsius or greater) which is distinctive of the overcharge condition of the battery means.

From the foregoing TABLE I, it will be understood if battery temperature at step 29-22 has reached thirty degrees Celsius, step 29-24 would result in an initial relatively high battery Charging current (Ibatt, FIG. 31) of about 1280 milliamperes if the temperature increases at step 29-23 was not greater than two degrees Celsius, while if the increase at step 29-23 were found to be greater than two degrees Celsius, step 29-28 would result in supply of a relatively lower battery charging current of about 240 milliamperes.

Where the relatively high battery charging current is applied, battery temperature is measured at regular intervals (e.g. at about one minute intervals per step 29-25) to assure that such high charge rate is terminated sufficiently quickly after overcharge condition is detected so as to avoid any substantial detriment to the useful life of the battery means.

The overcharge relatively lower charge rate is terminated after an overcharge interval so as to insure optimum charging of the battery means without detriment to its useful life.

Of course the charge rate or overcharge rate may be readjusted higher or lower according to FIGS. 33 and 34 at any desired time intervals, e.g. at each step 29-24 in charging mode, and by inserting steps such as 29-25 and 29-26 between steps 29-28 and 29-29 so that overcharge current would be re-selected at suitable intervals such as one-minute intervals.

Referring to the plots of maximum acceptable overcharge rate in FIGS. 6 and 33, it will be observed that there is a minimum temperature for each battery type below which overcharge current is not applied by the microprocessor system 28-10 or 32-10. In FIG. 6, the lower temperature extreme is shown as about zero degrees Fahrenheit (about minus eighteen degrees Celsius). At about zero degrees Fahrenheit, the low overcharge rate is less than about capacity divided by fifty. In FIG. 33, the low temperature extreme is about minus thirty degrees Celsius where the overcharge current of about 0.04 units corresponds to an overcharge rate of about capacity divided by twenty-five.

Above the lower limit temperature, there is a range of temperatures where the upper overcharge rate exceeds the lower overcharge rate by a factor of at least about four. For example, in FIG. 6, the acceptable overcharge rate at a relatively high temperature of about one hundred and ten degrees Fahrenheit is close to capacity divided by five (0.2 C), while the acceptable overcharge rate at the low temperature extreme of about zero degrees Fahrenheit is about capacity divided by fifty (0.02 C) a ratio of overcharge rates of ten to one. According to FIG. 33, the microprocessor system 28-110 or 32-10 may supply values of overcharge at about five degrees Celsius of about 0.30 units (C/3.3) while at a low temperature extreme of about minus thirty degrees Celsius, the acceptable overcharge rate to be supplied by the microprocessor system is about 0.04 units (C/25), a ratio of about seven to one. Between the temperature values of the temperature range of FIG. 6, the permissible overcharge rate progressively increases with successively higher temperature values such as zero degrees, fifteen degrees, thirty-five degrees, fifty-five degrees, seventy-five degrees and ninety-five degrees (Fahrenheit). Similarly in FIG. 33, between temperatures of minus thirty degrees Celsius and about five degrees Celsius, the permissible overcharge rate progressively increases for successively increasing temperature values (such as $-20°$ C., $-10°$ C. and $0°$ C.).

Referring to FIGS. 28, 30 and 31, it will be understood that the embodiments of FIGS. 28 to 36 avoid series resistance means of substantial ohmic value such as shown at 131, FIGS. 9A, 18-26, FIGS. 18, 24-30, FIGS. 24, 25-26, FIG. 25, for sensing battery current. Instead charging current source 28-20, FIG. 28, may be automatically operated to supply desired current values in an open loop manner. An automatic sequence such as steps 29-7 to 29-11 may be used to measure load current if this would be a fluctuating and possibly significant amount for a given hand-held terminal unit and would not be reported to the charging station by the hand-held unit. As shown by FIGS. 28, 30 and 31, the battery 28-15 has external terminals e.g. as at 30-21A, 30-22A, FIG. 30, with external circuit means connecting such terminals with the battery, such external circuit means having essentially negligible ohmic resistance such that the battery means supplies load current to a load via the external terminals with minimized ohmic loss at the battery side of said external terminals.

DESCRIPTION OF FIGS. 37, 38 AND 39

As portable hand-held data and radio terminals continue to be used more widely in certain demanding applications, the fast charging of the terminal batteries becomes more significant. The increased use of high powered scanner attachments and peripherals as well as other connected devices often causes the terminal battery capacity to be taxed to the point where only a portion of the intended period of usage may be served with the stored charge available from a single battery pack. Consequently, it has become increasingly necessary to provide multiple packs which may be exchanged in such a way that a depleted pack may be replaced by a fresh one with minimal downtime. When a depleted pack is removed, it should be fully recharged in a least the amount of time that a fresh pack is able to operate the terminal. With a recharging capability of this type, it is then possible for virtually perpetual operation to be provided with as few as two battery packs per terminal.

A similar but further complicated application involves the utilization of the described data terminals on a vehicle such as an industrial fork lift truck. In this type of application, the terminal may receive power for operation from the vehicle the majority of the time. Often, however, it may be necessary for the terminal to be physically removed from the vehicle and operated in a fully portable mode for potentially extended periods of time. For this reason, it is imperative that the terminal batteries be maintained in their fully charged or "topped off" state at all times.

Figure 37:
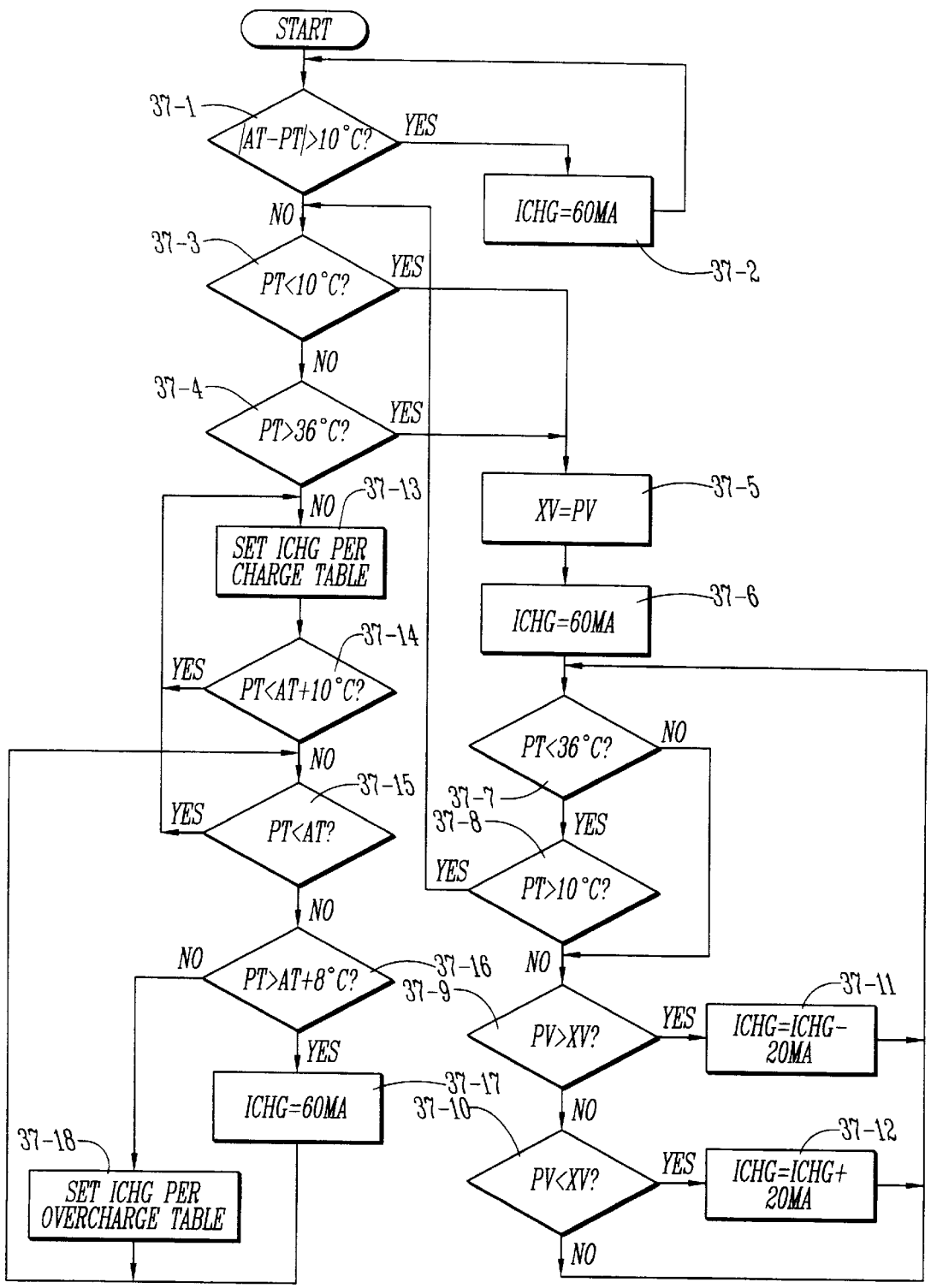
FIG. 37 shows an improved procedure for carrying out fast charging and maintenance of a nickel-cadmium battery pack, for example in conjunction with a microprocessor system as shown in FIG. 28, the variable P temp, V batt and Atemp of FIG. 28 being represented by PT, PV and AT in FIG. 37.
Figure 38:
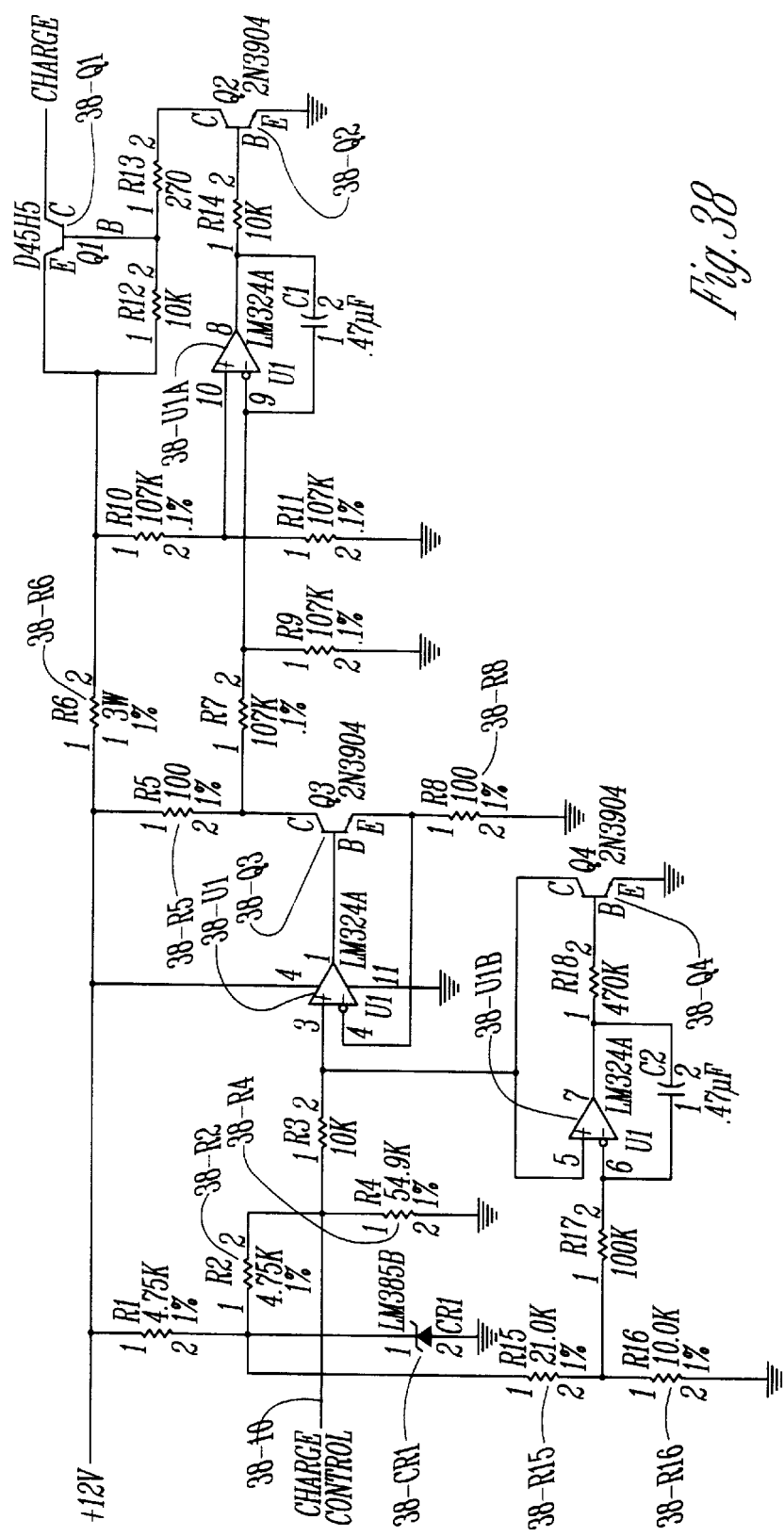
FIG. 38 is a schematic diagram for illustrating a charge current regulator circuit such as indicated at 28-20 in FIG. 28.
Figure 39:
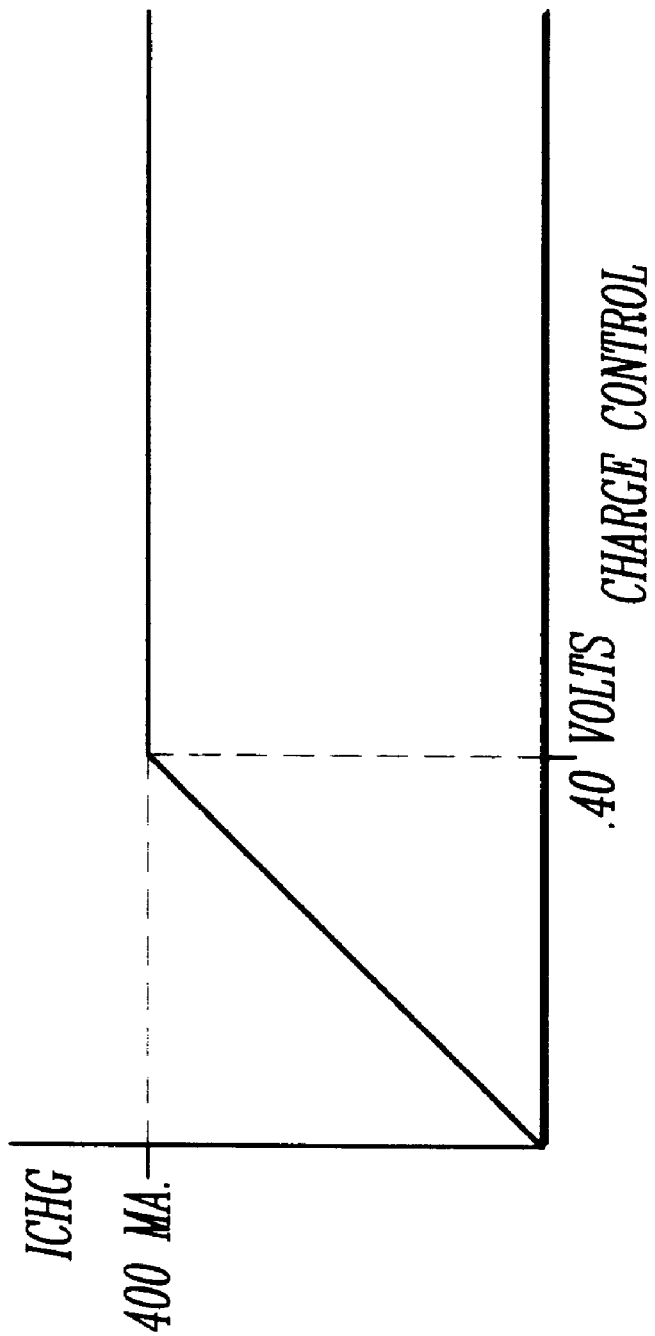
FIG. 39 shows the voltage to current transfer function for the circuit of FIG. 38.

The above stated objectives for a battery charging system have traditionally been extremely difficult to achieve. FIGS. 37, 38 and 39 show an embodiment that addresses both aspects of fast charging and maintenance in a novel and unique way.

As described with reference to FIGS. 28 through 36, the characteristics of the popular NiCad battery technology are such that the rates at which charging may be accomplished are a strong function of temperature and state of charge. If the cell is in a discharged condition, the rate at which charge may be applied is relatively high, regardless of the cell temperature. If the cell is in a charged condition, the rate at which charge may be applied to the cell is determined by the temperature of the cell. At the limits of cell temperature, excessive charge current may cause permanent damage resulting in premature failure of the cell. Consequently, for fast charging to be accomplished safely, the temperature and state of charge of a battery must be determined.

Battery temperature (herein designated PT) may be measured directly by the use of a pack temperature sensor 28-16 thermally coupled to the battery pack 28-25. State of charge of a NiCad battery type is more difficult to determine. In general, the most reliable indication that a NiCad battery is fully charged is the release of heat while under charge. This only occurs when the battery is in the overcharge condition in which most or all of the current supplied to the battery causes evolution of oxygen gas at the positive electrode. When oxygen chemically recombines with cadmium at the negative electrode, heat is released. No other condition of operation of a NiCad battery causes appreciable heat to be generated.

In general, the process of converting charge current to stored charge in a NiCad battery is a slightly endothermic chemical reaction, that is, heat is removed from the environment of the battery and it gets slightly cooler. Consequently, it is possible to apply quite high rates of charge to the battery if it is not in the overcharge condition. Once the overcharge condition is reached, the slightly endothermic charge reaction is overwhelmed by the highly exothermic overcharge/oxygen recombination reaction. The rate of applied charge must then be quickly reduced to prevent excessive heating and battery damage.

As described in reference to FIGS. 28–36, a microcomputer 28-10 with the ability to measure the temperature of a battery and control the applied charge to that battery may be employed to effect charging at the maximum safe (non-damaging) rate and may also terminate the charge function to prevent damage to the battery when it is fully charged. The present embodiment also employs a microcomputer to measure battery temperature and control applied charge as indicated in FIG. 28, however, the process that is used to determine the appropriate charge current is quite substantially different, and significantly modifies and improves the performance of the charging system.

A flowchart of the procedure that accomplishes the described charging characteristics is shown in FIG. 37. It should be noted that the charging method described may be applied to either a terminal or utilization device with the circuits as shown in FIG. 28 or to a standalone pack charger with one or more sets of the same circuit. In the case of the pack charger configuration, the block 28-21 labeled "load" would not be present. In the terminal configuration the operating power required by the terminal itself would represent a load that requires current to be delivered by the charge circuit or battery.

In FIG. 37, the initial decision block 37-1, |AT-PT|>10° C., provides two pieces of information based on the ambient temperature value, AT, from sensor 28-17, and battery pack temperature PT. The first information (when the temperature difference is not greater than ten degrees Celsius) is that the temperature sensors 28-16 and 28-17 are in at least approximately agreement which provides confidence that they are functioning properly. If the temperature difference is relatively great, it is possible that the battery pack and the charger are at significantly different temperatures, in which case they need to stabilize to an acceptable level before further procedure steps may be taken. If this condition is detected, a constant current of sixty milliamperes (60 ma.) is selected as indicated at 37-2 to provide a safe low maintenance current that may minimize further discharge of the battery if it is already in a relatively depleted state.

If the initial temperature difference is not excessive, the absolute temperature of the battery pack is examined at steps 37-3 and 37-4. The temperature range allowed for charging is between 10° C. and 36° C. If the battery temperature is not within this range, the battery must be allowed to cool or warn as the case may be for the charging process to continue. It may be assumed (or specified) that the ambient temperature environment of the charger itself is between these limits, so that the battery temperature will stabilize after some time to an acceptable level. During this temperature stabilization time, it is preferable that no charge current be supplied to the battery, though it may be necessary for current to be supplied to a load, as in the case of a terminal which receives it operating power from the battery or charge while charging is in progress. Since the load current is generally not known, a mechanism must be provided to adjust the current provided by the charger to accurately match the load current of the terminal. The means by which this is accomplished is as follows:

1. Examine the battery pack terminal voltage designated PV as indicated at block 37-5.
2. Select an initial charge current of sixty milliamperes (60 ma. ) as indicated at 37-6.
3. Examine the pack temperature PT at 37-7 and 37-8 to determine if it has stabilized within the desired limits. If so, return to the main charging process.
4. Examine the present terminal voltage PV at 37-9 and 37-10.
5. If the battery terminal voltage has increased, decrease the charge current by twenty milliamperes (20 ma.) as indicated at 37-11.
6. If the battery terminal voltage has decreased, increase the charge current by twenty milliamperes (20 ma.) as indicated at 37-12.
7. If no terminal voltage change is detected, leave the charge current unchanged and return to step 3 above. This method serves to provide an adaptive current that will prevent the battery from being further depleted while its temperature stabilizes to an allowable level.

After the battery temperature has stabilized to an allowable level, it is then possible to begin charging at high rates of charge. As described with reference to FIGS. 28–36, a stored table containing values of currents that may be safely applied to a battery of a known capacity at a given temperature is used to determine the charge current, this being indicated at 37-13. While the table values for fast charge current will not cause stress or damage to a battery when it is discharged and efficiently receiving charge, in general, these charge currents are high enough to cause permanent damage to the battery if not terminated properly. The indication that the battery is nearing full charge is based on detection of the overcharge condition, which is the only condition of a NiCad cell that releases significant heat. In flowchart block of FIG. 37, the condition for decision block 37-14, PT<AT+10° C., provides the test for overcharge detection. In essence, the test for overcharge is to detect that the battery is becoming warmer than the ambient environment, in this case by an amount often degrees Celsius (10° C.). When this amount of heating is detected indicating that the battery has reached the overcharge condition in an appreciable amount, the fast charge function is terminated.

Upon completion of fast charge, a maintenance charge function is initiated which continues to monitor the battery temperature rise above the ambient environment (steps 37-15) and maintains an applied overcharge current at a level that regulates that battery temperature rise. The overcharge temperature rise is held to eight degrees Celsius (8° C.) as shown by steps 37-16, 37-17, and 37-18; this being a safe sustainable level that may be maintained indefinitely without appreciable cumulative damage to the battery. The temperature regulation process is implemented by selecting between a low charge current of sixty milliamperes (60 ma.) and the higher overcharge current table value depending on the measured temperature rise. By maintaining the battery n a state of continuous safe overcharge, it is possible to hold the battery in its maximum state of charge at all times, thereby ensuring that the user has the full battery capacity available whenever needed. If the battery temperature falls below the ambient temperature as determined at step 37-15, the fast charge state will be re-entered which will apply the maximum safe charge current for the measured temperature. It should be noted that this situation might occur if a very warm battery pack is placed in a pack charger at nominal temperature. Initially if the temperature difference is greater than 10° C. the pack will be charged at a fixed current of 60 ma until the temperature difference is reduced. If the pack temperature is less than 36° C. at this time, its temperature difference may still be very close to 10° C. which might allow the process to advance to the final maintenance state of the charge system. As the pack cools further due to ambient cooling and the endothermic charging reaction, its temperature may go below the ambient temperature (step 37-15), at which point the fast charge state would be re-entered.

In the maintenance mode, the current required for operation of a terminal is provided by the fact that the charge current (step 37-17 or 37-18) will exceed the terminal operating current by an amount necessary to maintain the temperature rise of the battery. Consequently, this charging system provides broad flexibility for fast charging of NiCad batteries in utilization devices with widely varying current demands.

A useful feature of this charging method is that it is not critical that the charging voltage source be able to provide the maximum current specified by the controlling microcomputer, for reliable charging to be accomplished. For example, if the selected value of charge current for a certain battery pack is 1500 ma., but the voltage source has a current capacity of only 600 ma., the fast charge state of the procedure would be maintained in exactly the same way except it would take correspondingly longer for the overcharge state to be reached. This feature of the charging method is particularly useful in configurations where multiple battery packs may be charged in a single unit and it is necessary to place constraints on the unit power supply for economic or size reasons. It is a relatively simple matter to externally limit the maximum delivered current so that the actual charge current is less than the value selected by the controlling microcomputer.

FIG. 38 shows a schematic diagram of a charge current regulator circuit which has the capability of delivering a constant current output to a battery in proportion to an input control voltage. In addition, this circuit has a maximum delivered current limit that may be set by a resistor selection in power supply constrained applications.

The CHARGE CONTROL input 38-10 is intended to be driven by a digital to analog (D/A) converter output of a microcomputer based utilization device such as a data terminal. The CHARGE CONTROL input develops a control voltage at pin 3 of differential amplifier 38-U1. The output pin 1 of 38-U1 drives 38-Q3 which establishes a current through 38-R8 that develops a voltage at 38-UI, pin 4 equal to the voltage at 38-U1, pin 3. Since the current gain $h_{fe}$ of 38-Q3 is relatively high (about 200) the collector current of 38-Q3 is nearly equal to the emitter current, resulting in an equal current through both 38-R5 and 38-R8. Since these resistors are of equal magnitude, the input voltage at CHARGE CONTROL 38-10 appears across 38-R5 referenced to the +12 volt supply voltage. The amplifier at 38-U1A pins 8, 9 and 10 is a differential configuration operating in a negative feedback mode. With a voltage developed across 38-R5, the voltage at pin 9 of 38-U1A will be decreased, which increases the voltage at the output pin 8. This increased voltage drives current into 38-Q2 which increases the drive current to 38-Q1 establishing a current through current sense resistor 38-R6. When the voltage drop across 38-R6 equals the voltage across 38-R5, the amplifier output will stabilize, holding the output current constant. With a sense resistor value of one ohm at 38-R6, the voltage to current conversion factor is one ampere per volt (1 amp./volt). If the CHARGE CONTROL input is left unconnected, the 1.25 volt voltage reference 38-CR1 and resistors 38-R2 and 38-R4 establish an open circuit voltage of 0.120 volts which establishes a "default" output current of 120 ma. This condition may be useful in cases where a utilization device is either unintelligent or its battery is completely depleted in which case its processor is unable to operate and the battery must be brought up to at least minimal capacity for the processor to function.

The circuit block consisting of the amplifier at 38-U1B pins 5, 6 and 7 is a clamp circuit that limits the maximum voltage that may be applied to 38-U1, pin 3. By limiting the input voltage, the maximum available charge current may then be limited to some selected value dependent on the selection of 38-R15 and 38-R16. With values of twenty-one kilohms for 38-R15 and ten kilohms for 38-R16, a voltage of 0.40 volts is applied to the clamp circuit input. If the input voltage driven on CHARGE CONTROL is less than 0.40 volts, the output pin 7 of 38-U1B remains low which biases 38-Q4 off. If the CHARGE CONTROL input voltage reaches or exceeds 0.40 volts, 38-Q4 is turned on sufficiently to maintain a voltage of exactly 0.40 volts at 38-U1B pin 5 which prevents the input voltage to the control amplifier from exceeding this voltage. The voltage to current transfer function of the system is shown in FIG. 39. It should be noted that the clamp voltage and maximum available current may be modified by selecting different values for 38-R15 and 38-R16 or the voltage reference 38-CR1. A maximum available current of 1.25 amps may be implemented by deleting 38-R16 in which case the full reference voltage appears at the clamp circuit input.

The microprocessor system means 28-10 or 32-10 operates automatically to apply substantially maximum charging current to the battery means consistent with avoiding substantial detriment to the useful life of the battery means e.g. as represented in FIG. 34.

A basic step of each embodiment is to compare battery temperature and ambient temperature as represented at 29-18 and 37-1. As indicated by FIG. 36, where ambient temperature is 20° C. (68° F.), the increase in battery temperature because of higher ambient temperature is relatively moderate for an initial battery temperature approaching 10° C. (50° F.). Thus, if battery temperature is at least 10° C. (step 37-3), and if ambient temperature is within 10° C. of battery temperature (step 370-), a substantial charging current may be supplied (37-13) even if the battery has not previously been checked for the overcharge condition (as in steps 29-20 to 29-23).

In each embodiment, charging current may be applied according to a fast charge characteristic such as shown in FIG. 34.

For step 37-13, it has already been ascertained that battery temperature is between 10° C. and 36° C., a region of the overcharge characteristic of FIG. 33 which is least sensitive to charging current. Further, in each embodiment current is applied for only a limited time interval, e.g. one minute or less (see step 29-25), before battery temperature is read again for the purpose of detecting a change of battery temperature indicative of the overcharge condition.

For step 29-27 an increase in battery temperature of two degrees Celsius or greater is taken as an indication of the overcharge condition.

For steps 37-14 to 37-156, the battery temperature is initially less than 10° C. greater than ambient temperature (step 37-1), so that if battery temperature increases so as to be equal or greater than the sum of ambient temperature and 10° C., this can be taken as indicating the overcharge condition. The comparison to ambient temperature plus 10° C. at step 37-14 can take place frequently, e.g. at one minute intervals where steps 37-13 and 37-14 are repeated cyclically.

Step 37-17 can taken as setting a current value corresponding to 0.2 C (C equals 1200 milliampere-hours) which according to Table II would be suitable for temperatures between about −25° C. and 60° C. Since ambient temperature is assumed to be maintained between 10° C. and 36° C., a low value of sixty milliamperes would be suitable for Table I also, even assuming no current being taken by load 28-21.

In each embodiment, measurement of battery terminal voltage is utilized to obtain a measure of load current. In FIG. 29, this is accomplished by increasing current in steps of say ten milliamperes (at 29-8) and sensing when battery voltage increases (step 29-11).

In FIG. 37, an initial current value of sixty milliamperes (step 37-6) is increased or decreased as measured battery voltage fluctuates in comparison to a reference value (XV, step 37-5). Thus, the current supplied is roughly equal to the required load current until such time as battery temperature increases above 10° C.

Discussion of the Embodiment of FIG. 37

Steps 29-1 to 29-12 are not inconsistent with the processing steps of FIG. 37, and could be used therein to identify a given battery pack, and/or to determine terminal load current during charging.

Steps 29-7 to 29-14 could be substituted for step 37-4 if desired.

Also, step 29-14 could be used in place of step 37-6, whereupon, steps 37-9 to 37-12 could be omitted. Steps 29-14 could also be substituted for step 37-2 or step 37-17.

It may be helpful to give the operation of FIG. 37 for the case of a specific example. If ambient temperature of the charge system which is to receive a terminal or battery pack is 20° C. (68° F.) and the pack is initially at 0° C. (32° F.), step 37-2 will apply until the battery pack reaches a temperature of 10° C. (50° F.). At this time, the temperature differential will be 10° C., and step 37-13 will be executed. For a battery according to Table II, the value of fast charging current would be 1.314 C. This value would also be selected based on characteristic of FIG. 34.

Step 37-14 could be performed at suitable time intervals, e.g., one minute intervals While battery temperature remained below 30° C., the fast charge rate would be successively adjusted (step 37-13) at e.g. one minute intervals according to Table II if necessary. Between 14° C. and 30° C., the fast charge rate might be at 1.600 C., as also indicated in FIG. 37, where such a charge rate was available from the regulator circuit.

DESCRIPTION OF FIGS. 40–46

FIGS. 40–46 illustrate further optional features of the present invention. As previously explained, there is room for improvement in the art regarding flexibility and efficiency of the recharging process. As illustrated previously in FIG. 31, the conventional way of recharging is to simply supply constant charging current to the battery. If, like in FIG. 31, a varying load is connected in parallel with the battery, this may affect not only the effectiveness and efficiency of recharging, but may even cause loss of recharging capabilities; or worse, discharge of the battery.

It has been found that one way to provide flexibility for recharging and increase efficiency of recharging is to pulse the recharging current. The pulse width can be modulated according to one or more controls to adjust the net charging current going to the battery.

Figure 40:
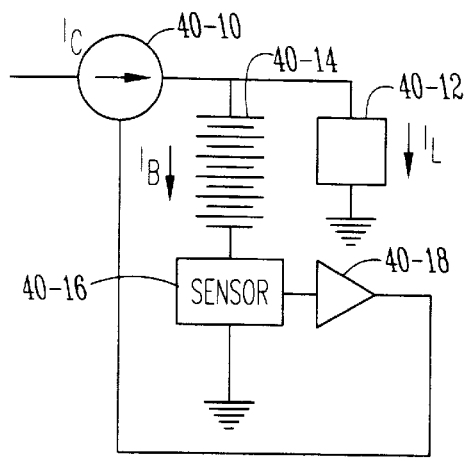
FIG. 40 is a block diagram of a closed loop battery charging circuit to control the nature of the charging current to increase the efficiency of charging of the battery even under varying load.

In FIG. 40, a circuit is illustrated which feeds back information to the current source regarding the amount of recharging current the battery is receiving. The current source can therefore alter the nature of the charging current (for example into a pulse width modulated waveform) which can in turn be varied or manipulated to provide a net charge to the battery.

By referring back to FIG. 31, it can be seen that a constant current source provides constant current $I_{chg}$ (28-26). $I_{chg}$ is divided into battery current $I_{batt}$, directed to the battery (28-15), and load current $I_{load}$, supplied to the load 28-21. Total current $I_{chg}$ equal to the sum of $I_{batt}$ plus $I_{load}$. If load current $I_{load}$ exceeds constant current $I_{chg}$, current is drawn from the battery 28-15.

FIG. 40 shows current source 40-10, load 40-12, and battery 40-14 similar to FIG. 31. Additionally, however, a sensor device 40-16 is connected in series to battery 40-14 to sense the amount of charging current $I_C$ that is given to battery 40-14 by the current $I_B$. Sensor 40-16 in turn provides a signal to integrator 40-18 which in turn communicates with current source 40-10. The signal from integrator 40-18 tells charging current source 40-10 the amount of current $I_B$ received by battery 40-14 over a given period of time. Charging current source 40-10 can include some sort of control to vary charging current $I_C$ to insure effective battery recharging even in light of a varying load which draws the varying load current $I_L$.

The configuration of FIG. 40 therefore will allow flexible, efficient control of charging current $I_C$ to in turn allow flexible and efficient charging of battery 40-14. The pulsing of the current provides a net charge over time to the battery. The magnitude of the net charge can be adjusted of fine-tuned by varying the pulse width or duty cycle of the pulses.

Figure 41:
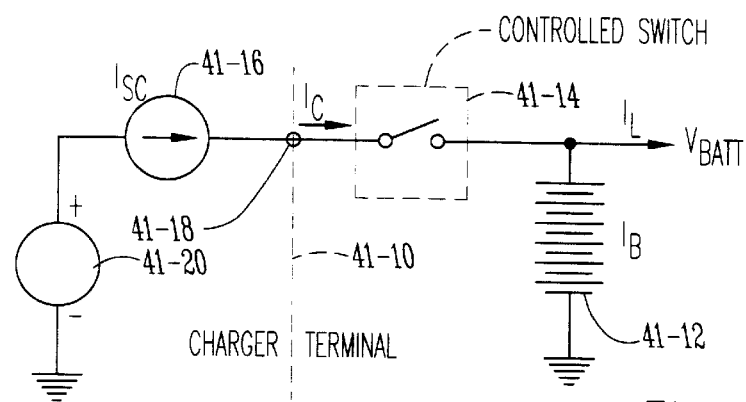
FIG. 41 is an electrical schematic showing a charging current control scheme for efficient battery recharging where the recharging current source is located externally of the housing of the battery and associated device.

FIG. 41 shows a slightly different configuration from FIG. 40. Dashed line 41-10 indicates schematically the wall of an enclosed housing containing the components of a device including battery 41-12. In this configuration, a controlled switch designated by reference number 41-14 pulses the charging current $I_C$ to battery 41-12 (current $I_B$) and to other parts of the circuit (current $I_L$ for current load). The advantages of a pulsed charging current have been previously mentioned.

In FIG. 41 an additional feature is the placement of the source of charging current 41-16 externally of the housing of the device. Charging current source 41-16 would be connectable to the circuitry inside the housing by a plug-in 41-18 or other suitable connection existing on wall 41-10 of the device. FIG. 41 also illustrates an electrical power source 41-20 which sends electrical power to charging current source 41-16. Charging current $I_C$ would basically be a DC value of constant magnitude. Control switch 41-14 would then produce a pulsed output. By placing the source of charging current 41-10 outside of the housing device, any heat dissipated from such a component would be removed from presenting any problems to the circuitry inside the housing. This embodiment therefore provides the advantages of controlling the nature of the form of the charging current to the battery and load, as well as moving a heat dissipating component outside of the housing. This would further allow the current source 41-15 to produce a higher level of charging current $I_C$ then would be possible if source 41-16 were positioned inside the housing. This current could then be controlled by switch 41-14 to provide an adequate net charge to the battery without substantial danger of the varying load affecting sufficient charging current to the battery.

Figure 42:
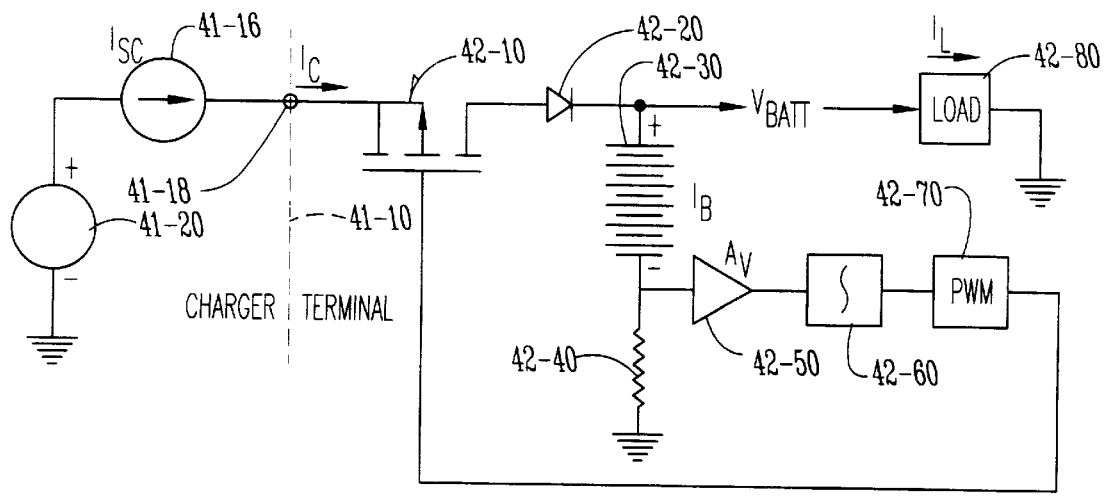
FIG. 42 is an electrical schematic similar to FIG. 41 showing specifically a circuit combination utilizing a closed loop feed back for a controlled transistor switch to control charging current to the battery.

FIG. 42 illustrates the basic configuration of FIG. 41, with a specific feedback circuit and specific controlled switch. In this embodiment, constant current $I_C$ is pulse-width modulated by transistor 42-10. Transistor 42-10 is a low on-resistance, high power field effect transistor providing very low power dissipation. Blocking diode 42-20 prevents current flow from battery 42-30 through transistor 42-10. $I_C$ is divided between battery 42-30 and load 42-80. Sensing register 42-40 is a low resistance device which produces a voltage corresponding to current flow through the battery 42-30. Voltage from sensing resistor 42-40 is conditioned by amplifier 42-50. The output voltage of amplifier 42-50 is presented to the input of integrator 42-60. Integrator 42-60 integrates the voltage input presented to it, thereby integrating the charge which has flowed into the battery 42-30. The output voltage of integrator 42-60, corresponding to the net charge in a given integration time interval delivered to the buttery 42-30, is presented to pulse width modulator 42-70. As the output voltage of integrator 42-60 increases, corresponding to increased net charge delivered to the battery 42-30 per given integration time interval, the width the output pulse of pulse-width modulator narrows. As the duty cycle of pulse width modulator 42-70 decreases, transistor 42-10 reduces the average value of current delivered to battery 42-30 and load 42-80.

Figure 43:
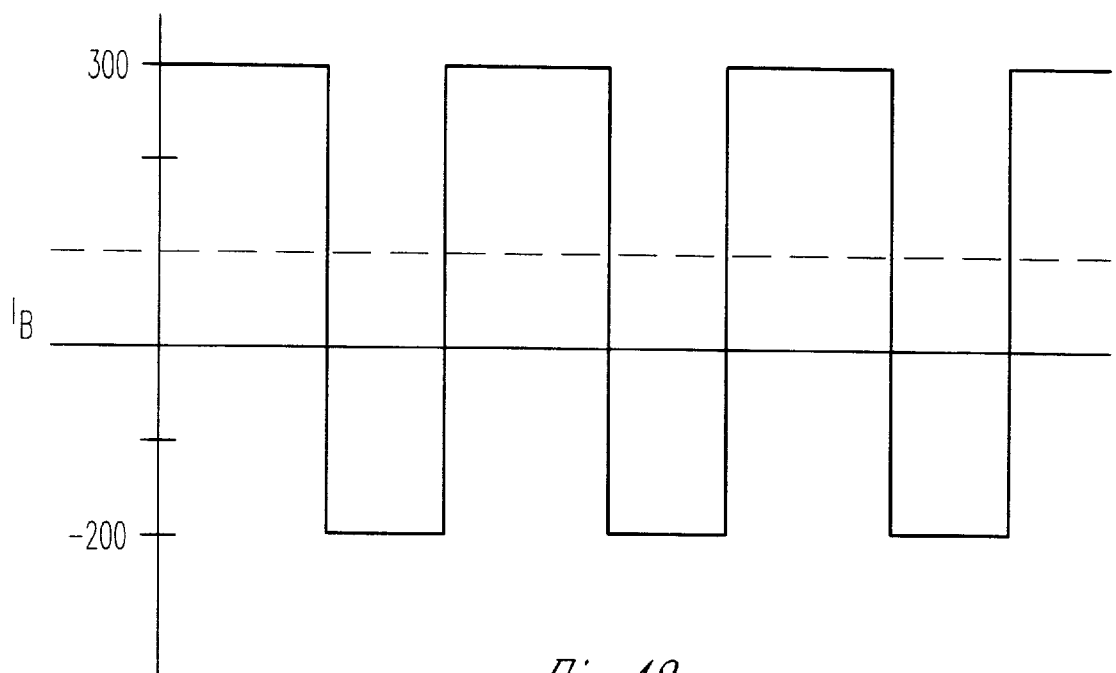
FIG. 43 is a graph of a pulse width modulated signal illustrative of what could be generated by the circuitry of FIG. 42.

FIG. 43 depicts the type of generally square wave, pulse modulated charging current $I_C$ that is possible with circuits such an shown in any of FIGS. 40–42. In particular, the circuit FIG. 42 could produce this sort of signal which would have a maximum magnitude well above that needed to effectively net charge the battery. However, by pulse width modulating $I_C$ the net charge can be dynamically controlled to provide just enough charging current $I_B$ in addition to accommodating a varying load; due to varying conditions throughout the whole circuit. The circuit of FIG. 42 also has the added benefit of taking the current source outside the housing wall to eliminate any heat dissipation problems.

Figure 44:
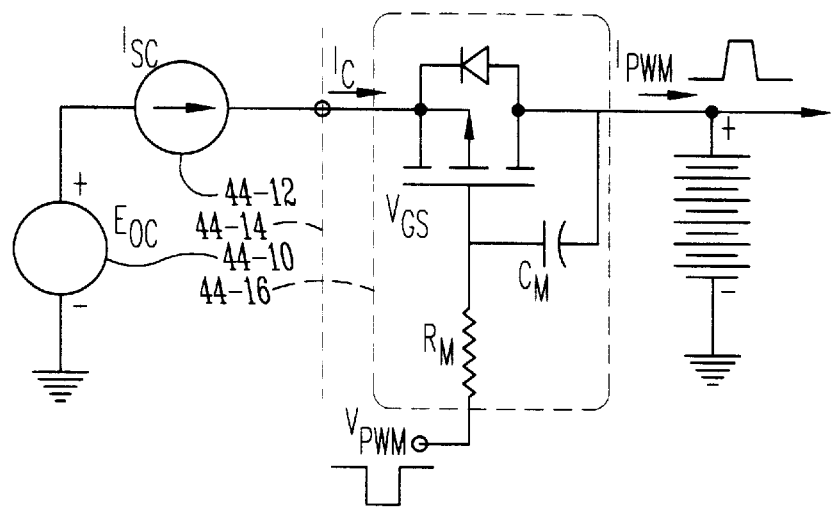
FIG. 44 is an electrical schematic with alternative circuitry to that of FIG. 42 for providing a pulse width modulated recharging current to the battery but where the pulses are modified from a generally square wave to a generally trapezoidal wave.
Figure 45:
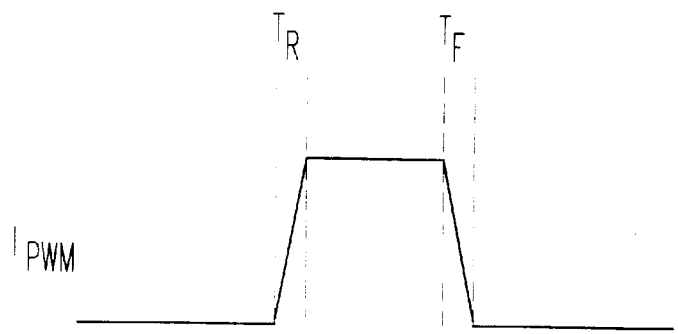
FIG. 45 is a diagram of a trapezoidal-shaped current pulse illustrative of what could be produced by the circuitry of FIG. 44.

FIG. 44 illustrates a still further alternative for the invention. Similar to FIGS. 41 and 42, electrical power source 44-10 and constant current source 44-12 are located outside the housing wall 44-14 for the device. The major difference between the configuration of FIG. 44 and that of FIG. 42 is that it can produce a generally trapezoidal shaped pulse such shown in FIG. 45, instead of generally rectangular or square wave pulse of FIG. 43. The benefit of such a pulse-shape is to reduce both conducted and emitted transients delivered to the load circuits.

Figure 46:
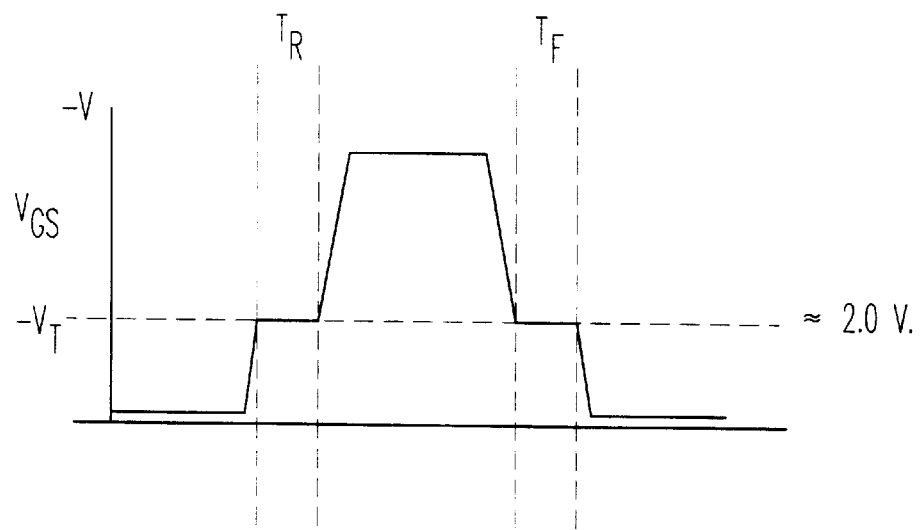
FIG. 46 is a diagram of the voltage pulse generated in conformance with the current pulse of FIG. 45.

FIG. 44 shows the use of a "miller integrator" with a transistor switch (see dashed line 44-16) to produce the trapezoidal shape. In this configuration, the miller integrator receives the signal from the pulse width modulator (see FIG. 42) and produces the trapezoidal shape pulse width modulated current signal illustrated in FIG. 45. FIG. 46 shows the voltage rendition of the pulse width modulated current wave of FIG. 45.

Many further modifications and variations will readily occur to those skilled in the art from a consideration of the teachings and concepts of the present disclosure.

What is claimed is:

1. A battery powered utilization device comprising:
   a device housing;
   a battery pack;
   monitoring circuitry for monitoring operational battery pack characteristics and present battery pack conditions;
   memory located in said battery pack for storing said operational battery pack characteristics as battery pack data; and
   a processor located in the device housing for receiving said present battery pack conditions and said battery pack data, said processor controlling operational discharge of said battery pack by causing circuitry to be powered down when it is not needed.

2. The device of claim 1 wherein the powered down circuitry is located in the device housing.

3. The device of claim 1 wherein the powered down circuitry comprises at least one ROM.

4. The device of claim 1 wherein the powered down circuitry comprises battery charge circuitry.

5. The device of claim 1 wherein the powered down circuitry comprises battery discharge circuitry.

6. A battery powered utilization device comprising:
   a device housing;
   a battery pack;
   monitoring circuitry for monitoring operational battery pack characteristics and present battery pack conditions;
   memory located in said battery pack for storing said operational battery pack characteristics as battery pack data; and
   a processor located in the device housing for receiving said present battery pack conditions and said battery pack data, said processor controlling operational discharge of said battery pack by causing the device to enter a low power mode.

7. The device of claim 6 wherein at least a portion of the device operates using a standby voltage lower than a normal operating voltage.

8. The device of claim 6 wherein run speed is reduced.

9. The device of claim 6 wherein at least one device function is turned off when not needed.

10. The device of claim 9 wherein a clock of the processor is stopped.

11. The device of claim 6 wherein the processor powers down.

12. The device of claim 6 further comprising a screen located in the device housing, and wherein the screen backlight is shut off.

13. The device of claim 6 wherein power is removed from at least one peripheral device.

14. A battery powered utilization device comprising:
a device housing;
a battery pack;
monitoring circuitry for monitoring operational battery pack characteristics and present battery pack conditions;
memory located in said battery pack for storing said operational battery pack characteristics as battery pack data; and
a processor located in the device housing for receiving said present battery pack conditions and said battery pack data, said processor controlling the operational discharge of the battery pack by causing at least one battery of the battery pack to be deselected.

15. A battery powered utilization device comprising:
a device housing;
a battery pack coupled to the device housing;
memory located in the battery pack for storing battery pack data related to battery pack characteristics;
monitoring circuitry for monitoring present battery pack conditions;
a processor located in the device housing for receiving information based on the present battery pack conditions and based on the battery pack data, said processor controlling operational discharge of the battery pack by causing circuitry to be powered down when it is not needed.

16. The device of claim 15 wherein the powered down circuitry is located in the device housing.

17. The device of claim 15 wherein the powered down circuitry comprises at least one ROM.

18. The device of claim 15 wherein the powered down circuitry comprises battery charge circuitry.

19. The device of claim 15 wherein the powered down circuitry comprises discharge circuitry.

20. A battery powered portable utilization device comprising:
a device housing;
a battery pack coupled to the device housing;
memory located in the battery pack for storing battery pack data related to battery pack characteristics;
monitoring circuitry for monitoring present battery pack conditions; and
a processor located in the device housing for receiving information based on the present battery pack conditions and based on the battery pack data, said processor controlling the operation discharge of the battery pack by causing the device to enter a low power mode.

21. The device of claim 20 wherein at least a portion of the device operates using a standby voltage lower than a normal operating voltage.

22. The device of claim 20 wherein run speed is reduced.

23. The device of claim 20 wherein at least one device function is turned off when not needed.

24. The device of claim 23 wherein a clock of the processor is stopped.

25. The device of claim 20 wherein the processor powers down.

26. The device of claim 20 further comprising a screen located in the device housing, and wherein the screen backlight is shut off.

27. The device of claim 20 wherein power is removed from at least one peripheral device.

28. A battery powered portable utilization device comprising:
a device housing;
a battery pack coupled to the device housing;
memory located in the battery pack for storing battery pack data related to battery pack characteristics;
monitoring circuitry for monitoring present battery pack conditions; and
a processor located in the device housing for receiving information based on the present battery pack conditions and based on the battery pack data, said processor controlling the operation discharge of the battery pack by causing at least one battery of the battery pack to be deselected.

29. A battery powered portable utilization device comprising:
a device housing;
a battery pack coupled to the device housing;
memory located in the device housing for storing battery pack data related to battery pack characteristics of the battery pack;
monitoring circuitry for monitoring present battery pack conditions; and
a processor located in the device housing for receiving information based on the present battery pack conditions and based on the battery pack data, said processor controlling operational discharge of the battery pack by powering down circuitry when it is not needed.

30. The device of claim 29 wherein the powered down circuitry is located in the device housing device.

31. The device of claim 29 wherein the powered down circuitry comprises at least one ROM.

32. The device of claim 29 wherein the powered down circuitry comprises battery charge circuitry.

33. The device of claim 29 wherein the powered down circuitry comprises battery discharge circuitry.

34. A battery powered portable utilization device comprising:
a device housing;
a battery pack coupled to the device housing;
memory located in the device housing for storing battery pack data related to battery pack characteristics of the battery pack;
monitoring circuitry for monitoring present battery pack conditions; and
a processor located in the device housing for receiving information based on the present battery pack conditions and based on the battery pack data, said processor controlling operational discharge of the battery pack by causing the device to enter a low power mode.

35. The device of claim 34 wherein at least a portion of the device operates using a standby voltage lower than a normal operating voltage.

36. The device of claim 34 wherein run speed is reduced.

37. The device of claim 34 wherein at least one device function is turned off when not needed.

38. The device of claim 37 wherein a clock of the processor is stopped.

39. The device of claim 34 wherein the processor powers down.

40. The device of claim 34 further comprising a screen located in the device housing, and wherein the screen backlight is shut off.

41. The device of claim 34 wherein power is removed from at least one peripheral device.

42. A battery powered portable utilization device comprising:

a device housing;

a battery pack coupled to the device housing;

memory located in the device housing for storing battery pack data related to battery pack characteristics of the battery pack;

monitoring circuitry for monitoring present battery pack conditions; and a processor located in the device housing for receiving information based on the present battery pack conditions and based on the battery pack data, said processor controlling operational discharge of the battery pack by causing at least one battery of the battery pack to be deselected.

\* \* \* \* \*